(12) United States Patent
Baker et al.

(10) Patent No.: US 11,673,155 B2
(45) Date of Patent: *Jun. 13, 2023

(54) TECHNIQUES FOR ARRAYED PRINTING OF A PERMANENT LAYER WITH IMPROVED SPEED AND ACCURACY

(71) Applicant: Kateeva, Inc., Newark, CA (US)

(72) Inventors: Michael Baker, Santa Cruz, CA (US); Nahid Harjee, Sunnyvale, CA (US); Douglas Bacon, Palo Alto, CA (US)

(73) Assignee: Kateeva, Inc., Newark, CA (US)

( * ) Notice: Subject to any disclaimer, the term of this patent is extended or adjusted under 35 U.S.C. 154(b) by 184 days.

This patent is subject to a terminal disclaimer.

(21) Appl. No.: 17/301,564

(22) Filed: Apr. 7, 2021

(65) Prior Publication Data

US 2021/0220857 A1    Jul. 22, 2021

Related U.S. Application Data

(63) Continuation of application No. 16/356,430, filed on Mar. 18, 2019, now Pat. No. 11,167,303, which is a
(Continued)

(30) Foreign Application Priority Data

Dec. 26, 2013    (TW) .................................. 10248330

(51) Int. Cl.
*B05B 12/12*    (2006.01)
*B41J 2/21*    (2006.01)
(Continued)

(52) U.S. Cl.
CPC ................ *B05B 12/12* (2013.01); *B05B 1/02* (2013.01); *B41J 2/04581* (2013.01);
(Continued)

(58) Field of Classification Search
CPC .............. B41J 2/045081; B41J 2/04586; B41J 2/04588; B41J 2/04593; B41J 11/06;
(Continued)

(56) References Cited

U.S. PATENT DOCUMENTS 4,922,270 A    5/1990    Cobbs et al.
4,963,882 A    10/1990    Hickman
(Continued)

FOREIGN PATENT DOCUMENTS

CN    1258250 A    6/2000
CN    1311100 A    9/2001
(Continued)

OTHER PUBLICATIONS

Provisional Rejection dated Nov. 30, 2018 to KR Patent Application No. 10-2018-7033028.
(Continued)

*Primary Examiner* — Thinh H Nguyen
(74) *Attorney, Agent, or Firm* — Hauptman Ham, LLP

(57) ABSTRACT

A repeatable manufacturing process uses a printer to deposits liquid for each product carried by a substrate to form respective thin films. The liquid is dried, cured or otherwise processed to form from the liquid a permanent layer of each respective product. To perform printing, each newly-introduced substrate is roughly mechanically aligned, with an optical system detecting sub-millimeter misalignment, and with software correcting for misalignment. Rendering of adjusted data is performed such that nozzles are variously assigned dependent on misalignment to deposit droplets in a regulated manner, to ensure precise deposition of liquid for each given area of the substrate. For example, applied to the manufacture of flat panel displays, software ensures that exactly the right amount of liquid is deposited for each
(Continued)

"pixel" of the display, to minimize likelihood of visible discrepancies in the resultant display.

20 Claims, 23 Drawing Sheets

Related U.S. Application Data continuation of application No. 15/607,137, filed on May 26, 2017, now Pat. No. 11,141,752, which is a continuation of application No. 14/788,609, filed on Jun. 30, 2015, now Pat. No. 9,700,908, which is a continuation-in-part of application No. 14/680,960, filed on Apr. 7, 2015, now Pat. No. 9,224,952, and a continuation-in-part of application No. 14/627,186, filed on Feb. 20, 2015, now Pat. No. 9,496,519, which is a continuation of application No. 14/458,005, filed on Aug. 12, 2014, now Pat. No. 8,995,022, which is a continuation-in-part of application No. 14/340,403, filed on Jul. 24, 2014, now Pat. No. 9,352,561, which is a continuation-in-part of application No. PCT/US2014/035193, filed on Apr. 23, 2014, which is a continuation-in-part of application No. 14/162,525, filed on Jan. 23, 2014, now Pat. No. 9,010,899, which is a continuation of application No. 14/162,525, filed on Jan. 23, 2014, now Pat. No. 9,010,899, which is a continuation of application No. PCT/US2013/077720, filed on Dec. 24, 2013.

(60) Provisional application No. 62/059,121, filed on Oct. 2, 2014, provisional application No. 62/021,584, filed on Jul. 7, 2014, provisional application No. 62/019,076, filed on Jun. 30, 2014, provisional application No. 62/005,044, filed on May 30, 2014, provisional application No. 61/977,939, filed on Apr. 10, 2014, provisional application No. 61/950,820, filed on Mar. 10, 2014, provisional application No. 61/920,715, filed on Dec. 24, 2013, provisional application No. 61/915,149, filed on Dec. 12, 2013, provisional application No. 61/898,769, filed on Nov. 1, 2013, provisional application No. 61/866,031, filed on Aug. 14, 2013, provisional application No. 61/857,298, filed on Jul. 23, 2013, provisional application No. 61/842,351, filed on Jul. 2, 2013, provisional application No. 61/822,855, filed on May 13, 2013, provisional application No. 61/816,696, filed on Apr. 26, 2013, provisional application No. 61/746,545, filed on Dec. 27, 2012.

(51) Int. Cl.
*B41J 2/045* (2006.01)
*H01L 51/56* (2006.01)
*B05B 1/02* (2006.01)
*H01L 51/00* (2006.01)

(52) U.S. Cl.
CPC ....... *B41J 2/04588* (2013.01); *B41J 2/04593* (2013.01); *B41J 2/2132* (2013.01); *B41J 2/2135* (2013.01); *H01L 51/56* (2013.01); *H01L 51/0005* (2013.01)

(58) Field of Classification Search
CPC ....... B41J 2/2132; B41J 2/2135; B05B 12/12; B05B 1/02; G06T 2207/30148; G06T 7/001; H01L 51/56; H01L 51/0005; H01L 21/6715; H01L 21/67282; H01L 21/681; H01L 21/76838
See application file for complete search history.

(56) References Cited

U.S. PATENT DOCUMENTS

| | | |
|---|---|---|
| 5,317,169 A | 5/1994 | Nakano et al. |
| 5,345,673 A | 9/1994 | Saitoh |
| 5,434,430 A | 7/1995 | Stewart |
| 5,469,276 A | 11/1995 | Shu |
| 5,555,006 A | 9/1996 | Cleveland et al. |
| 5,561,449 A | 10/1996 | Raskin et al. |
| 5,681,757 A | 10/1997 | Hayes |
| 5,707,684 A | 1/1998 | Hayes et al. |
| 5,711,989 A | 1/1998 | Ciardella et al. |
| 5,779,971 A | 7/1998 | Pan et al. |
| 5,847,720 A | 12/1998 | Dunand |
| 5,895,692 A | 4/1999 | Shirasaki et al. |
| 5,906,682 A | 5/1999 | Bouras et al. |
| 5,932,012 A | 8/1999 | Ishida et al. |
| 6,013,982 A | 1/2000 | Thompson et al. |
| 6,019,454 A | 2/2000 | Serra et al. |
| 6,066,357 A | 5/2000 | Tang et al. |
| 6,149,263 A | 11/2000 | Nakano |
| 6,164,746 A | 12/2000 | Akahira et al. |
| 6,228,228 B1 | 5/2001 | Singh et al. |
| 6,247,787 B1 | 6/2001 | Giere et al. |
| 6,283,572 B1 | 9/2001 | Kumar et al. |
| 6,328,395 B1 | 12/2001 | Kitahara et al. |
| 6,329,108 B1 | 12/2001 | Fujiike et al. |
| 6,347,857 B1 | 2/2002 | Purcell et al. |
| 6,352,331 B1 | 3/2002 | Armijo et al. |
| 6,354,686 B1 | 3/2002 | Tanaka et al. |
| 6,382,850 B1 | 5/2002 | Freund et al. |
| 6,401,001 B1 | 6/2002 | Jang et al. |
| 6,406,114 B1 | 6/2002 | Shioya |
| 6,481,816 B1 | 11/2002 | Oyen |
| 6,495,917 B1 | 12/2002 | Ellis-Monaghan et al. |
| 6,517,176 B1 | 2/2003 | Chaug |
| 6,565,177 B1 | 5/2003 | Corrigan |
| 6,629,741 B1 | 10/2003 | Okuda et al. |
| 6,736,484 B2 | 5/2004 | Nakamura |
| 6,739,686 B2 | 5/2004 | Imai |
| 6,754,551 B1 | 6/2004 | Zohar et al. |
| 6,783,210 B2 | 8/2004 | Takahashi et al. |
| 6,793,324 B2 | 9/2004 | Hosono et al. |
| 6,824,238 B2 | 11/2004 | Chang |
| 6,837,568 B2 | 1/2005 | Nakamura |
| 6,863,961 B2 | 3/2005 | Miyashita et al. |
| 6,910,762 B2 | 6/2005 | Nakamura |
| 6,960,036 B1 | 11/2005 | Fujita et al. |
| 6,972,261 B2 | 12/2005 | Wong et al. |
| 7,072,522 B2 | 7/2006 | Miyake et al. |
| 7,073,727 B2 | 7/2006 | Usuda |
| 7,093,924 B2 | 8/2006 | Nakamura |
| 7,101,013 B2 | 9/2006 | Nakamura |
| 7,111,755 B2 | 9/2006 | Koyama et al. |
| 7,121,642 B2 | 10/2006 | Stoessel et al. |
| 7,138,304 B2 | 11/2006 | Hirai |
| 7,188,919 B2 | 3/2007 | Satomura |
| 7,204,573 B2 | 4/2007 | Koyama |
| 7,207,647 B2 | 4/2007 | Silverbrook |
| 7,216,950 B2 | 5/2007 | Eguchi et al. |
| 7,217,438 B2 | 5/2007 | Newsome et al. |
| 7,223,309 B2 | 5/2007 | Takahashi et al. |
| 7,249,829 B2 | 7/2007 | Hawkins et al. |
| 7,258,408 B2 | 8/2007 | Usuda |
| 7,270,712 B2 | 9/2007 | Edwards et al. |
| 7,278,847 B2 | 10/2007 | Silverbrook |
| 7,281,778 B2 | 10/2007 | Hasenbein et al. |
| 7,381,449 B2 | 6/2008 | Miyasaka |
| 7,449,070 B2 | 11/2008 | Edwards et al. |
| 7,461,912 B2 | 12/2008 | Kamiyama et al. |
| 7,503,637 B2 | 3/2009 | Komatsu et al. |
| 7,513,595 B2 | 4/2009 | Nakamura |
| 7,517,549 B2 | 4/2009 | Hayashi |

(56) References Cited

U.S. PATENT DOCUMENTS

| | | |
|---|---|---|
| 7,554,697 B2 | 6/2009 | Mizutani et al. |
| 7,569,129 B2 | 8/2009 | Pamula et al. |
| 7,600,840 B2 | 10/2009 | Kim et al. |
| 7,611,754 B2 | 11/2009 | Edwards et al. |
| 7,612,917 B2 | 11/2009 | Nagaishi et al. |
| 7,616,340 B2 | 11/2009 | Yamazaki |
| 7,658,465 B2 | 2/2010 | Newsome et al. |
| 7,677,689 B2 | 3/2010 | Kim et al. |
| 7,699,428 B2 | 4/2010 | Kato |
| 7,757,632 B2 | 7/2010 | Edwards et al. |
| 7,775,179 B2 | 8/2010 | Kim et al. |
| 7,815,965 B2 | 10/2010 | Edwards et al. |
| 7,839,080 B2 | 11/2010 | Kim et al. |
| 7,850,267 B2 | 12/2010 | Usuda |
| 7,857,242 B2 | 12/2010 | Huang |
| 7,887,156 B2 | 2/2011 | Middleton et al. |
| 7,891,752 B2 | 2/2011 | Liu et al. |
| 7,901,026 B2 | 3/2011 | Albertalli et al. |
| 7,909,427 B2 | 3/2011 | Kim et al. |
| 7,914,104 B2 | 3/2011 | Silverbrook |
| 7,920,934 B2 | 4/2011 | Aruga |
| 7,972,875 B2 | 7/2011 | Rogers et al. |
| 8,025,353 B2 | 9/2011 | Hasenbein |
| 8,025,917 B2 | 9/2011 | Kinoshita |
| 8,033,634 B2 | 10/2011 | Komatsu et al. |
| 8,066,345 B2 | 11/2011 | Komori et al. |
| 8,119,186 B2 | 2/2012 | Sakai |
| 8,123,324 B2 | 2/2012 | Komori et al. |
| 8,124,190 B2 | 2/2012 | Miyasaka |
| 8,186,791 B2 | 5/2012 | Yamashita |
| 8,235,487 B2 | 8/2012 | Madigan et al. |
| 8,248,656 B2 | 8/2012 | Lin et al. |
| 8,310,721 B2 | 11/2012 | Saita et al. |
| 8,323,724 B2 | 12/2012 | Shinohara |
| 8,342,623 B2 | 1/2013 | Hong et al. |
| 8,342,636 B2 | 1/2013 | Nakano et al. |
| 8,343,869 B2 | 1/2013 | Gothait et al. |
| 8,382,232 B2 | 2/2013 | Silverbrook |
| 8,383,202 B2 | 2/2013 | Somekh et al. |
| 8,413,602 B2 | 4/2013 | Nakamura |
| 8,435,093 B2 | 5/2013 | Takeuchi |
| 8,449,058 B2 | 5/2013 | Hasenbein |
| 8,459,768 B2 | 6/2013 | Hasenbein et al. |
| 8,466,484 B2 | 6/2013 | Slyke et al. |
| 8,579,408 B2 | 11/2013 | Kelly et al. |
| 8,668,307 B2 | 3/2014 | Lewartowski et al. |
| 8,784,938 B2 | 7/2014 | Suzuki et al. |
| 8,995,022 B1 | 3/2015 | Vronsky et al. |
| 9,010,899 B2 | 4/2015 | Harjee et al. |
| 9,139,747 B2 | 9/2015 | Kamada |
| 9,174,433 B2 | 11/2015 | Somekh et al. |
| 9,224,952 B2 | 12/2015 | Harjee et al. |
| 9,352,561 B2 | 5/2016 | Harjee et al. |
| 9,496,519 B2 | 11/2016 | Vronsky et al. |
| 9,527,276 B2 | 12/2016 | Mala et al. |
| 9,537,119 B2 | 1/2017 | Harjee et al. |
| 9,700,908 B2 | 7/2017 | Baker et al. |
| 9,755,186 B2 | 9/2017 | Vronsky et al. |
| 9,802,403 B2 | 10/2017 | Harjee et al. |
| 9,832,428 B2 | 11/2017 | Hauf et al. |
| 9,873,273 B2 | 1/2018 | Mauck et al. |
| 11,167,303 B2 * | 11/2021 | Baker .................... H01L 51/56 |
| 2001/0017703 A1 | 8/2001 | Szumla |
| 2001/0022596 A1 | 9/2001 | Korol |
| 2002/0109862 A1 | 8/2002 | Hayama |
| 2002/0180816 A1 | 12/2002 | Haflinger |
| 2003/0008429 A1 | 1/2003 | Yamazaki et al. |
| 2003/0040061 A1 | 2/2003 | Baker et al. |
| 2003/0087026 A1 | 5/2003 | Dijksman et al. |
| 2003/0101421 A1 | 5/2003 | Satoh |
| 2003/0184613 A1 | 10/2003 | Nakamura et al. |
| 2003/0197747 A1 | 10/2003 | Hattori |
| 2004/0004643 A1 | 1/2004 | Satomura |
| 2004/0009309 A1 | 1/2004 | Raksha et al. |
| 2004/0019143 A1 | 1/2004 | Koloski et al. |
| 2004/0027405 A1 | 2/2004 | Stoessel et al. |
| 2004/0085375 A1 | 5/2004 | Hara |
| 2004/0104951 A1 | 6/2004 | Shibata et al. |
| 2004/0169691 A1 | 9/2004 | Newsome et al. |
| 2004/0170762 A1 | 9/2004 | Newsome et al. |
| 2004/0223014 A1 | 11/2004 | Barr et al. |
| 2005/0009213 A1 | 1/2005 | Wang et al. |
| 2005/0030612 A1 | 2/2005 | Yamazaki et al. |
| 2005/0053719 A1 | 3/2005 | Ishida |
| 2005/0078133 A1 | 4/2005 | Molinet et al. |
| 2005/0140709 A1 | 6/2005 | Sekiya |
| 2005/0156176 A1 | 7/2005 | Gupta et al. |
| 2005/0200684 A1 | 9/2005 | Sakurada et al. |
| 2005/0247340 A1 | 11/2005 | Zeira |
| 2006/0029247 A1 | 2/2006 | Chan |
| 2006/0046347 A1 | 3/2006 | Wood et al. |
| 2006/0093751 A1 | 5/2006 | White et al. |
| 2006/0126121 A1 | 6/2006 | Chung |
| 2006/0132529 A1 | 6/2006 | Verhoest et al. |
| 2006/0144331 A1 | 7/2006 | Hanafusa et al. |
| 2006/0209347 A1 | 9/2006 | Nagaishi et al. |
| 2006/0214976 A1 | 9/2006 | Iwao |
| 2007/0070099 A1 | 3/2007 | Beer et al. |
| 2007/0109342 A1 | 5/2007 | Kato |
| 2007/0109606 A1 | 5/2007 | Nagae |
| 2007/0110893 A1 | 5/2007 | Lennon et al. |
| 2007/0176173 A1 | 8/2007 | Ramakrishnan et al. |
| 2008/0024532 A1 | 1/2008 | Kim |
| 2008/0049231 A1 | 2/2008 | Bachalo et al. |
| 2008/0057260 A1 | 3/2008 | Buchhauser et al. |
| 2008/0117247 A1 | 5/2008 | Miller et al. |
| 2008/0150419 A1 | 6/2008 | Kang |
| 2008/0158278 A1 | 7/2008 | Inoue |
| 2008/0180473 A1 | 7/2008 | Gardner et al. |
| 2008/0227663 A1 | 9/2008 | Tisone et al. |
| 2008/0278534 A1 | 11/2008 | Kim et al. |
| 2008/0308037 A1 | 12/2008 | Bulovic et al. |
| 2008/0309698 A1 | 12/2008 | Nakano et al. |
| 2008/0317941 A1 | 12/2008 | Hanaoka |
| 2009/0096823 A1 | 4/2009 | Watt et al. |
| 2009/0096825 A1 | 4/2009 | Takahashi et al. |
| 2009/0117261 A1 | 5/2009 | Sakai |
| 2009/0184990 A1 | 7/2009 | Shang et al. |
| 2009/0191342 A1 | 7/2009 | Chu et al. |
| 2009/0274833 A1 | 11/2009 | Li et al. |
| 2009/0322828 A1 | 12/2009 | Kim et al. |
| 2010/0020118 A1 | 1/2010 | Xie |
| 2010/0024725 A1 | 2/2010 | Lennon et al. |
| 2010/0066779 A1 | 3/2010 | Gothait et al. |
| 2010/0090582 A1 | 4/2010 | Okishiro et al. |
| 2010/0166950 A1 | 7/2010 | Nieminen |
| 2010/0184244 A1 | 7/2010 | Hunt |
| 2010/0231672 A1 | 9/2010 | Joyce et al. |
| 2010/0311298 A1 | 12/2010 | Suzuki et al. |
| 2011/0032297 A1 | 2/2011 | Mitsuzawa |
| 2011/0084290 A1 | 4/2011 | Nakamura et al. |
| 2011/0087718 A1 | 4/2011 | Srinivasan et al. |
| 2011/0121021 A1 | 5/2011 | Dudenhoefer et al. |
| 2011/0222126 A1 | 9/2011 | Asai et al. |
| 2011/0267390 A1 | 11/2011 | Bulovic et al. |
| 2011/0279544 A1 | 11/2011 | Dovrat et al. |
| 2012/0056923 A1 | 3/2012 | Vronsky et al. |
| 2012/0058251 A1 | 3/2012 | Yamazaki |
| 2012/0069076 A1 | 3/2012 | Higuchi |
| 2012/0139984 A1 | 6/2012 | Lang |
| 2012/0220497 A1 | 8/2012 | Jacobson et al. |
| 2012/0256981 A1 | 10/2012 | Matsuo |
| 2012/0274648 A1 | 11/2012 | Hwang et al. |
| 2012/0306951 A1 | 12/2012 | Somekh et al. |
| 2012/0308252 A1 | 12/2012 | Shimura |
| 2012/0309252 A1 | 12/2012 | Takeuchi |
| 2013/0026533 A1 | 1/2013 | Lee |
| 2013/0040061 A1 | 2/2013 | Lowrance et al. |
| 2013/0057879 A1 | 3/2013 | Takagi et al. |
| 2013/0120485 A1 | 5/2013 | Kodama et al. |
| 2013/0127030 A1 | 5/2013 | Gong et al. |
| 2013/0168664 A1 | 7/2013 | Crankshaw |
| 2013/0206058 A1 | 8/2013 | Mauck et al. |
| 2013/0252533 A1 | 9/2013 | Mauck et al. |

(56) References Cited

U.S. PATENT DOCUMENTS

| | | | |
|---|---|---|---|
| 2013/0286073 A1 | 10/2013 | Blessing et al. |
| 2013/0307898 A1 | 11/2013 | Somekh et al. |
| 2014/0055513 A1 | 2/2014 | Usui |
| 2014/0117316 A1 | 5/2014 | Choi |
| 2014/0165864 A1 | 6/2014 | Oppenheim |
| 2014/0184683 A1 | 7/2014 | Harjee et al. |
| 2014/0210886 A1 | 7/2014 | Driggers et al. |
| 2015/0099059 A1 | 4/2015 | Harjee et al. |
| 2015/0171368 A1 | 6/2015 | Vronsky et al. |
| 2015/0221869 A1 | 8/2015 | Harjee et al. |
| 2015/0273869 A1 | 10/2015 | Ide et al. |
| 2015/0298153 A1 | 10/2015 | Baker et al. |
| 2015/0373305 A1 | 12/2015 | Hauf et al. |
| 2016/0133881 A1 | 5/2016 | Harjee et al. |
| 2016/0311219 A1 | 10/2016 | Harjee et al. |
| 2017/0054078 A1 | 2/2017 | Vronsky et al. |
| 2017/0084882 A1 | 3/2017 | Vronsky et al. |
| 2017/0140999 A1 | 5/2017 | Vronsky et al. |
| 2017/0141353 A1 | 5/2017 | Vronsky et al. |
| 2017/0141357 A1 | 5/2017 | Vronsky et al. |
| 2017/0170435 A1 | 6/2017 | Harjee et al. |
| 2017/0210886 A1 | 7/2017 | Ikeda et al. |
| 2017/0259560 A1 | 9/2017 | Sreenivasan et al. |
| 2018/0008995 A1 | 1/2018 | Baker et al. |
| 2018/0061719 A1 | 3/2018 | Vronsky et al. |
| 2018/0061720 A1 | 3/2018 | Vronsky et al. |
| 2018/0083230 A1 | 3/2018 | Harjee et al. |
| 2018/0146162 A1 | 5/2018 | Hauf et al. |
| 2019/0074484 A1 | 3/2019 | Harjee et al. |

FOREIGN PATENT DOCUMENTS

| | | |
|---|---|---|
| CN | 1366007 A | 8/2002 |
| CN | 1430554 A | 7/2003 |
| CN | 1473707 A | 2/2004 |
| CN | 1476973 A | 2/2004 |
| CN | 1503338 A | 6/2004 |
| CN | 1513214 A | 7/2004 |
| CN | 1572497 A | 2/2005 |
| CN | 1607378 A | 4/2005 |
| CN | 1985366 A | 6/2007 |
| CN | 101020386 A | 8/2007 |
| CN | 101024334 A | 8/2007 |
| CN | 101202328 A | 6/2008 |
| CN | 101222026 A | 7/2008 |
| CN | 101326060 A | 12/2008 |
| CN | 101498856 A | 8/2009 |
| CN | 101533894 A | 9/2009 |
| CN | 101544107 A | 9/2009 |
| CN | 101027186 B | 12/2010 |
| CN | 101950771 A | 1/2011 |
| CN | 101256092 B | 2/2011 |
| CN | 102107555 A | 6/2011 |
| CN | 1753600 B | 8/2011 |
| CN | 102189790 A | 9/2011 |
| CN | 101648458 B | 2/2012 |
| CN | 102343712 A | 2/2012 |
| CN | 101743125 B | 7/2013 |
| CN | 103241025 A | 8/2013 |
| CN | 103026789 A | 1/2016 |
| CN | 102597133 B | 10/2018 |
| EP | 0976567 A2 | 2/2000 |
| EP | 0902315 B1 | 4/2003 |
| EP | 0880303 B1 | 1/2004 |
| EP | 0887199 B1 | 3/2004 |
| EP | 1211916 B1 | 8/2006 |
| EP | 0863478 B1 | 9/2006 |
| EP | 0863004 B2 | 7/2011 |
| EP | 1874551 B1 | 11/2012 |
| EP | 1376716 B1 | 8/2013 |
| JP | H0578655 A | 3/1993 |
| JP | H06308312 A1 | 11/1994 |
| JP | H07169567 A | 7/1995 |
| JP | H07235378 A | 9/1995 |
| JP | H07294916 A | 11/1995 |
| JP | H10138475 A | 5/1998 |
| JP | H10012377 A1 | 6/1998 |
| JP | H10193587 A | 7/1998 |
| JP | H10202851 A | 8/1998 |
| JP | 2991270 B2 | 12/1999 |
| JP | 2000062158 A | 2/2000 |
| JP | 3036436 B2 | 4/2000 |
| JP | 2000207543 A | 7/2000 |
| JP | 2000309123 A | 11/2000 |
| JP | 2001038892 A | 2/2001 |
| JP | 2001071476 A | 3/2001 |
| JP | 2001121722 A1 | 5/2001 |
| JP | 2001138590 A | 5/2001 |
| JP | 2001162840 A1 | 9/2001 |
| JP | 2002205429 A | 7/2002 |
| JP | 2002323615 A1 | 11/2002 |
| JP | 2003014442 A | 1/2003 |
| JP | 2003509256 A | 3/2003 |
| JP | 2003127430 A | 5/2003 |
| JP | 2003161824 A | 6/2003 |
| JP | 2003217840 A | 7/2003 |
| JP | 2003249355 A1 | 9/2003 |
| JP | 2003272847 A | 9/2003 |
| JP | 2003311943 A | 11/2003 |
| JP | 2003338370 A | 11/2003 |
| JP | 2004058627 A | 2/2004 |
| JP | 2004106511 A | 4/2004 |
| JP | 2004148750 A | 5/2004 |
| JP | 2004209412 A | 7/2004 |
| JP | 2004267874 A | 9/2004 |
| JP | 2004295092 A | 10/2004 |
| JP | 2004337709 A | 12/2004 |
| JP | 2005014216 A | 1/2005 |
| JP | 2005502987 A | 1/2005 |
| JP | 2005044613 A | 2/2005 |
| JP | 2005100894 A | 4/2005 |
| JP | 2005131606 A | 5/2005 |
| JP | 2005183184 A | 7/2005 |
| JP | 2005193104 A1 | 7/2005 |
| JP | 3679987 B2 | 8/2005 |
| JP | 2005246248 A | 9/2005 |
| JP | 2005296904 A | 10/2005 |
| JP | 2006021146 A | 1/2006 |
| JP | 2006047803 A | 2/2006 |
| JP | 2006170910 A | 6/2006 |
| JP | 2006212501 A | 8/2006 |
| JP | 2007111914 A | 5/2007 |
| JP | 2007117833 A | 5/2007 |
| JP | 2007207762 A | 8/2007 |
| JP | 2007299725 A | 11/2007 |
| JP | 4027552 B2 | 12/2007 |
| JP | 2003217840 B | 1/2008 |
| JP | 2008004817 A | 1/2008 |
| JP | 2008233833 A | 10/2008 |
| JP | 2008540118 A | 11/2008 |
| JP | 2008296547 A | 12/2008 |
| JP | 2009093189 A | 4/2009 |
| JP | 2009117141 A | 5/2009 |
| JP | 4273819 B2 | 6/2009 |
| JP | 2002225259 A1 | 8/2009 |
| JP | 2009189954 A | 8/2009 |
| JP | 2009291710 A | 12/2009 |
| JP | 2010005593 A | 1/2010 |
| JP | 2010046944 A | 3/2010 |
| JP | 2010115650 A | 5/2010 |
| JP | 2010204189 A | 9/2010 |
| JP | 2010227762 A | 10/2010 |
| JP | 2011005453 A | 1/2011 |
| JP | 2011508062 A | 3/2011 |
| JP | 2011255366 A | 12/2011 |
| JP | 2012025983 A | 2/2012 |
| JP | 2012116188 A | 6/2012 |
| JP | 2012139655 A | 7/2012 |
| JP | 2012160858 A | 8/2012 |
| JP | 2012173504 A | 9/2012 |
| JP | 2012213951 A | 11/2012 |
| JP | 2012218233 A | 11/2012 |
| JP | 2012245671 A | 12/2012 |
| JP | 2013030571 A | 2/2013 |

(56) References Cited

FOREIGN PATENT DOCUMENTS

| | | |
|---|---|---|
| JP | 2013052614 A | 3/2013 |
| JP | 2013225671 A | 10/2013 |
| JP | 2014502931 A | 2/2014 |
| JP | H10138475 A1 | 5/2015 |
| JP | 2016510764 A | 4/2016 |
| JP | 2017511904 A | 4/2017 |
| JP | 2017525600 A | 9/2017 |
| JP | 2018160163 A | 10/2018 |
| JP | 6659532 B2 | 3/2020 |
| KR | 1020040067140 A | 7/2004 |
| KR | 20040072383 A | 8/2004 |
| KR | 1020040072811 A | 8/2004 |
| KR | 1020060038439 A | 5/2006 |
| KR | 20070057808 A | 6/2007 |
| KR | 1020080031666 A | 4/2008 |
| KR | 1020080102829 A | 11/2008 |
| KR | 20110110275 A | 10/2011 |
| KR | 1020120099401 A | 9/2012 |
| KR | 20120132360 A | 12/2012 |
| TW | 200426036 A | 12/2004 |
| TW | 200727994 A | 8/2007 |
| TW | 200950975 A | 12/2009 |
| TW | 201426566 B | 7/2014 |
| TW | I548530 | 9/2016 |
| WO | 1993026116 A2 | 12/1993 |
| WO | 2007138818 A1 | 12/2007 |
| WO | 2008059276 A2 | 5/2008 |
| WO | 2008131383 A1 | 10/2008 |
| WO | 2010011298 A1 | 1/2010 |
| WO | 2010014061 A1 | 2/2010 |
| WO | 2010090080 A1 | 8/2010 |
| WO | 2012093086 A1 | 7/2012 |
| WO | 2012164628 A1 | 12/2012 |
| WO | 2013019466 A1 | 2/2013 |
| WO | 2013088430 A1 | 6/2013 |
| WO | 2013099276 A1 | 7/2013 |

OTHER PUBLICATIONS

Provisional Rejection dated Oct. 26, 2018 to KR Patent Application No. 10-2017-7008701.
Schiaffino, Stefano, "The Fundamentals of Molten Microdrop Deposition and Solidification," Aug. 7, 1996, Massachusetts Institute of Technology, 215 pages.
Second Examination Report dated Feb. 17, 2021 to EP Patent Application No. 18188398.4.
Second Examination Report dated May 4, 2020 to EP Patent Application No. 14787652.8.
Second Examination Report dated Apr. 12, 2018 to TW Patent Application No. 103114950.
Second Office Action dated Aug. 28, 2019 to CN Patent Application No. 201711129386.6.
Second Office Action dated Aug. 30, 2019 to CN Patent Application No. 201711258756.6.
Second Office Action dated Nov. 18, 2019 to CN Patent Application No. 201711258771.0.
Second Office Action dated Nov. 25, 2019 to CN Patent Application No. 201810315491.7.
Second Office Action dated Oct. 9, 2019 to CN Patent Application No. 201711259406.1.
Second Office Action dated Aug. 22, 2019 to CN Patent Application No. 201711129365.4.
Second Office Action dated Aug. 6, 2019 to CN Patent Application No. 201711129373.9.
Second Office Action dated Feb. 2, 2019 to CN Patent Application No. 20150046878.1.
Second Office Action dated Feb. 24, 2017 to CN Patent Application No. 201480023530.6.
Second Office Action dated Jul. 15, 2019 to CN Patent Application No. 201711129387.0.
Second Office Action dated Jul. 17, 2019 for CN Patent Application No. 201711259332.1.
Second Office Action dated Sep. 26, 2016 to CN Patent Application No. 201380073929.0.
Second Office Action dated Sep. 6, 2019 to CN Patent Application No. 201711129340.4.
Seelig, et al., Webpage "Go with the Flow: Paste viscosity can inform why solder performs one way in high-volume production and another under high-mix conditions," 2017.
Third Office Action dated Jan. 16, 2020 to CN Patent Application No. 201711258756.6.
Third Office Action dated Nov. 27, 2019 to CN Patent Application No. 201711129387.0.
Third Office Action issued to CN Patent Application No. 201380073929.0 dated Feb. 13, 2017.
TW Examination Report dated Apr. 13, 2017 for TW Patent Application No. 105115723.
TW Office Action Rejection dated Aug. 3, 2018 for TW Patent Application No. 106140977.
TW Official Letter dated Dec. 9, 2016 for TW Patent Application No. 103141158.
TW Second Official Action dated Aug. 15, 2017 to TW Patent Application No. 103141158.
Ulichney, Robert, "A Review of Halftoning Techniques," 2000, Society of Photographic Instrementation Engineers (SPIE), vol. 3963, pp. 379-391.
Zhou et al., "Three Dimensional Digital Halftoning for Layered Manufacturing Based on Droplets," Transactions of NAMRI/SME, vol. 36, 2009, pp. 175-182.
JP Non-final Office Action dated Feb. 18, 2022 for JP Patent Application No. 2021-006031.
Notice of Reason for Refusal dated Jan. 28, 2022 for JP Patent Application No. 2021-013579.
Notice of Rejection dated Dec. 17, 2021 to JP Patent Application No. 2020-148805.
Final Rejection dated Aug. 5, 2022 for JP Patent Application No. 2021-013579.
Office Action dated Dec. 4, 2017 to JP Patent Application No. 2016-510764.
Office Action dated Apr. 11, 2019 to CN Patent Application No. 201711258771.0.
Office Action dated Apr. 15, 2019 to JP Patent Application No. 2018-107021.
Office Action dated Apr. 2, 2019 to JP Patent Application No. 2017-521030.
Office Action dated Apr. 8, 2019 for CN Patent Application No. 201711129362.0.
Office Action dated Aug. 21, 2017 to CN Patent Application No. 20150046502.0.
Office Action dated Dec. 17, 2015 to Japanese Patent Application No. 2015-550755.
Office Action dated Dec. 17, 2018 to CN Patent Application No. 201711129340.4.
Office Action dated Dec. 17, 2018 to CN Patent Application No. 201711129386.6.
Office Action dated Dec. 18, 2018 to CN Patent Application No. 201711129387.0.
Office Action dated Dec. 27, 2018 to CN Patent Application No. 201711129372.4.
Office Action dated Dec. 3, 2018 to CN Patent Application No. 201711129373.9.
Office Action dated Dec. 3, 2018 to CN Patent Application No. 201711259332.1.
Office Action dated Feb. 2, 2019 to CN Patent Application No. 201711129371.X.
Office Action dated Feb. 27, 2019 to JP Patent Application No. 2018-92037.
Office Action dated Feb. 27, 2019 to JP Patent Application No. 2018-92039.
Office Action dated Jan. 11, 2018 to JP Patent Application No. 2016-526020.
Office Action dated Jan. 16, 2019 to CN Patent Application No. 201711258756.6.

(56) References Cited

OTHER PUBLICATIONS

Office Action dated Jan. 31, 2019 to CN Patent Application No. 201711259406.1.
Office Action dated Jun. 14, 2017 to JP Patent Application No. 2016-526020.
Office Action dated Jun. 2, 2017 to JP Patent Application No. 2016-96406.
Office Action dated Jun. 21, 2018 to CN Patent Application No. 20150046878.1.
Office Action dated Jun. 22, 2016 to CN Patent Application 201480023530.6.
Office Action dated Mar. 26, 2019 to JP Patent Application No. 2018-92038.
Office Action dated Nov. 30, 2018 to CN Patent Application No. 201711129365.4.
Office Action dated Oct. 23, 2015 to TW Patent Application No. 102148330.
Office Action dated Sep. 3, 2018 to JP Patent Application No. 2017-160095.
Office Action dated Sep. 25, 2020 to TW Patent Application No. 109101918.
Office Action dated Apr. 25, 2019 for JP Patent Application No. 2018-089271.
Official Action dated Dec. 3, 2019 to JP Patent Application No. 2017-521030.
Official Action dated Jan. 6, 2020 to JP Patent Application No. 2018-89271.
Official Action dated Nov. 29, 2019 to JP Patent Application No. 2018-92037.
Official Action dated Oct. 30, 2019 to JP Patent Application No. 2018-92039.
Official Action dated Aug. 2, 2019 to JP Patent Application No. 2018-106102.
Official Action dated Aug. 30, 2019 to JP Patent Application No. 2017-511904.
Official Action dated Aug. 5, 2019 for JP Patent Application No. 2018-160163.
Official Letter idated Jul. 8, 2019 to TW Patent Application No. 106140977.
Official Letter dated May 30, 2019 to TW Patent Application No. 107144110.
Penultimate Office Action dated Feb. 4, 2020 to JP Patent Application No. 2018-107021.
Penultimate Office Action dated Oct. 21, 2019 to JP Patent Application No. 2018-107021.
Penultimate Office action dated Nov. 2, 2018 to JP Patent Application No. 2016-510764.
Provisional Rejection dated Jan. 4, 2021 to KR Patent Application No. 10-2019-7036003.
Provisional Rejection dated Mar. 5, 2021 to KR Patent Application No. 10-2021-7005418.
Provisional Rejection dated Oct. 18, 2019 to KR Patent Application No. 10-2019-7024989.
Provisional Rejection dated Oct. 21, 2019 to KR Patent Application No. 10-2019-7029829.
Provisional Rejection dated Feb. 13, 2019 to KR Patent Application No. 10-2017-7011557.
Provisional Rejection dated Feb. 28, 2018 to KR Patent Application No. 10-2016-7018761.
Provisional Rejection dated Jan. 20, 2020 to KR Patent Application No. 10-2019-7031616.
Provisional Rejection dated Mar. 28, 2019 to KR Patent Application No. 10-2018-7034202.
BASF Group, "PEG200DMA Brochure" Sep. 2016.
CN First Office Action dated Oct. 24, 2016 for CN Patent Application No. 201480067970.1.
CN First Office Action with Search Report dated Aug. 1, 2018 for CN Patent Application No. 201710770926.2.
EP Extended Search Report dated Dec. 21, 2018 to EP Patent Application No. EP18188398.4.
EP Extended Search Report dated Mar. 9, 2018 to EP Patent Application No. 15838945.2.
EP Extended Search Report dated May 7, 2018 to EP Patent Application No. 15815375.9.
EP Search Report dated Apr. 3, 2017 to EP Patent Application No. 14787652.8.
Examination Report dated Feb. 10, 2020 to TW Patent Application No. 108109190.
Examination Report dated Oct. 16, 2019 to TW Patent Application No. 108109190.
Examination Report dated Apr. 17, 2017 to TW Patent Application No. 105123219.
Examination Report dated Jan. 11, 2018 to TW Patent Application No. 103114950.
Examination Report dated Jan. 22, 2019 to TW Patent Application No. 107141748.
Examination Report dated Jul. 17, 2019 to EP Patent Application No. 14870074.3.
Examination Report dated Mar. 20, 2018 to TW Patent Application No. 106140977.
Examiner Initiated Interview Summary dated Mar. 22, 2019 to U.S. Appl. No. 15/802,325.
Examiner Interview Summary dated Sep. 27, 2017 to U.S. Appl. No. 15/416,931.
Extended European Search Report dated Jan. 3, 2018 to EP Patent Application No. 14870074.3.
Extended Search Report dated Feb. 29, 2016 to EP Patent Application No. 13866979.1.
Extended Search Report dated Mar. 17, 2017 to EP Patent Application No. 13866979.1.
Final Office Action dated Aug. 28, 2020 to JP Patent Application No. 2018-160163.
Final Office Action dated Feb. 27, 2015 to U.S. Appl. No. 14/340,403.
Final Office Action dated May 18, 2020 to U.S. Appl. No. 15/804,015.
Final Office Action dated Nov. 12, 2020 to U.S. Appl. No. 16/356,430.
Final Office Action dated Nov. 25, 2019 to U.S. Appl. No. 15/607,137.
Final Office Action dated Apr. 11, 2018 to U.S. Appl. No. 15/416,872.
Final Office Action dated Feb. 20, 2015 to U.S. Appl. No. 14/162,525.
Final Office Action dated Jul. 1, 2019 for JP Patent Application No. 2016-510764.
Final Official Action dated Feb. 2, 2018 to JP Patent Application No. 2016-096406.
First Examination Report dated Sep. 20, 2019 to EP Patent Application No. 14787652.8.
First Office Action dated Jul. 2, 2019 for CN Patent Application No. 201810315491.7.
Fourth Office Action dated May 5, 2017 to CN Patent Application No. 201380073929.0.
Gao et al., "The Physics of Digital Microfabrication with Molten Microdrops," 1993, Solid Freeform Fabrication—Conference, 4.sup.th Symposium, Solid freeform fabrication, University of Texas, pp. 237 244.
General Guidelines on Drop Size Measurement Techniques and Terminology (1997).
International Search Report and Written Opinion dated Apr. 30, 2014 for PCT Application No. PCT/US2013/077720.
International Search Report and Written Opinion dated Dec. 11, 2015 for PCT Application No. PCT/US15/47687.
International Search Report and Written Opinion dated Nov. 14, 2014 for PCT Application No. PCT/US2014/050749.
International Search Report and Written Opinion dated Oct. 6, 2015 to PCT Application No. PCT/US15/38693.
Jabbour, Ghassan E., "Printing Techniques in Organic Based Optoelectronics," Semiconductor Device Research Symposium, 2001 International, Dec. 5-7, 2001.
Lee et al., "Fabrication of Organic Light Emitting Display Using Inkjet Printing Technology," Optomechatronic Technologies, 2009. ISOT 2009 International Symposium, Sep. 21-23, 2009, pp. 71-76.
Moon et al., "Fabrication of Functionality Graded Reaction infiltrated SIC-Si Composite by Three-Dimensional Printing (3DTM) Process" Materials Science and Engineering, vol. 298, 2001, p. 110-119.

(56) References Cited

OTHER PUBLICATIONS

Non Final Office Action dated Apr. 3, 2020 to U.S. Appl. No. 15/716,753.
Non Final Office Action dated Feb. 12, 2020 to U.S. Appl. No. 15/804,015.
Non Final Office Action dated Jun. 11, 2020 to U.S. Appl. No. 16/536,654.
Non Final Office Action dated Mar. 27, 2020 to U.S. Appl. No. 15/607,137.
Non Final Office Action dated May 28, 2020 to U.S. Appl. No. 16/356,430.
Non Final Office Action dated Jul. 11, 2019 to U.S. Appl. No. 15/607,137.
Non Final Office Action dated Jul. 23, 2019 for U.S. Appl. No. 15/795,664.
Notification of Reason for Refusal dated Feb. 17, 2022 for KR Patent Application No. 10-2020-7034039.
Notification of Reason for Refusal dated Feb. 22, 2022 for KR Patent Application No. 10-2021-7018547.
Notice of Allowance dated Oct. 13, 2021 for U.S. Appl. No. 16/356,430.
Notice of Allowance dated Sep. 15, 2021 in U.S. Appl. No. 16/947,880.
Notice of Final Rejection dated Jul. 21, 2021 in KR Patent Application No. 10-2019-7036003.
Notice of Final Rejection dated Jul. 29, 2021 in KR Patent Application No. 10-2020-7027595.
Official Letter dated Aug. 25, 2021 to TW Patent Application No. 110106747.
Non-Final Office Action dated Dec. 29, 2017 to U.S. Appl. No. 15/361,845.
Non-Final Office Action dated Nov. 17, 2020 for U.S. Appl. No. 16/546,006.
Non-Final Office Action dated Oct. 18, 2019 to U.S. Appl. No. 16/174,063.
Non-Final Office Action dated Oct. 9, 2015 to U.S. Appl. No. 14/680,960.
Non-Final Office Action dated Apr. 3, 2014 to U.S. Appl. No. 14/162,525.
Non-Final Office Action dated Apr. 4, 2017 to U.S. Appl. No. 14/840,343.
Non-Final Office Action dated Dec. 17, 2014 to U.S. Appl. No. 14/340,403.
Non-Final Office Action dated Mar. 18, 2016 to U.S. Appl. No. 14/937,739.
Non-Final Office Action dated May 12, 2017 to U.S. Appl. No. 15/416,931.
Non-Final office Action dated Nov. 28, 2018 to U.S. Appl. No. 15/607,137.
Non-Final Office action dated Nov. 28, 2018 to U.S. Appl. No. 15/802,325.
Non-Final Office Action dated Nov. 3, 2016 for U.S. Appl. No. 14/788,609.
Non-Final Office Action dated Oct. 27, 2015 to U.S. Appl. No. 14/340,403.
Non-Final Office Action dated Sep. 14, 2017 to U.S. Appl. No. 15/416,872.
Non-Final Office Action dated Sep. 17, 2019 to U.S. Appl. No. 15/804,015.
Non-Final Office action dated Sep. 28, 2018 to U.S. Appl. No. 15/716,753.
Notice for Reason of Refusal dated Dec. 14, 2020 to JP Patent Application 2019-199806.
Notice of Allowance dated Apr. 8, 2021 to U.S. Appl. No. 16/546,006.
Notice of Allowance dated Jun. 17, 2020 to U.S. Appl. No. 15/716,753.
Notice of Allowance dated Mar. 3, 2021 to U.S. Appl. No. 16/356,430.
Notice of Allowance dated Nov. 13, 2020 to U.S. Appl. No. 16/536,654.
Notice of Allowance dated Oct. 4, 2017 to U.S. Appl. No. 14/840,343.
Notice of Allowance dated Apr. 11, 2016 to U.S. Appl. No. 14/340,403.
Notice of Allowance dated Aug. 29, 2017 to U.S. Appl. No. 15/279,261.
Notice of Allowance dated Jan. 16, 2015 to U.S. Appl. No. 14/458,005.
Notice of Allowance dated Jan. 28, 2020 to U.S. Appl. No. 16/174,063.
Notice of Allowance dated Jan. 6, 2020 to U.S. Appl. No. 15/804,015.
Notice of Allowance dated Jan. 8, 2020 to U.S. Appl. No. 15/416,931.
Notice of Allowance dated Jul. 26, 2017 to U.S. Appl. No. 15/417,020.
Notice of Allowance dated Jun. 1, 2020 to U.S. Appl. No. 15/361,845.
Notice of Allowance dated Jun. 9, 2021 for U.S. Appl. No. 15/607,137.
Notice of Allowance dated Mar. 17, 2015 to U.S. Appl. No. 14/162,525.
Notice of Allowance dated Aug. 25, 2020 to U.S. Appl. No. 15/802,325.
Notice of allowance dated May 24, 2017 to U.S. Appl. No. 14/788,609.
Notice of Allowance dated Nov. 6, 2015 to U.S. Appl. No. 14/680,960.
Notice of Allowance dated Oct. 13, 2016 to U.S. Appl. No. 14/627,186.
Notice of Allowance dated Sep. 19, 2019 to U.S. Appl. No. 15/416,872.
Notice of Allowance dated Sep. 21, 2017 to U.S. Appl. No. 15/135,380.
Notice of Allowance dated Sep. 5, 2017 to U.S. Appl. No. 15/367,064.
Notice of Final Refusal dated Nov. 12, 2019 to KR Patent Application No. 10-2018-7034202.
Notice of Final Refusal dated Oct. 18, 2018, to KR Patent Application No. 10-2016-7018761.
Notice of First Refusal dated Apr. 21, 2020 to KR Patent Application No. 10-2019-7024989.
Notice of First Refusal dated May 26, 2020 to KR Patent Application No. 10-2019-7031616.
Notice of First Refusal dated Apr. 24, 2019 to KR Patent Application No. 10-2017-7008701.
Notice of Reason for Refusal dated Jun. 4, 2021 in JP Patent Application No. 2020148805.
Notice of Reasons for Refusal dated Jul. 31, 2019 in JP Patent Application No. 2018-160163.
Notification of a Second Provisional Rejection to KR Patent Application 10-2015-7020356 dated May 31, 2016.
Notification of First Refusal dated Jun. 22, 2018, to KR Patent Application No. 10-2016-7018761.
Notification of Provisional Rejection to KR Patent Application 10-2015-7020356 dated Dec. 14, 2015.
KR Office Action dated Mar. 30, 2022 for KR Patent Application No. 10-2021-7040761.
KR Office Action dated Mar. 31, 2022 for KR Patent Application No. 10-2021-7042624.
JP Non-final Office Action dated Jul. 1, 2022 for JP Patent Application No. 2021-109778.
Notice of Allowance dated May 20, 2022 for U.S. Appl. No. 15/804,015.
TW Office Action dated May 6, 2022 for TW Patent Application No. 110106747.

* cited by examiner

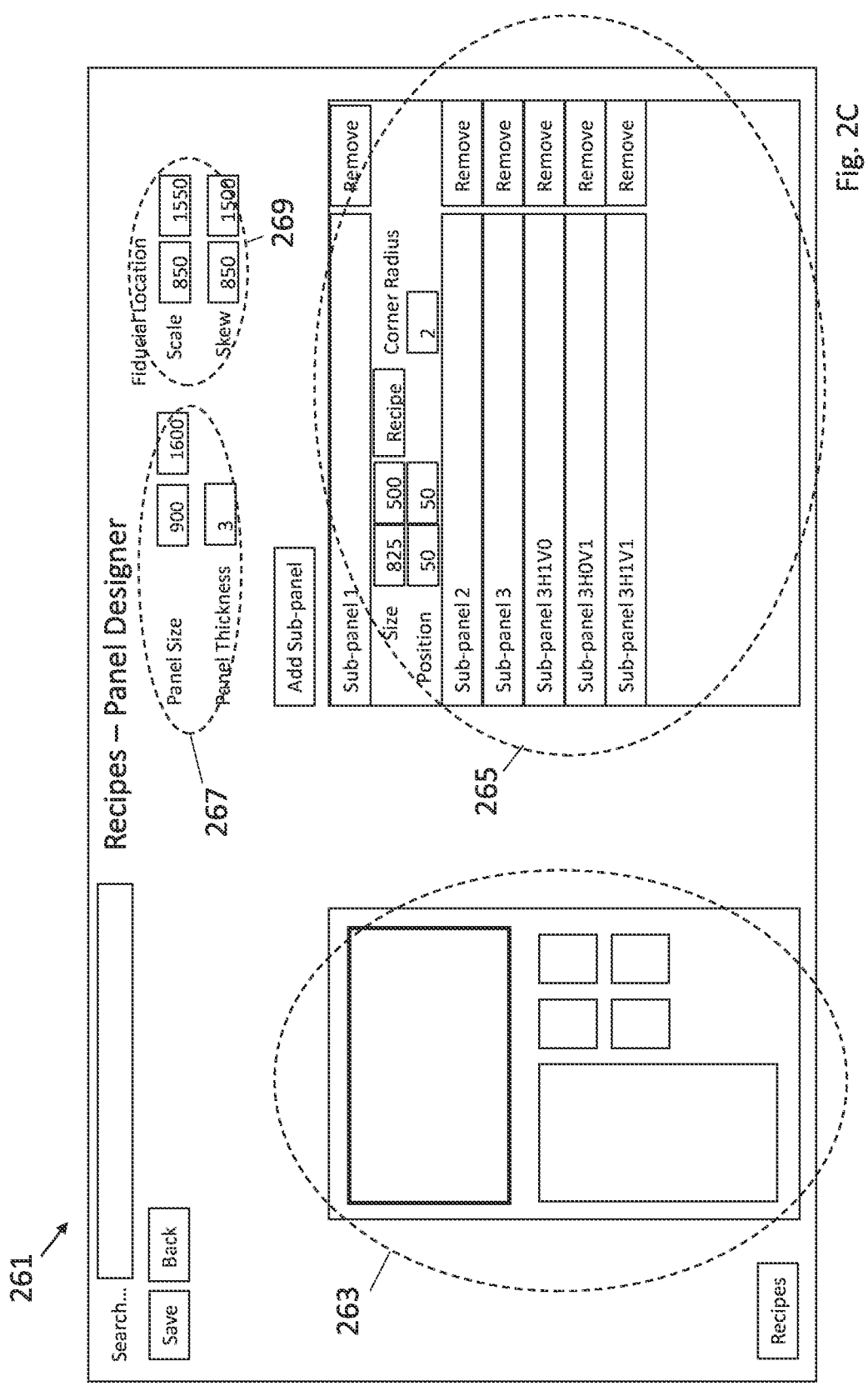

TECHNIQUES FOR ARRAYED PRINTING OF A PERMANENT LAYER WITH IMPROVED SPEED AND ACCURACY

CROSS-REFERENCE TO RELATED APPLICATIONS

This application is a continuation of U.S. patent application Ser. No. 16/356,430, filed on Mar. 18, 2019, which is a continuation of U.S. patent application Ser. No. 15/607,137, filed on May 26, 2017, which is a continuation of U.S. patent application Ser. No. 14/788,609, filed on Jun. 30, 2015, now U.S. Pat. No. 9,700,908, issued on Jul. 11, 2017, which claims priority from U.S. Provisional Application No. 62/059,121, filed on Oct. 2, 2014; 62/021,584, filed on Jul. 7, 2014; and is a continuation-in-part of U.S. patent application Ser. No. 14/680,960, filed on Apr. 7, 2015, now U.S. Pat. No. 9,224,952, issued on Dec. 29, 2015, which is a continuation of U.S. patent application Ser. No. 14/162,525, filed on Jan. 23, 2014, now U.S. Pat. No. 9,010,899, issued on Apr. 21, 2015, which is a continuation of International patent Application No. PCT/US13/77720, filed on Dec. 24, 2013, which claims priority from U.S. Provisional Application No. 61/746,545, filed on Dec. 27, 2012; 61/822,855, filed on May 13, 2013; 61/842,351, filed on Jul. 2, 2013; 61/857,298, filed on Jul. 23, 2013; 61/898,769, filed on Nov. 1, 2013; and 61/920,715, filed on Dec. 24, 2013. U.S. patent application Ser. No. 14/788,609, filed on Jun. 30, 2015 is a continuation-in-part of Ser. No. 14/340,403, filed on Jul. 24, 2014, now U.S. Pat. No. 9,352,561, issued on May 31, 2016, which claims priority from U.S. Provisional Application No. 61/950,820, filed on Mar. 10, 2014. U.S. patent application Ser. No. 14/340,403 is a continuation-in-part of International Patent Application No. PCT/US14/35193, filed on Apr. 23, 2014, which claims priority from U.S. Provisional Application No. 61/816,696, filed on Apr. 26, 2013; and 61/866,031, filed on Aug. 14, 2013 and claims priority from Taiwan Patent Application No. 10248330, filed on Dec. 26, 2013. U.S. patent application Ser. No. 14/340,403 is also a continuation-in-part of Ser. No. 14/162,525, filed on Jan. 23, 2014, now U.S. Pat. No. 9,010,899, issued on Apr. 21, 2015. U.S. patent application Ser. No. 14/788,609, filed on Jun. 30, 2015, is a continuation-in-part U.S. patent application Ser. No. 14/627,186, filed on Feb. 20, 2015, now U.S. Pat. No. 9,496,519, issued on Nov. 15, 2016, which is a continuation of U.S. patent application Ser. No. 14/458,005, filed on Aug. 12, 2014, now U.S. Pat. No. 8,995,022, issued on Mar. 31, 2015, which claims priority from U.S. Provisional Application No. 61/915,149, filed on Dec. 12, 2013; 61/977,939, filed on Apr. 10, 2014; 62/005,044, filed on May 30, 2014; and 62/019,076, filed on Jun. 30, 2014, each of which is incorporated by reference herein in their entirety.

BACKGROUND

Some manufacturing technologies use a printing process to deposit a layer of material on a substrate as part of an assembly process. For example, multiple solar panels or organic light emitting diode (OLED) displays can be manufactured together on a common glass or other substrate, with multiple panels eventually being cut from the common substrate to create respective devices. The printing process deposits liquid (e.g., similar to an "ink") having a solvent that suspends or carries a material from which a respective permanent layer is formed, e.g., by curing, drying or otherwise "processing" the liquid to a permanent form. The liquid is deposited for each product in a manner that is carefully controlled, so that each deposited layer aligns closely in position with underlying layers and desired product position on the substrate. Such alignment is particularly important where a high degree manufacturing precision is required, as for example, where the process is used to fabricate a dense pattern of microelectronic structures or optical structures, with each layer of each structure having carefully-controlled dimensions (including thickness).

Returning to the OLED display example for purposes of illustration, each flat panel device being manufactured in parallel on a common substrate features individual pixel color components which are typically fabricated in fluidic wells that hold light generating elements and electrodes. Each deposited layer helps determine proper operation of the individual pixels; the more accurate (and the better aligned and controlled) each deposition process, the smaller the pixels can be made and the more reliable the operation of finished optical or electrical structure at its particular size dimensions. Variations for a given panel (including thickness variations) from pixel-to-pixel are undesired, as these can produce visible defects in the finished product; for example, a typical OLED display (for example, used as an HDTV screen) can involve many millions of pixels in a compact space, and if pixels have even slight variations in liquid deposited via the printing process, this can potentially be seen as a brightness or color difference by the human eye. For such manufacturing applications, precise printer control is therefore required, for example, at micron or finer resolution, and with a maximum variation in aggregate per-area fluid deposition volume of less than one-half-percent.

In addition, to produce products at an acceptable consumer price point, it is desired to maximize manufacturing throughput. If a given manufacturing device (e.g., including an industrial printer) takes substantial time for each layer, this translates to slower manufacture, and to an increased consumer price point; such increased price point threatens viability of the manufacturing process.

BRIEF DESCRIPTION OF THE FIGURES

FIG. 2C is a screen shot from a recipe editor and panel definition software, used to define layer geometries for each product design in an array (i.e., the array is to be fabricated using a common substrate, and layer deposition is to be repeated for a series of substrates).

FIG. 4A shows a layout of a printhead 407 relative to a region 403, where the presence or absence of "Xs" at locations in a "print grid" respectively denote that a droplet will be fired by the printhead in a specific area (e.g., from nozzle 410 at position 404) or withheld at a specific area (e.g., from nozzle 410 as it traverses position 405). For example, FIG. 4A could be a section of a "bitmap" (i.e., representing intended nozzle firing decisions over a part of a substrate, as the printhead and the substrate moved relative to each other in a scanning motion). Note that as used herein, the term "bitmap" refers to per-nozzle data irrespective of whether the data for each nozzle consists of a single bit or multiple bits; for example, in one embodiment, 4 bits of data can be used (i.e., representing sixteen possible values, one of which represents a decision to not fire the nozzle, and others of which represent different preprogrammed nozzle drive waveforms that can be 'sent' to the nozzle. Clearly, many alternatives are possible.

FIG. 4B shows a layout of the original print grid 403 from FIG. 4A, but where the substrate is misaligned relative to the intended print area and where different nozzles can be used to compensate for this alignment error without adjusting scan path(s); note that in the depicted example, the misalignment may not "cleanly" align with nozzle spacing or "pitch," e.g., a greater or fewer number of nozzles, and a different set of nozzles of the printhead might now overlap desired print region 412 as the printhead and substrate are moved relative to each other.

FIG. 4C shows a layout 421 where a print grid is seen to be overlaid onto a desired print region 412 from FIG. 4B.

FIG. 4D shows a relative layout 431 of the region 403 from FIG. 4A, but where the intended print area or product geometry 433 is seen rotated relative to that region, due to substrate error or other misalignment.

FIG. 4E shows a layout 441 where a print grid is seen to be overlaid onto a desired print region 433.

FIG. 4F shows a layout of the original printer grid 403, but where, relative to the specific substrate, there is a detected scaling error, as reflected by desired print region 455.

FIG. 4G shows a layout 461 where a print grid is seen to be overlaid onto the desired print region 455 from FIG. 4F.

FIG. 4H shows a layout of the original print grid from FIG. 4A but where there is detected skew error 475, e.g., due to some type of distortion or linear advancement error affecting the substrate, it is actually desired to print along the contours of a parallelogram (represented by shape 475).

FIG. 4I shows a layout 481 where the print grid is seen overlaid one to a desired print region 475; with printing corrected using the print grid of FIG. 4I, and using the techniques presented herein, printing can be precisely aligned (i.e., represented by the shape 475).

Figure 1A:
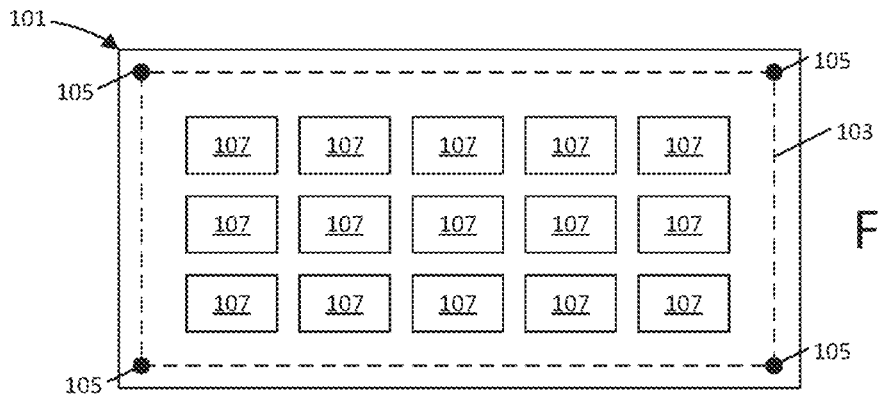
FIG. 1A shows layout of a substrate that is to receive printing of a liquid that will form permanent layers of respective products, at locations 107; an overall print area intended for access by nozzles of a printhead is represented by dashed line box 103.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques used to fabricate a thin film for each of multiple products of a substrate (or other array of products) as part of an integral, repeatable print process. The various techniques can be embodied as software for performing these techniques, in the form of a computer, printer or other device running such software, in the form of control data (e.g., a print image) for forming such a film layer, as a deposition mechanism, or in the form of an electronic or other device fabricated as a result of these techniques (e.g., having one or more layers produced according to the described techniques). While specific examples are presented, the principles described herein may also be applied to other methods, devices and systems as well.

DETAILED DESCRIPTION

This disclosure provides techniques, processes, apparatuses, devices and systems that can be used to more quickly and more reliably fabricate products via a printing process, and products made according to such a process.

An assembly line process uses a printer to print (i.e., deposit) droplets of liquid onto each substrate in a series of substrates. The liquid is then cured, dried, or otherwise processed to form a permanent layer of material (i.e., a permanent thin film). Each substrate is used to fabricate one or more products, and the layer will typically be formed for each product carried by the substrate. Once printing is completed, the substrate is advanced and a new substrate is loaded, and the process is repeated. Processing, e.g., to cure the liquid, in some embodiments can happen in situ or in another position in the assembly line, and typically the printing and processing is performed within a controlled atmosphere to minimize particulate, oxygen or moisture contamination. In specifically contemplated applications, the printer is used to deposit a single layer of an organic light emitting diode ("OLED") display panel or a solar panel. For example, in the fabrication of a high-definition OLED television screen, such a process can be used to deposit one or more light generating layers for each pixel of a display (i.e., each discrete light generating element). Although the described techniques can be applied to many types of materials, and to many types of products other than flat panel displays, the use of a printer and associated processing has been found especially useful to deposit layers of organic materials that cannot easily be deposited using other processes, and many examples presented herein will therefore focus on these materials. As with other types of products and manufacturing processes, alignment in printing and layer thickness much be achieved with a high degree of accuracy to facilitate small, reliable electronic components (e.g., micron scale), with low variation and high manufacturing throughput.

Because of various process corners associated with different substrates, the assembly line equipment, human handling and a myriad of other factors, each substrate may vary slightly in position, rotation, scale, skew or other dimensions as the substrate is moved into and through the printer. Some forms of error might be unique to the substrate (e.g., warping of a substrate or edge nonlinearity), while other forms of error might represent repeating system errors (e.g., a substrate is incorrectly edge-guided through the printer with repeatable motion error caused by the system itself). Whatever the source, as the printing process is intended to print identical products on each substrate in the series, it is generally desired to detect and mitigate positional error.

Thus, in one embodiment, a detection mechanism is used to detect fiducials on each substrate when in proximity to the printer. The fiducials are used to identify product position notwithstanding substrate-to-substrate error or other deviation from expected product position, orientation and/or dimensions. The detected product position is compared to expected position and used to identify that error, so as to (in-software) transform or adjust printer control data (i.e., to modify either that data or how it is rendered to perform printing), to precisely register the to-be-printed-layer with any underlying product dimensions. As used herein, "position" or "product position" should generally be understood to include any of skew, scale, orientation, etc., even though these things are not individually listed beyond mention of "position."

Note that in a conventional printing process, an assemblage comprising one or more printheads, each with nozzles, is transported relative to the substrate being printed upon, in one or more raster sweeps. Each sweep defines an "in-scan" dimension of the substrate and, after each sweep, the printhead and/or the substrate are repositioned in a "cross-scan" dimension of the substrate, in preparation for an ensuing sweep. Each printhead can have hundreds to thousands of nozzles, each of which is to jet a droplet of liquid, where the liquid is analogous to an ink and includes a material that will be cured or otherwise processed to form the desired permanent layer. For example, with one known technology, the liquid is a monomer or polymer, and an ultraviolet cure process is used following printing to process the deposited liquid to form a permanent layer.

In more detailed variations of this first embodiment, a number of mechanisms can be used to reconcile goals of fast printing, accurate printing and precise layer thickness and registration.

In a first implementation, with error identified (e.g., a linear or nonlinear shift in position, rotational, skew or scaling), new nozzle firing decisions can be generated in a manner dependent on detected deviation from ideal position and in a manner that does not require shift or alteration in preplanned raster sweeps between the printhead assembly and the substrate. That is, since printing time (and thus manufacturing throughput) is directly related to the number of raster sweeps required to cover all regions of the substrate that are to receive liquid, this number of raster sweeps and their respective positions in one embodiment are not changed, but rather, potentially new nozzles and/or drive parameters are individually assigned in a manner that permits printing to occur to deposit the intended density and pattern of droplets from the printhead assembly, but in a manner where nozzle assignments and/or drive parameters (e.g., drive waveforms) are transformed or rendered relative to the original printer control data so as to exactly register with any underlying product layers or otherwise align exactly with intended product geometry. Note that this manner of processing is optional, i.e., in another contemplated embodiment, raster sweeps are reassessed to potentially employ different offsets of the printhead assembly relative to the substrate (e.g., different advancement patterns in the cross-scan direction and/or different number of scans or sweeps).

Depending on environment, simply "shifting" nozzle firing decisions might not always produce the desired deposition parameters. For example, in one contemplated environment in which printing is used to deposit light generating elements in fluidic "wells" that contain deposited liquid until that liquid is cured, error might not cleanly align with nozzle spacing or nozzle firing timing, such that a linear shift in nozzle firing assignments might position too great or too few a number of deposited droplets in a pixel well. To address this, in one embodiment, an "antialiasing" process is used, pursuant to which one or more processors acting under the control of instructional logic test expected position of each pixel well (given detected error) against expected liquid volume and, should expected aggregate volume stray by more than a threshold amount from an ideal value or range of acceptability, selectively revisit "shifted" nozzle assignments and adjusts one or more of number of nozzles that will fire droplets into the pixel well. This then helps ensure that precisely the intended amount of liquid is deposited in intended locations.

In another embodiment, droplets produced by each nozzle are empirically measured in situ, and measured droplet characteristics that vary from nozzle-to-nozzle, or that depend on drive parameters used to eject droplets from a nozzle, are stored and factored into nozzle assignment. For example, in a first variation, individual nozzles can be qualified/disqualified dependent on whether associated empirically-measured droplet parameters for the nozzle (and for applied drive parameters) meet criteria for acceptable droplet production. Thus, if positional error and associated registration imply an un-validated nozzle should not be used for deposition, instructional logic can use validation data to assign nozzles so as to instead use other nozzles or different droplet ejection parameters (e.g., a different drive waveform to control a selected nozzle). In a second variation, each given nozzle (and each one of plural, alternative drive waveforms that can be used to drive the given nozzle) is measured as to expected droplet volume, trajectory and/or droplet landing position, and this data is then factored into error processing or initial nozzle assignment. To cite a simple example, if two adjacent nozzles are to be relied on to respectively deposit 9.97 and 10.03 picoliter (pL) droplets into a fluidic well for a total volume of 20.00 pL of liquid, and substrate error implies that two other nozzles will be used to perform the deposition, (a) non-adjacent nozzles expected to produce 9.90 and 10.10 pL droplets can be assigned to perform the deposition (preserving the expectation of 20.00 pL aggregate volume), and/or (b) nozzle drive particulars (e.g., drive waveform) for one or more nozzles can be adjusted to produce droplets having adjusted volume or trajectory characteristics from pre-selected nozzles, so as to maintain expected aggregate volume in the fluidic well notwithstanding detected error. These types of processing also are optional and are not required for all embodiments.

Note that the printer control data can take many forms depending on embodiment. In one implementation, "recipe" information describing desired dimensions (e.g., including thickness) for the desired layer for each product can be stored as a cached template and then rendered in an adjustable manner that accommodates run-time error. In a second implementation, this recipe information can be partially pre-processed and stored in an object (vector) or other representation in advance, also as a cached template for use in processing each substrate; as positional or alignment error is detected for each new substrate, the template is retrieved and modified as appropriate in rendering the final printer control data (that is, the nozzle firing decisions, raster sweeps, and related timing, as appropriate). To cite another example, in another implementation, recipe data is received for a product (and/or array) and is rendered into a bitmap representing printing decisions; the bitmap is essentially an array of nozzle firing decisions or equivalent data at each node of a print grid that represent triggers that will cause the nozzle to fire or not fire a droplet at a discrete position on the substrate during a scanning motion of the printhead relative to the substrate. This information can also include variable per-nozzle drive waveform definition or selection. The bitmap is cached as a template and, at run time, is retrieved, modified to distort printing to match error via direct processing on the bitmap, and is then used to control printing. Naturally, other examples exist, i.e., with each variation, detected error is factored in some manner into the rendering process so as to customize printing in view of the detected error, so as to achieved registration of layers.

With each embodiment, to facilitate highly accurate printing without increasing printing time, detected misalignment of the substrate (or any individual product represented thereon) in any given manufacturing iteration can be corrected at least partially in software, in real time. This correction then reduces the need for time-consuming very high precision mechanical alignment or repositioning, as well as the need for a very high precision alignment mechanism. This lowers cost and increases manufacturing throughput without sacrificing accuracy and reliability. In one specifically contemplated application related to arrayed printing of multiple large-scale OLED TV screens, a single large substrate might include 6-8 HDTV screens (e.g., panels or subpanels, which will be used interchangeably); it is presently contemplated for a successful manufacturing process that a layer to be printed on the substrate should take no more than 90 seconds per substrate. In some embodiments, this maximum printing time is expected to be 45 seconds or less. As each screen or panel involves millions of pixels, alignment should be precise for the manufacture of high quality displays; it is therefore desired to print liquid onto the substrate using a process that takes less than a few seconds (e.g., 2 seconds) to detect and correct substrate and/or product misalignment or other errors. The disclosed embodiments facilitate this speed in manufacturing (and manufacturing throughput) and help produce smaller, precision registration products.

Many manufacturing applications are relatively robust to rough mechanical alignment of products in-assembly. For the disclosed embodiments, the fine-precision alignment performed by one or more processors (i.e., machines) acting under the control of software (instructions or instructional logic stored on non-transitory machine-readable media) typically adjusts for millimeter to sub-millimeter error (e.g., from nanoscale to hundreds of microns, or less) in positional offset, rotational offset, skew, scaling error, or for other distortions. Note that for some applications which feature very dense precision structures (e.g., HDTV applications having millions of pixels), and/or where thousands or printhead nozzles are involved, error processing can require substantial computing resources. As noted above, in one embodiment, it is desired to perform error compensation using hardware logic and/or software logic in seconds, e.g., 2 seconds or less. To facilitate this end, certain embodiments below present hardware designs that rely on parallel processing (e.g., multiple processors or a multicore processing) and techniques for process thread assignment that permit this computation to occur quickly. For example, to foreshadow an embodiment that will be further discussed below, a supervisory processor or group of processors can detect error and determine a formulation for rendering or transforming original recipe information (or other cached, template data). The formulation can be linear over the substrate, or can vary locally (e.g., be non-linear or discontinuous). The supervisory processor then assigns geographical segments and an associated affine transform to each core of a multicore processor for processing. In one design, each core has its own dedicated memory for data processing and manipulation; the supervisory processor identifies the geographic segment to be modified by each core and the associated modification algorithm (e.g., affine transform), and provides this information to the respective cores, and multiple cores then each perform their allocated tasks to contribute to finishing a transformed output that represents adjusted printer control data for the substrate as a whole; this transformed output is suitable for use in immediate printing. If desired, the memory used for manipulation can also be designed to provide direct memory access (DMA) to speed manipulation of cached template data and its adaptation to and use in printing. For embodiments which use dozens to hundreds of cores, or more, this substantially reduces processing time needed to re-render the desired print job. Other designs are also possible; for example, instead of assigning different geographies to each core, different mathematical operations (or different, sequential processes) can be assigned to each core. As this example should make clear, nearly any partition of functions or processing can be provided for to maximize efficiency or otherwise reduce processing time. A parallel processing environment such as just discussed should also be viewed as optional relative to other techniques described herein.

The present disclosure provides a number of hardware (i.e., circuit or circuitry) implementations that facilitate highly accurate printing in an assembly line-style process, and software techniques that can be used in lieu of or in addition to such hardware. Generally speaking, features discussed below can be mixed and matched (or are otherwise optional) and can vary according to implementation. For example, one embodiment discussed below provides hardware that can be used to pre-store a number (e.g., 16) of customizable nozzle drive waveforms for each of many nozzles (e.g., hundreds to tens of thousands of nozzles) used by a printer. Each waveform is selected in advance to produce a slightly different expected droplet parameter (e.g., volume, trajectory, and so forth), providing a range of possible droplets producible from that nozzle; the system selects these waveforms in advance so as to provide a range of choices, and programs the various waveform choices in advance to drive circuitry for each nozzle. Then, at run time, the system simply selects one of the waveforms. In one embodiment, there are sixteen such selections (e.g., one "zero" waveform, representing a non-firing decision, and fifteen variable drive waveforms). In another embodiment, a default waveform can be programmed asynchronously (i.e., in advance), and a binary "trigger" then applied to "launch" whichever waveform has most recently been programmed as a default. Once again, these various features are optional and are not required for all embodiments, and various disclosed features may be used in any desired combination or permutation as suited to the implementation. All such combinations and permutations and any such combinations and permutations are contemplated by the teachings of this disclosure.

Specifically contemplated implementations can include an apparatus comprising instructions stored on non-transitory machine-readable media. Such instructional logic can be written or designed in a manner that has certain structure (architectural features) such that, when the instructions are ultimately executed, they cause the one or more general purpose machines (e.g., a processor, computer or other machine) to behave as a special purpose machine, having structure that necessarily performs described tasks on input operands in dependence on the instructions to take specific actions or otherwise produce specific outputs. "Non-transitory machine-readable media" as used herein means any tangible (i.e., physical) storage medium, irrespective of how data on that medium is stored, including without limitation, random access memory, hard disk memory, optical memory, a floppy disk or CD, server storage, volatile memory and other tangible mechanisms where instructions may subsequently be retrieved by a machine. The machine-readable media can be in standalone form (e.g., a program disk or solid state device) or embodied as part of a larger mechanism, for example, a laptop computer, portable device, server, network, printer, or other set of one or more devices. The instructions can be implemented in different formats, for example, as metadata that when called is effective to invoke a certain action, as Java code or scripting, as code written in a specific programming language (e.g., as C++ code), as a processor-specific instruction set, or in some other form; the instructions can also be executed by the same processor or different processors or processor cores, depending on embodiment. Throughout this disclosure, various processes will be described, any of which can generally be implemented as instructions stored on non-transitory machine-readable media, and any of which can be used to fabricate products using for example a microelectronics, micro-optics, "3D printing" or other printing process. Depending on product design, such products can be fabricated to be in saleable form, or as a preparatory step for other printing, curing, manufacturing or other processing steps, that will ultimately create finished products for sale, distribution, exportation or importation. Also depending on implementation, the instructions can be executed by a single computer and, in other cases, can be stored and/or executed on a distributed basis, e.g., using one or more servers, web clients, or application-specific devices. Each function mentioned in reference to the various FIGS. herein can be implemented as part of a combined program or as a standalone module, either stored together on a single media expression (e.g., single floppy disk) or on multiple, separate storage devices. The same is also true for the print image or printer control data generated according to the processes described herein, i.e., recipe information, a template or the result of processing such recipe information or template can be stored on non-transitory machine-readable media for temporary or permanent use, either on the same machine or for use on one or more other machines; for example, printer control data can be generated using a first machine, and then stored for transfer to a printer or manufacturing device, e.g., for download via the internet (or another network) or for manual transport (e.g., via a transport media such as a DVD) for use on another machine.

Also, reference has been made above to a detection mechanism and to fiducials that are recognized on each substrate. In many embodiments, the detection mechanism is an optical detection mechanism that uses a sensor array (e.g., a camera) to detect recognizable shapes or patterns on a substrate. Other embodiments are not predicated on an array, for example, a line sensor can be used to sense fiducials as a substrate is loaded into or advanced within the printer. Note that some embodiments rely on dedicated patterns (e.g., special alignment marks) while others rely on recognizable substrate features (including geometry of any previously deposited layers), each of these being a "fiducial." In addition to using visible light, other embodiments can rely on ultraviolet or other nonvisible light, magnetic, radio frequency or other forms of detection of substrate particulars relative to expected printing position.

Having thus introduced some basic embodiments, this disclosure will now proceed to discuss more detailed implementations. FIGS. 1A-1F are used to illustrate various principles associated with printer control data adjustment in a repeatable manufacturing process.

FIG. 1A illustrates layout of a hypothetical substrate 101. More specifically, the substrate includes a number of alignment marks 105, a print area 103 defined relative to the alignment marks, and areas 107 corresponding to a number of products that are to be formed or that already have base layers deposited as part of the process of product formation. For purposes of illustration, it may be assumed the substrate 101 will be used to form many products 107, and each "panel" that will be cut from the substrate to form an independent solar panel or display device, but the invention is not so limited. In one embodiment, each panel 107 will be an independent OLED panel, and the substrate 101 is a large sheet of glass.

It is desired to employ a printer to jet liquid onto the array or substrate 101 in an integral printing process, notwithstanding the presence of multiple products; the liquid carries a material such that, following deposition of the liquid and its cure or other processing, the material and/or liquid will become a permanent part of each resultant product, and such that the layer will have a specifically planned thickness. In an optional embodiment, layer thickness is imparted using controlled droplet deposition where the volume or density of deposited liquid per unit area is used to build layer thickness. That is, the liquid has limited spreading that produces blanket liquid coverage without undesired holes or gaps, or the liquid is otherwise deposited or hardened in a manner that will be geometrically confined, all in a manner that will otherwise result in the specifically planned thickness; this process is generally referred to herein as "halftoning," even though deposited fluid is typically colorless and is not being used to create any type of tone (i.e., "half," "blended" or otherwise). Note that in a typical implementation, the printer prints the entire substrate (i.e., a layer of each product in the array), and the substrate is then transported from the printer to a separate cure chamber where the liquid will be cured or otherwise hardened, all in the presence of a controlled atmosphere (e.g., a nitrogen or other non-ambient-air atmosphere, which prevents the liquid from being exposed to moisture, oxygen or other forms of unwanted particulate). It will be assumed for this example that recipe data is produced in advance which calls upon the printer to deposit the desired material at discrete locations within the confines of the overall print area 103. Simply stated, the recipe data for each product describes layer thickness and dimensions for that product, and any desired particulars such as corner rounding or edge buildup profiles, and the recipe data for the array describes where each product's layer (i.e., the product recipe data) is to be positioned relative to the substrate. The recipe data, as processed or rendered, will instruct an ink jet printer to deposit liquid into each individual product area 107 on a reproducible basis that will be repeated for many ensuing, similar substrates. The recipe data (or any processed version thereof) is stored or "cached" in memory for use as a template that will be used to cause the printer to deposit the liquid on each substrate in the series of substrates. FIG. 1A shows a single one of these substrates (with many products or "panels" thereon), representing an idealized deposition relative to the substrate.

As noted earlier, unfortunately, in practice each array or substrate can have non-uniformities either in its structure or its position, rotation, scale, skew, or other alignment issues which affect registration of the deposited layer for one or more of the products; for many manufacturing processes, such distortion can be tolerable, but for applications such as microelectronics, or where very precise alignment is otherwise necessary, such alignment issues can limit feature size, create product defects, or otherwise increase time and/or cost of manufacture. It is desired to avoid and/or compensate for these issues and to provide for printing that is automatic and is as fast as possible while maintaining accuracy.

To this effect, in one embodiment, hardware logic and/or instructional logic adjusts nozzle firing data in view of detected error, in a manner that ideally does not require adjusting planned scan paths of the printer (e.g., only the nozzle data is adjusted); this is not required for all embodiments. The fiducials (e.g., alignment marks or optically-recognized features of the substrate) are optically-detected as each new substrate is loaded, advanced or positioned in the printer. Associated, imaged data is then used by a processor to compare actual position of the substrate (and its panels) to expected position; dependent on deviation, the print image is adjusted so that printing registers with panel-layout information (and any previously-deposited layers). The alignment correction performed using these techniques is typically micron scale or finer (e.g., correcting for positional errors that are sub-millimeter and, in some embodiments, for positional errors of 100 microns or even substantially less).

Figure 1B:
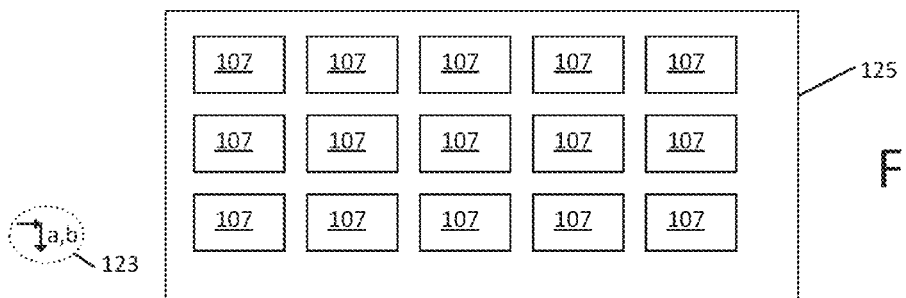
FIG. 1B shows a print area 125 similar to dashed line box 103 from FIG. 1A, but where the substrate is unintentionally offset in position, such that without correction, printing would occur in the wrong location, and would result in misregistration.
Figure 1C:
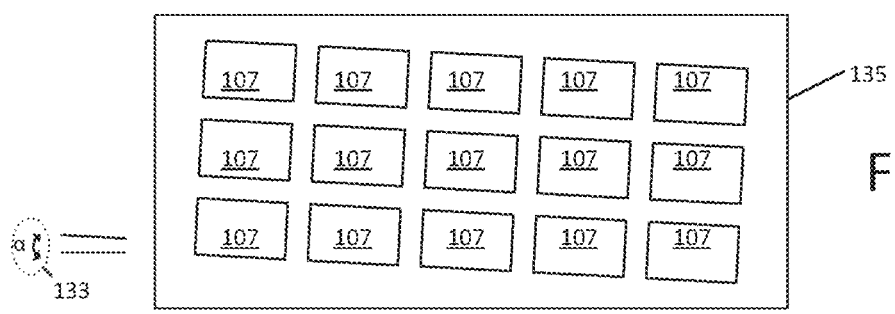
FIG. 1C shows a print area 135 similar to dashed line box 103 from FIG. 1A, but where there is substrate rotational error.

FIG. 1B shows a situation where a substrate is indeed misaligned relative to the ink jet printer; in this case, whether due to edge error, mechanical positioning error, substrate process corners or other issues, this misalignment creates the potential for alignment errors between layers of each product being fabricated. Note that the depicted error is exaggerated in scale for ease of illustration. More specifically, an xy Cartesian error (represented by numeral 123) if left uncorrected, would result in individual product layers (107) being offset relative to the ideal print area 125 on the substrate; this offset could cause issues relative to any underlying (or subsequently-deposited or fabricated) product layers. The techniques disclosed herein are used to adjust printer control data so that the ink deposition is shifted in a manner conforming to the registration error, e.g., the print process is offset (or otherwise transformed) in a manner matching error in substrate and/or panel position. This detected error is corrected by generating or adjusting printer nozzle control data in a manner matching such error. As noted earlier, if recipe data is preprocessed, optional techniques can be used to reassign any prior nozzle firing patterns in a manner dependent on the error. Note that in one embodiment, this reassignment typically involves more than simply shifting all nozzle firing decisions by a vector amount, i.e., to preserve precise liquid fills for the desired area, nozzle firing decisions can be reassessed in view of nozzle-to-nozzle variations and positional mismatch with the deposition area of interest (e.g., a pixel well) and the print grid, and to adjust for other factors (e.g., antialiasing, as further discussed below). In one embodiment, this reassignment is performed by a process that operates at the bitmap or vector representation level, effectively transforming individual nozzle firing decisions dependent on print grid points associated with any previously processed or rendered data (e.g., dependent on a template bitmap), and/or nozzle drive parameters. The use of other adjustment techniques such as scan path variation (e.g., adjusting printhead offsets and rasterization changes) is also possible.

FIG. 10 represents a situation where a substrate bears another form of error, represented by rotational angle α (numeral 133). If left uncorrected, this error would result in individual product layers (107) being potentially misaligned with other product layers (e.g., relative to a desired print area 135 of the substrate). Using techniques discussed herein, this error can be corrected by detecting the misalignment and factoring in rotational adjustment in the rendering of printer data, e.g., in hardware, software, or a combination thereof. Once again, if a template print image such as a bitmap has already been generated, this correction can optionally be performed directly on a copy of that image, by computing new nozzle firing assignments and/or drive parameters directly from the preprocessed bitmap (e.g., without having to generate a print image anew from recipe data). As with the previous example, adjustment results in a per-substrate print process where the deposited layer exactly aligns with intended product geometry notwithstanding error; the printing can be performed almost immediately.

Note that whether error is factored into preprocessed data (such as a template or bitmap) or applied directly to originally render printer data from recipe information is an implementation decision. For an OLED device having millions of pixels (and many millions of potential droplet deposition points per substrate), per-substrate adaptation of a previously rendered bitmap can be computationally-prohibitive, depending on supporting hardware capabilities; in some embodiments, it might be faster to directly render printer data from recipe data in a manner that factors detected registration error, and in other embodiments, use of a bitmap (or other preprocessing) might be more efficient. For embodiments which further use the parallel processing features provided below, a greater number of processing options are available.

Figure 1D:
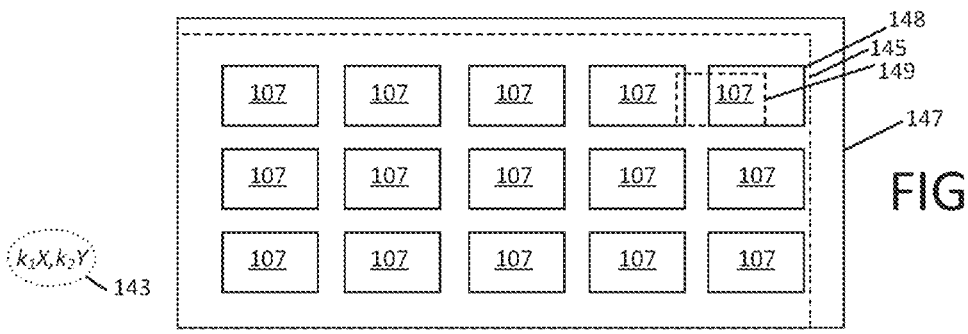
FIG. 1D shows a print area 147 similar to dashed line box 103 from FIG. 1A, but where substrate misalignment represents a scaling error, e.g., where individual, arrayed products can each have dimensional error (as well as positional error).

FIG. 1D represents yet another type of error that is depicted to be linear across for the entire substrate or product array, in this case, representing a scaling issue. It should be assumed for purposes of this example that a substrate is slightly larger or smaller than intended; for example, it could be that due to temperature changes, the substrate has contracted or expanded slightly, in a manner such that error is at least locally uniform or linear. Thus, to provide a simplified example, it is assumed for this hypothetical that all dimensions and positions of the template image should be adjusted by $k_1 X$, $k_2 Y$, where $k_1$ and $k_2$ are scalars, and where X and Y represent Cartesian coordinates on the substrate. Note that a situation where scaling error is in one dimension only (e.g., the X dimension) presents a simplified case where $k_2 = 1$). If left uncorrected, scaling error would result in offset error as well as individual product layers (107) being slightly smaller (149) than the desired footprint (148) for each panel; similarly, the overall print area is seen to be slightly smaller (145) than the desired print area (147) for the substrate. To correct for this error, scaling is corrected according to $k_1$ and $k_2$. Once again, in one embodiment, this can be implemented by factoring in variables $k_1$ and $k_2$ to generate transformed printer control data (e.g., with potentially different nozzle firing decisions and mappings, either directly from recipe data or from preprocessed template data). Antialiasing (as will be discussed below) and/or nozzle droplet particulars can also optionally be applied/factored as part of this transformation to ensure local density of deposited liquid in a given location or unit area (i.e., which will govern thickness) corresponds to the intended layer dimensions. As with the previous examples, adjustment results in a per-substrate print process where the deposited layer exactly aligns with intended product geometries notwithstanding substrate positional error and where desired deposition fills, densities and volumes are correct; note that the particular adjustment relative to FIG. 1D may result in substantial changes to per-printhead-scan nozzle assignments and, depending on embodiment, can potentially affect the number of scans (depending on embodiment and the nature of the error). That is, in one embodiment as referenced earlier, nozzle firing decisions are reassigned in dependent on techniques disclosed herein (e.g., without changing position or number of scans); in another embodiment, scan paths can be re-optimized given per nozzle-droplet data and error, and different scan paths and a greater or fewer number of scans can be used. Irrespective of embodiment, printing can be performed almost immediately as planned, with the substrate error being corrected in software, hardware or both by dynamic adjustments which independently account for positional error for each substrate (or a portion of a given substrate on a localized basis).

Note once again that all errors depicted in these FIGS. are visually exaggerated for purposes of illustration, i.e., if it is assumed that an arrayed area (e.g., glass substrate) is of a scale that is meters wide by meters long, rough mechanical alignment is typically precise to millimeter scale or better. Thus, in many embodiments, the disclosed techniques are used to correct for relatively small misalignments (e.g., tens-to-hundreds of microns or even less).

Figure 1E:
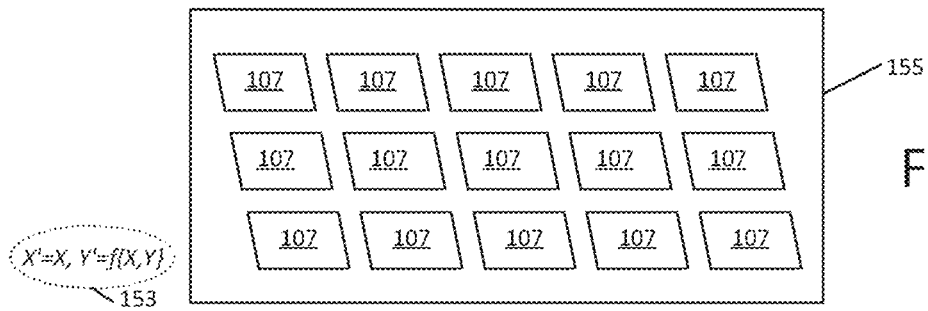
FIG. 1E shows a print area 155 similar to dashed line box 103 from FIG. 1A, but where substrate misalignment (e.g., edge distortion in an edge guided alignment process) results in distortion in two independent dimensions.

FIG. 1E represents yet another type of error, e.g., where the individual product areas or the substrate as a whole experience skew. Here, the error is seen to result in Y position error (horizontal direction relative to the drawing page) that varies depending on X position on the substrate (vertical direction relative to the drawing page); as an example, this type of error might be caused by a substrate edge error or by a transport error that uniquely affects the specific printer or manufacturing device. In the FIG., all dimensions and positions are seen to be skewed by $X' = X$, $Y' = fn\{X\}$, where X' and Y' are adjusted coordinates, as represented by graphic 153. Once again, note that a skew situation would in practice also result in positional offset errors for each panel 107 which are in addition to panel skew errors (this is seen in the FIG. as a horizontal offset in panels in one row relative to the next row). If left uncorrected, skew error would result in individual product layers (107) being malformed relative to the desired footprint. To correct for this error, the print image is once again adjusted/transformed in software, to advance-skew panel printing so as to match the underlying error. As with the previous examples, the performed transformation can include more than simply shifting nozzle firing decisions and, for example, can feature additional processes to ensure deposition of the proper volume of ink in the proper target regions; this can optionally result in substantial changes to per-printhead-scan nozzle assignments, and potentially affect the number of scans, as previously discussed. The printing is once again performed almost immediately, with the substrate error being corrected in software by real time adjustment to the template print image or in the rendering of recipe information for the specific substrate.

Figure 1F:
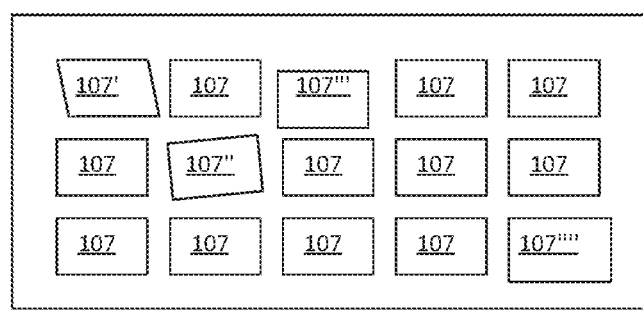
FIG. 1F shows a print area 163 similar to dashed line box 103 from FIG. 1A, but where different types of errors are represented, each affecting different parts of the substrate.

FIG. 1F represents a hypothetical case where the mentioned errors can affect each panel independently from one another, and where such error can be in addition to, or in lieu of, errors in substrate position. For example, FIG. 1F depicts a case where, relative to desired printing area 163, a first panel 107' is seen to be askew, whereas second, third and fourth panels (107", 107''' and 107'''') are seen to each respectively have rotational, offset, and scaling errors relative to other panels 107; note that because scaling error for panel 107'''' affects only this panel, positional offset is diagrammatically depicted as small-to-nonexistent. Applying teachings introduced herein, errors for each panel are separately corrected for by adjusting the rendering that will be used to print the given array or substrate. In this regard, error for any given panel or portion thereof can be complex, with correction modeled as a superposition or combination of transformation techniques for one or more of positional offset, rotation, skew and scaling error; this can be done on an independent basis for a group of panels, a single panel, a space spanning parts of multiple panels or a part of any given panel. For embodiments that cache a previously-rendered template print image, for each new substrate (e.g., every 45 seconds), a copy of that cached image can be manipulated to reduce alignment, orientation or other errors, reassigning nozzle firing decisions as necessary, without having to mechanically reposition the specific substrate; for each ensuing substrate, e.g., every 45 seconds, an instance of cached template printer control data can be once again loaded and used to correct for error in positioning or alignment specific to the new substrate, producing rendered data that can be immediately applied to printing.

There are a number of techniques for fine-alignment of printer control data to match substrate or panel deviation from expected positions. First, one contemplated embodiment overlays a print grid onto the actual (i.e., detected) substrate and/or panel position; as previously noted, the print grid can feature "horizontally-separated" nodes representing nozzle pitch on the printhead and "vertically-separated" nodes representing digital timing at which nozzles can be fired, e.g., "every micron" of distance as the printhead and substrate are "scanned" relative to one another. For each node in this overlaid space, the system (i.e., instructional logic running on one or more processors) determines whether a respective nozzle ought to be fired at that point to deposit a droplet of liquid. For the overlaid space, the firing decision at each node is a function of original "recipe" data for an ideal substrate as well as deviation in position of that node from an equivalent point in a perfectly aligned substrate. In one implementation where printer control data is "pre-rendered" to form a bitmap (i.e., with nozzle firing decisions already assigned in a manner assuming uniform alignment), each firing decision of a print grid overlaid with the deviated substrate or panel position can be mapped, via a transformation, to an equivalent point in the original bitmap. To provide an example, if a given substrate was offset by 31.0 microns "to the right" of where it should be, firing decisions for each node in the print grid could be calculated by first identifying the same node position in the original bitmap, then identifying a point 31.0 microns "to the left" of that position and, finally, identifying the firing particulars associated with the node nearest to that shifted point. As will be further discussed below, in such an embodiment, particularly where liquid is to be printed in pixel wells, such a process might result in too many or two few droplets of the liquid being deposited within well confines, and adjustment processes such as antialiasing (discussed below) can be employed to mitigate this possibility. In a second implementation, each firing decision in the overlaid grid can be a weighted function of firing decisions from a pre-rendered template (e.g., a weighted average of the firing decisions for the four closest print nodes to a point 31.0 offset microns "to the left" in the original bitmap. Naturally, many variations and possible adjustment mechanisms will occur to those having ordinary skill in the art. Other embodiments can employ imported alignment data or in situ measurement of nozzle parameters, which are then factored into the rendering of printer control data for the given substrate, antialiasing, droplet density (halftone pattern) adjustment and other processes, as appropriate; each of these helps produce a more reliable deposition by using an additional process or processes to ensure that the proper amount and/or density of liquid is printed in discrete regions of the substrate. In some embodiments, the number of scan paths or printhead cross-scan offsets can be revisited, to optimize printing time. The various combinations of disclosed techniques and their relative benefits will be apparent to those skilled in the art in view of the discussion below.

Figure 2A:
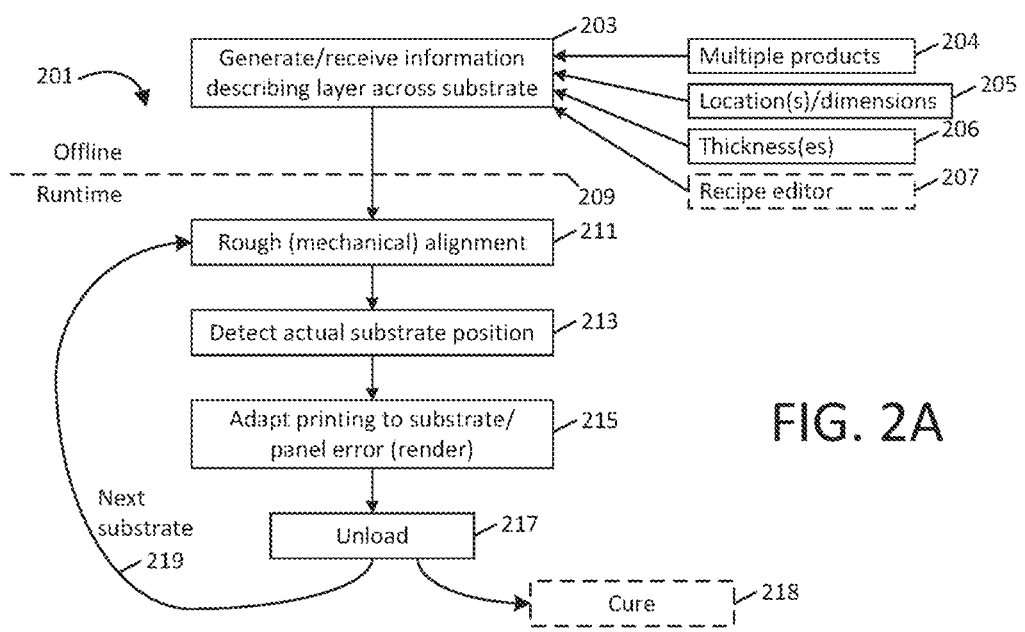
FIG. 2A provides a flow chart 201 relating to alignment of one or more print deposition areas relative to substrate position.

FIG. 2A is used to introduce some exemplary processing tasks. More specifically, FIG. 2A shows a flow chart 201 with certain functions delineated as performed as part of an offline process (i.e., above dashed line 209) or as performed during runtime (i.e., online as part of the manufacturing process, below dashed line 209). A computer (e.g., stand-alone or part of a manufacturing device such as an industrial or manufacturing printer) first receives information describing desired deposition of a layer across the substrate, per numeral 203. As noted at the right side of FIG. 2A, a number of variations are contemplated. For example, one embodiment (204) contemplates manufacturing of many products at once, as part of an arrayed deposition. Returning briefly to FIG. 1A, it could be for a particular manufacturing process that layers respective to each of the illustrated 15 panels are to be exactly the same as one another in width, length and thickness; for example, a single recipe (representing one of these panels) could be electronically loaded and arrayed by hardware logic or instructional logic, or both, to generate an aggregate print image with aggregate print data for the expected printing locations for 15 individual products. This need not be the case for all embodiments. For example, TV screens of a first size could be presented by the first horizontal row of panels, and TV screens of a second size could be presented by a second row of panels, both together on the same substrate; each panel would have different manufacturing particulars in this example. Whether or not multiple products are represented by each substrate, the method can include receiving information such as desired position of each layer (e.g., "top-left" corner position and length and width dimensions, per numeral 205, and desired layer thickness(es), per numeral 206). In one example, "recipe editor" software can be used to define layer parameters for a substrate carrying one or more products, (e.g., see the discussion of FIG. 2C, below). The computer then stores information representing the desired layer for use as a template in processing many substrates, i.e., each in a sequence run as part of an assembly line process. The stored information is optionally pre-rendered as a bitmap or other form to represent printing of an "idealized" substrate (i.e., one that is positioned perfectly, with all products thereon positioned perfectly), or is somehow otherwise associated with a default substrate/product position.

During runtime, as each new substrate is loaded into the printer or otherwise received, the substrate is roughly positioned using mechanical means; for example, this step can be performed via a mechanical handler or via an edge guide that "roughly" positions the substrate to a desired printing position, per numeral 211. The printer then detects actual substrate position using a precision detection system, per numeral 213; in one embodiment, this is performed using a high-precision camera that images a region of a fiducial (known pattern in or on the substrate), with the camera being precisely positioned relative to the print system, and with position detection software used to perform image processing so as to identify exact position of the fiducial, e.g., to the nearest micron. Advantageously, the fiducial can be a two-dimensional pattern or set of patterns, enabling a determination of rotational orientation of the substrate, and/or scale and/or skew; the more complex the fiducial (or the greater the number of independent features recognizable), the greater the accuracy and/or number and/or complexity of alignment or position issues that can be corrected. To provide an example of this, one embodiment (see FIG. 9A, also discussed below) contemplates that every panel on a substrate will have at least two dedicated alignment marks, enabling per-panel error detection or error mitigation on a panel basis; this is not required for all embodiments. Whichever the detection mechanism, the computer (and/or one of its processors) then derives deviation between (1) detected panel position, dimension and orientation, and (2) expected panel position, dimension and orientation, and it adapts the print job as necessary to register printing with any underlying layers and/or product geometry (215). Per numeral 217, the panel is then unloaded from the printer and is optionally cured per numeral 218. As indicated by reference numeral 219, a new substrate can then be loaded for a new print job.

As an example representing a hypothetical print process for OLED or solar panel manufacturing, a typical layer thickness for a panel might be on the order of sub-micron to hundreds of microns, depending on the particular layer that is to be "printed" (and then cured or otherwise processed); array definition information might be received and used to determine printing location for each panel according to a recipe for the specific panel linked to that location. In configuration with 15 panels per substrate, for example, array definition information might be received to indicate that a first panel "recipe" was to be reproduced five times in each of the first two rows of panels on the substrate (i.e., each at precise locations) and that a second unique panel recipe was to be reproduced five times in a third row of panels (i.e., at precise locations, assuming a second recipe different from the first recipe). The array definition in this example would identify each panel location and the specific recipe to be used for that location. Note that the example of a homogeneous, continuous layer for any given product is illustrative only; in some embodiments, layers may be patterned within each product (as opposed to being a homogenous coating, such as a thin film encapsulation for a particular product or panel), or thickness can be varied within a layer as defined by the particular panel recipe. Continuing with a fifteen panel, three-row example, the third row of products could potentially feature a different layer thickness, with denser halftoning used to "build" a thickness greater than created for the first two rows of panels.

Figure 2B:
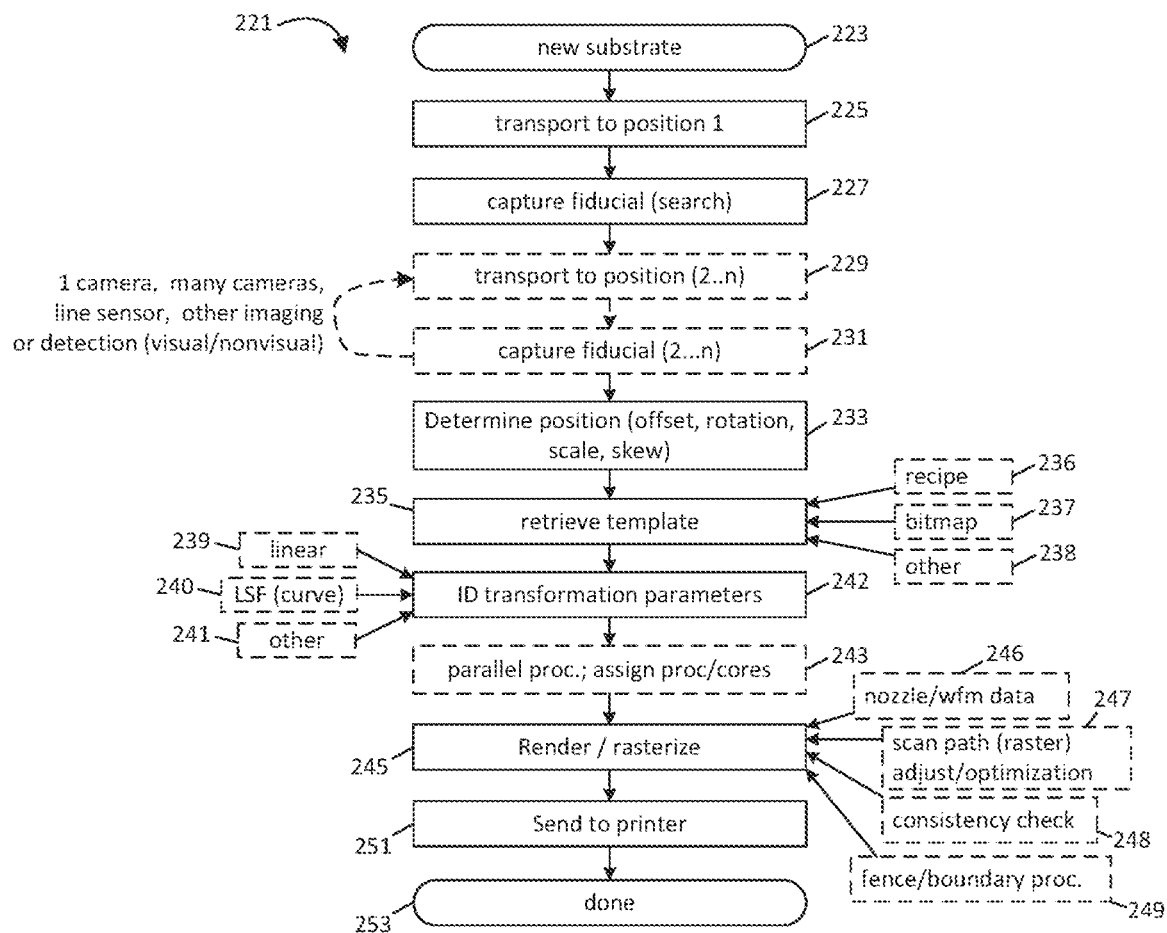
FIG. 2B provides another flow chart 221 related to alignment of one or more print deposition areas relative to substrate position.

FIG. 2B provides a flowchart 221 of an exemplary printing process for each substrate in a series of substrates. More specifically, as each new substrate is received in the series (223), a mechanical handler transports the substrate to a first position (225); this positions the substrate in a manner where an expected fiducial position falls within a field of view of a camera. In one embodiment, per numeral 227, one or more cameras can be used to capture fiducial position. For example, one process discussed below in conjunction with FIG. 9B uses a standard camera to first identify the coarse position of the fiducial, and the substrate and fiducial are then repositioned as necessary for image capture using a second, high-resolution camera, i.e., to identify micron-scale position of the fiducial. FIG. 2B illustrates in dashed line several optional processes 229 and 231, i.e., in which a substrate is repositioned to permit capture of multiple fiducials; as noted, the more fiducials and alignment features used, the greater the ability to detect non-linearities of the substrate or of individual panels. In this embodiment, the substrate is controlled by a precision handler to effectively transport fiducial(s) for each panel to the camera, but in alternate embodiments, the camera can be mounted to a motion system and can be transported relative to a motionless substrate to locate fiducials, or both the substrate and the camera can be moved, as in the case of split-motion axes. As noted by text at the left side of the FIG., another embodiment uses a line scanner to image the substrate and/or its fiducials during substrate loading or other transport; still other embodiments feature a camera mounted to the printhead (i.e., used for very frequent "continuous" error monitoring and correction) and still another embodiment uses non-visual detection mechanisms. Irrespective of number of fiducials and/or detection mechanisms, once position particulars are identified and any errors ascertained (233), the stored template is retrieved (235) and rendered. FIG. 2B illustrates that the stored template can be in the form of a recipe (236), a bitmap (237) or in some other form (238) (e.g., object, vector or other format). Offset, misorientation and/or other error can be ascertained on a linear basis (239), using a least squares fit (LSF) approach (240) or using some other type of error estimation mechanism (241). For example, one embodiment uses two fiducials per panel; the fiducials can be in the form of a complex shape (e.g., such as the "crosses" depicted by FIG. 9A) and are used to determine panel rotation, corner offset and X and Y scaling error across a given panel. Then, printer control data can be adjusted or rendered from the template using linear or affine transforms. For a LSF approach, non-linear error within a panel or across a substrate can be detected and modeled by a polynomial in one or more dimensions, e.g., a supervisory processor operating under the control of software fits a curve to detected error (e.g., using error measures relative to multiple fiducials). Then, adjustment is performed according to the polynomial equation or an affine transform to assign printer grid firing decisions and associated nozzle parameters. Armed with a mechanism for mapping (242) the template to actual substrate position, a supervisory processor then optionally assigns processing tasks to additional processors (e.g., cores of a multi-core processor). In one embodiment, a multicore processor having a dozen or more processing cores are used to divide the rendering (or transformation) task, to speed processing; in another embodiment, hundreds of cores are used, further accelerating the processing. Such parallel processing is optional, as implied by the use of dashed-line functional box 243. Irrespective of whether parallel processing is used, the system proceeds to render the printer control data in a manner dependent on detected substrate and/or panel position, rotation, skew and scale, and assigns raster scans as appropriate (245). As implied by a first optional step, seen at the right side of FIG. 2B, in one embodiment (246), up-to-date expected droplet particulars for a given nozzle-waveform are supplied (e.g., mean and standard deviation of droplet volume and two-dimensional droplet trajectory for each unique waveform used for each unique nozzle). This information is used in the rendering process in a manner calculated to produce precise volume fills or ensure homogenous distribution of ink; as will be discussed below, in one embodiment, this data is continuously remeasured (e.g., in between substrate prints) so as to develop robust measurement populations and account for variations in properties of the deposited liquid (e.g., as a function of viscosity, ambient temperature and other factors). In one embodiment, as noted earlier, scan paths are not adjusted in response to misregistration, while only nozzle/droplet firing parameters are changed. In another embodiment, per numeral 247, rasterization is reassessed and is re-optimized; for example, as nozzle firing data changes, it may be possible to perform fewer scans (or conversely, it might be advisable to add scans for optimal control over deposited droplet volumes and positions. Numeral 247 denotes that, in one embodiment, printhead offsets from scan-to-scan can be reassessed as necessary. Per numeral 248, a consistency check can also be performed on printer control data that has already been partially adjusted from a spatial perspective to address error; for example, in one embodiment, printer control data is first rendered in dependence on detected substrate-to-printer variation and, subsequently, a software process is called to identify fluidic wells (or other discrete regions of the substrate) and "check" ink densities and fills for those regions—if transformation would result in too much or too little ink being deposited, the software process smooths or otherwise adjusts the printer control data to eliminate the error, thereby maintaining aggregate ink fills and ink density within desired norms. In yet another embodiment, the "edges" of a continuous layer (e.g., an encapsulation layer) are assessed following error adjustment in order to maintain a desired edge profile (249); that is, due to the spreading nature of deposited fluid, it might be desired to increase/decrease ink density at layer edges to main homogenous layer thickness up to the intended layer boundary, and edge characteristics in such an embodiment can be assessed or adjusted after error processing that spatially transforms printer control data to address error. Edge processing, as referenced, represents another type of consistency check, and is discussed extensively in the aforementioned U.S. Provisional Application No. 62/019,076, i.e., see generally, FIGS. 7A-7E. Note that while this provisional application discusses use of the mentioned techniques for encapsulation layers, these teachings can be applied to enhance accuracy in any deposited layer, patterned or otherwise. Many variations of these principles will occur to those skilled in the art. Finally, when processing is complete, the rendered printer control data including any raster scan information is sent to the printer, and the method ends, per numerals 251 and 253. As noted earlier, in one embodiment, it is generally desired to perform this processing per substrate in approximately two seconds or less for each substrate or panel that is processed by the system.

As noted earlier, layer information may be received, stored and rendered in many forms. FIG. 2C provides an example of a "recipe editor" that can be used to generate and edit layer descriptions in order to define "ideal" printing. Such data can be saved (with or without some form of pre-processing) in order the generate template data that will be adjusted or transformed for each new substrate.

More specifically, FIG. 2C shows a screen shot 261 of a software user interface ("UI") that provides for panel recipe definition or editing. Such a UI could be used in a manner integrated with a printer or manufacturing system, at an earlier design time (e.g., as part of a computer aided design system), or in some other manner. As represented by the screen shot 261, a software application advantageously simulates the layout of a substrate or print area and provides mechanisms for editing that layout. A UI display region 263 seen at the left side of the screen shot encompasses three different panel sizes variously embodied amongst the six depicted panels. In this example, each of the three different panel sizes will have a respective recipe. A second UI display region 265, seen at the bottom right of the screen shot, provides a window for array definition, and permits identification of Cartesian position for each of the depicted six panels, including "Sub-panel1," "Sub-panel2," "Sub-panel3," "Sub-panel3H1V0," "Sub-panel3H0V1," and "Sub-panel 3H1V1" as well as a link (for each panel) to a corresponding recipe (in this case, effectuated by these names, e.g., "Sub-panel3;" the latter three panels (Sub-panel3H1V0," "Sub-panel3H0V1," and "Sub-panel 3H1V1") all use the same recipe ("Subpanel3") but feature respective horizontal and vertical offset relative to the substrate. A topmost one of these definitions is seen expanded (i.e., because it is "selected"). Note that the second UI display region 265 provides for graphical selection and removal of any given panel (right side) as well as for expansion and manipulation of data for any desired panel (such as for panel1, as illustrated); for example, FIG. 2C shows that the topmost panel, "Sub-panel1," is defined to have a size of 825 by 500 millimeters, to have its top left corner positioned at 50 millimeters each from the left and top edges of the printable substrate area, and to have selective corner rounding (i.e., via a selected "corner radius" value). The expected position of one or more fiducials can be identified using a third UI display region 269; as noted earlier, printing is effectively defined relative to such fiducials, such that printing (and print area for any given panel) can be rendered based on deviation between expected fiducial position (relative to the printer or print transport path) and any actual (i.e., detected) fiducial position for the specific panel. As implied by the screen shot 261, different fiducials or fiducial feature points can be identified, e.g., to detect scaling error or skew. If desired, in other embodiments, the third UI display region 269 can be configured to accept definition of a fiducial shape or substrate feature, which the software then attempts to match to a detected (imaged) shape identified on each substrate at run-time. Finally, the UI is seen to provide for a fourth UI display region 267 which permits definition of substrate size and thickness. While in one embodiment, the printed layer thickness is common across all panels (e.g., for each layer of respective panels), this need not be the case for all embodiments; in one contemplated embodiment, thickness can vary per panel and can be influenced using different localized halftoning densities. For each layer, printing is performed as an integral print job across the substrate, e.g., via multiple scans, and the substrate and its wet ink are then transported to a cure chamber to produce a permanent layer; this post-printing cure process is typically also performed within a controlled atmosphere to inhibit particulate, oxygen or moisture contamination. Other layers can be added after the deposited liquid is cured or otherwise hardened.

As noted earlier, layer data defined, e.g., using a recipe editor can be stored in a myriad of forms suitable to the embodiment, e.g., as a bitmap, as raw recipe data, using a vector representation or in some other manner. In one embodiment, the recipe data is used to create a grayscale image (e.g., an array of 8 bit values for each position on the substrate) where each grayscale value in the image denotes a density of ink that is to be applied in the corresponding substrate position, and where each grayscale value is used to generate localized halftoning (i.e., according to the print grid) to build layer thickness. An example here would be helpful; in one embodiment, a matrix of eight-bit grayscale values is defined with rows and columns of eight-bit values between "0" and "255." Each value, e.g., "235," corresponds to a unit area of the substrate and maps to a specific layer thickness. For example, the value "235" might (depending on process and materials) map to a thickness of seven microns in the finished layer. If all the grayscale values in the matrix shared the same value, this might map to a relatively homogeneous layer, but the values can be varied to vary thickness across a panel, fill in underling geometries (e.g., structural voids beneath the layer), to tailor edge buildup, or for any desired effect. Grayscale value assignment can either be "dead-reckoned" to desired thickness (with variable, localized halftoning selected dependent on ink and process parameters in a manner that adapts the grayscale value to the desired thickness) or can be calibrated in advance to the desired thickness (with halftoning bearing a fixed relationship to grayscale values). In one embodiment, the correlation between grayscale value and thickness is measured after test layer formation (e.g., after cure or drying), so that deposited ink density is closely tied to ultimate layer thickness. Based on the measured data (or other feedback), software can then map droplet density to a desired grid pitch, for example, using the formula:

$$\text{Desired Thickness} = h \times \left\{ \frac{Volume_{drop}}{Pitch_{in-scan} \times Pitch_{cross-scan}} \right\}$$

In this formula, the in-scan pitch represents the spacing between drop opportunities in a first direction of relative motion between the printhead and substrate, the cross-scan pitch represents the spacing between drop opportunities in a direction generally perpendicular to (or otherwise independent of) this first direction, and the parameter h (times 100) is the grayscale value in percentage. In one embodiment, this relationship can vary over time and, thus, ink particulars can be continually re-measured to develop robust empirical data, for dynamic factors such as process or temperature, for specific machine or ink particulars, for nozzle age, or for other factors, with weighting emphasizing the most recent measurements. Clearly, many examples are possible, and as this example indicates, many different types of processing can be performed, either to generate a "template" from recipe data, or at run time to render a print job from a template depending on detected error.

FIGS. 3A-B and FIGS. 4A-G are used to discuss various rendering processes. As variously noted above, in one embodiment, error representing linear distortion of the entire substrate or panel can be detected and corrected for and, in another embodiment, error representing nonlinear distortion of the entire substrate or any panel can be detected and corrected.

Figure 3A:
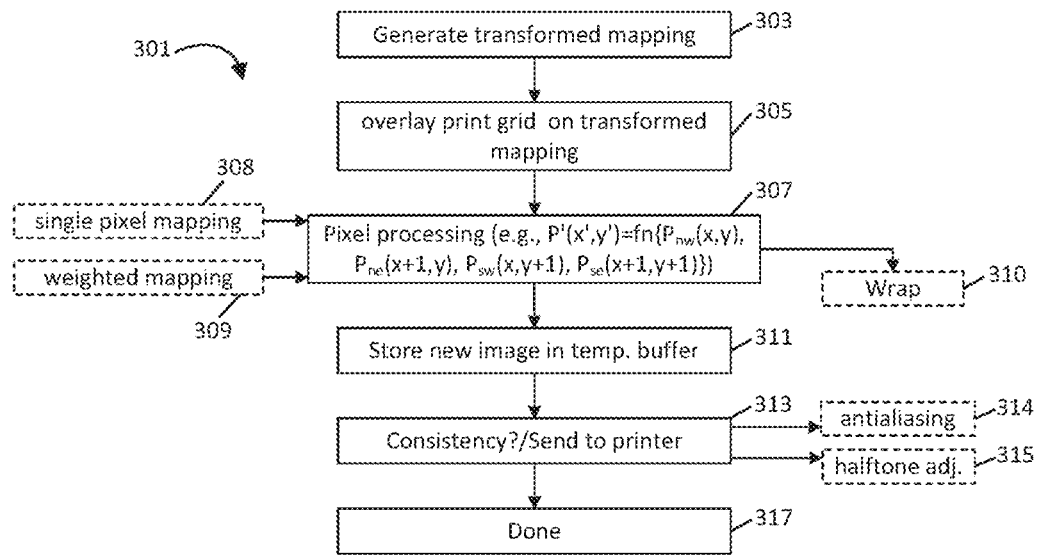
FIG. 3A provides a flow chart 301 relating to one specific method of adjusting a "template" to fine-tune printing in dependence on detected error.

FIG. 3A presents a flowchart 301 where, to adjust for detected error, a mapping between detected panel geography and the print grid is first defined (303). This mapping is generated to adapt rendering of an instance of a stored "template" (or raw layer data) to detected distortion. For example, referring briefly back to FIG. 1B, in the event of substrate positional offset, such a grid will be used to define pixel firing patterns relative to actual panel position (i.e., adapting to error) in a manner corresponding to the offset vector 123. In the case of the example of FIG. 10, the mapping will identify or designate a portion of the print grid of sufficient size to represent the print image rotated by angle α; in the case of the example of FIG. 1D, the mapping is of sufficient size to receive printing scaled by $(k_1)X$ and $(k_2)Y$. Generally speaking, the transformation is defined so as to encompass the desired, printable area of the specific run of the product array or substrate; for example, if substrate distortion increases or decreases substrate scale relative to the template print image, then the print grid might feature more or fewer nozzle positions representing increased, decreased or shifted area. The transformation is then used to render print data in a manner that registers with any substrate (e.g., panel) error. For example, if a pre-rendered template is stored for repeated print runs, then this template can be transformed (i.e., rotated, scaled, offset, skewed, etc.) in a manner corresponding to the mapping (and thus corresponding to the error) in a manner that adapts the print image to any detected per-run positional or alignment error. This transformation is performed by identifying that portion of the print grid corresponding to detected panel position (305), and then modifying the cached template data in a manner that utilizes the identified grid points but that is adjusted for detected error. For example, in one embodiment, as referenced by numeral 307, if pre-processing generated firing decisions of P(x,y) for each point on the print grid, then modified printer control data for nodes of the print grid that match detected product position can be determined in dependence on a positional error vector and analysis of one or more of the pre-processed firing decisions. This dependence can be formed relative to a closest node of the template data (308), offset according to an error vector or, because misalignment or positional error can be a non-integer multiple of grid pitch, a weighted function of 2, 3, 4 or a different number of filing decisions from the template (309). In one embodiment, the firing decision is based only on a single node of print grid represented by the original template (i.e., offset according to the error vector), and in a second embodiment, it is based on a weighted average of four closest nodes, according to $$P'(x',y')=fn\{P_{nw}(x,y),P_{ne}(x+1,y),P_{sw}(x,y+1),P_{se}(x+1,y+1)\},$$

where $P_{nw}(x,y)$, $P_{ne}(x+1,y)$, $P_{sw}(x,y+1)$, and $P_{se}(x+1,y+1)$ respectively represent northwest, northeast, southwest and southeast grid point decisions, and where x and x' and y and y' are related according to detected error. Clearly, this is but one error compensation algorithm and many alternate algorithms will readily occur to one skilled in the art.

For example, if a hypothetical grid point {P'(x',y')} (representing a specific grid point for the transformed panel), given error, corresponds to a point that is closest to each of specific NE and SE grid points (print pixels) of the cached template, and less close to specific corresponding NW and SW grid points (print pixels), and if these NE, SE, NW and SW points respectively corresponded firing decisions of (1, 1, 1 and 0), then the print grid point {P'(x',y')} could be assigned a binary firing decision (1 or 0) as a function of firing decisions (1, 1, 1 and 0) weighted according to error distance to these four nodes {e.g., assigning a firing decision of "1" to P'(x',y')} according to {0.40*(1)+0.40*(0)+0.10*(1)+0.10*(1)=0.60>0.50}. Note again that this mathematical relationship is exemplary only and that many algorithms can be used for assigning nozzle firing decisions; as noted, in one specifically contemplated embodiment that uses a cached template, the firing decision is based only on a closest single overlapping print pixel from the transform image, with a software antialiasing process used to process nozzle firing decisions to ensure a consistent number of droplets in the transformed image. In one embodiment, as mentioned, an affine transform is used. Irrespective of correction methodology, as error-adjusted printer control data is created, it is stored in memory as a new or customized print image (311) with finished, rendered printer control data being sent to the printer (313) for execution. Following completion of the layer (317), the system is then prepared for an ensuing layer (e.g., using the same transformations) or a new product run or substrate.

Note that numeral 310 refers to a dashed line (optional) wrap process used to ensure consistency of deposition. For example, if a particular point P'(x',y') were to fall within a fluidic well used to retain liquid for use as a light generating layer of a display, and a weighted error function were to call for reliance on template print pixels that fell outside of that well relative to the template image, the weighted function could be shifted (i.e., wrapped) so as to instead rely on other print pixels associated with the unshifted print well. Such a wrap process can also optionally be performed for each core or processor in a parallel processing environment, e.g., borrowing print pixels of other processors in order to maintain localized consistency. Other examples are also possible. For example, numeral 313 indicates that in some embodiments, the template image is shifted or distorted according to error, and that a software daemon is then called to process predetermined regions of the substrate (e.g., fluidic wells) and test for compliance within a threshold. One such process (i.e., antialiasing, 314) includes simply testing the number of droplets (or aggregate expected volumes from stored data representing the respective droplet's mean volumes) to ensure that aggregate liquid still meets required norms following error shifting. In another variation, nozzle data such as validation data, expected droplet volumes or trajectories or other data can be tested by such a daemon to ensure desired aggregate value consistency, 315 (e.g., to facilitate layer homogeneity), with adjustment to printer control data being performed as necessary to provide for deposition consistency. As noted, many different processes can be used.

Figure 3B:
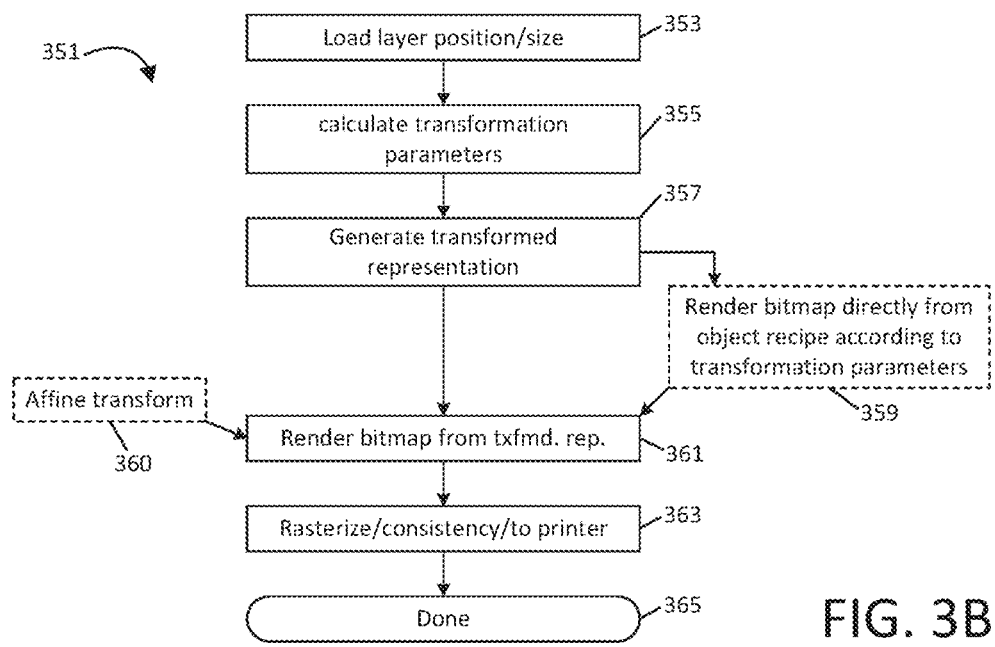
FIG. 3B provides another flow chart 351 relating to one specific method of adjusting a "template" to fine-tune printing in dependence on detected error.

FIG. 3B illustrates another flowchart 351 used to describe processing of a stored template. More specifically, information representing the desired layer is first loaded from the template (353). In one embodiment, this information includes raw recipe data, in a second embodiment, the information includes a bitmap representing nozzle firing instructions, and in a third embodiment, the information is represented by some other format, e.g., intermediate to these two forms. The system then calculates transformation parameters (355) needed to map printing represented by the template over the actual (detected) panel or substrate position; these parameters are then applied to generate a transformed representation (357). As implied by optional process block 359, in one embodiment, rendering of printer control data can be performed at run time directly on recipe data (i.e., stored as the template) according to transformation parameters. As noted, in one embodiment, one or more affine transforms can be used (360). The transformed representation is then output as a rendered bitmap (361) and used to produce raster data (363). The transformed representation can be checked for consistency of ink density or aggregate volume for a unit area or for other quality control reasons (363). Subject to any corrected, this data is then output to the printer (363) and the method ends (365).

Figure 4A:
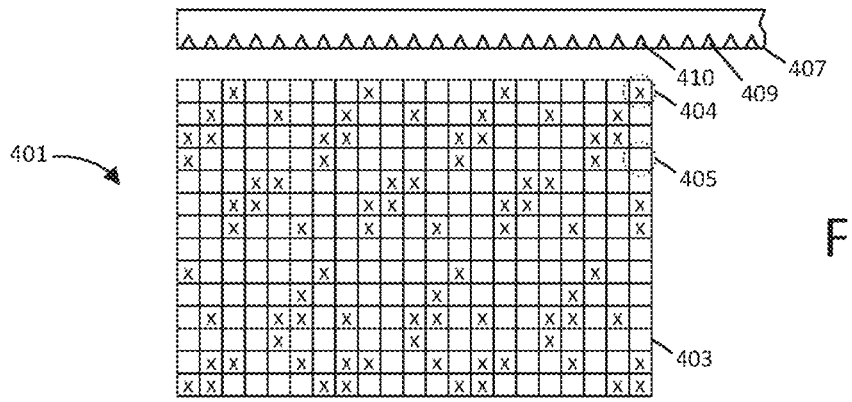
FIGS. 4A-4I are used to discuss treatment of alignment errors and, more specifically, to explain processes for assigning or reassigning printhead nozzle firing decisions, to fine-tune printing.

FIG. 4A provides an example 401 used to explain one example print grid and transformation as applied to a cached bitmap. A print grid for an ideal (i.e., no error) "bitmap" print image is referenced by numeral 403; each "box" in that print grid (e.g., per numeral 404) represents a print "pixel" defined by a grid point, where an "X" in the box denotes that a print nozzle is to fire a droplet at the corresponding grid point as a printhead is moved relative to the underlying substrate. Similarly, a "box" or pixel 405 seen as empty (i.e., not having an "X") denotes that a print nozzle will not be fired over that position. The top of FIG. 4A shows a representation of a printhead 407 where individual triangles (such as identified by numeral 409) represent each nozzle. As the printhead moves relative to the substrate, each given nozzle will pass a series of print pixels (discrete droplet firing points), each at a different point in time. As an example, nozzle 410 will pass as it is moved downward relative to the drawing page an area corresponding to print pixel 404 (where it is fired) and subsequently an area corresponding to print pixel 405 (where it is not fired). The bitmap 403 is predefined and is stored in memory as a template for use in a repeatable manufacturing process.

Figure 4B:
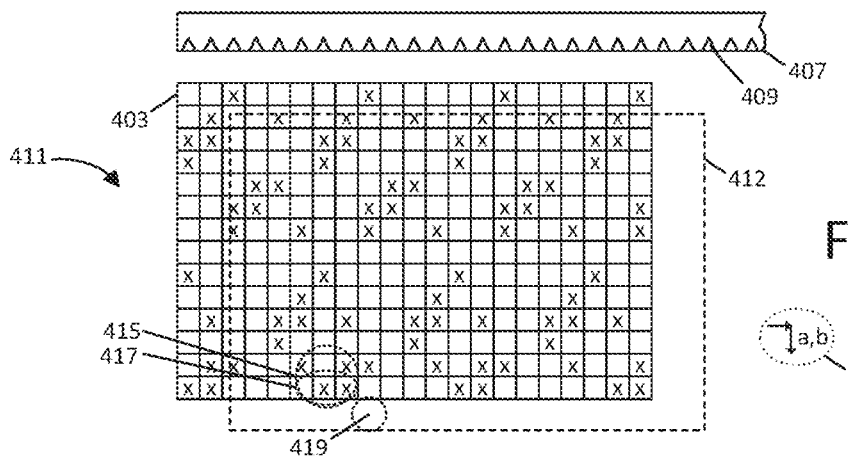

FIG. 4B presents an example 411 where an instance of a product is deemed to be at an offset position relative to the template, for example, due to positional error in a substrate. Because of this offset (413), the area that should receive printing for accurate registration is represented by numeral 412. If the nozzle firing instructions provided by the ideal print image 403 remain unadjusted, then printing will occur in a manner that is misaligned with underlying product geometry. It is therefore desired to adjust the template so that printing occurs in the right place. In this regard, the template from FIG. 4A can be distorted at run time (e.g., by shift in position) so as to be dynamically aligned with an individual substrate, panel or other product region so as to mitigate error.

Figure 4C:
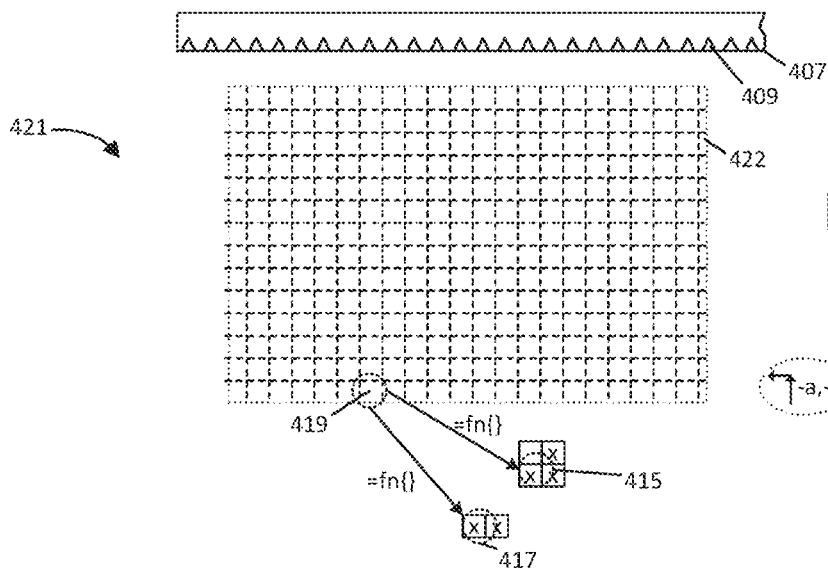

FIG. 4C provides an example 421 of a portion of the print grid 422 which overlays detected product position. Note that in this embodiment this is the same print grid as represented by FIG. 4A but with nodes that correspond to detected product position. Once again, each depicted node defines a print pixel that will be passed by the printhead 407 in its motion relative to the substrate, and each "box" (such as print pixel 419) corresponds to a printhead nozzle and a nozzle firing time. In one embodiment, the specific nozzle is predetermined (e.g., scans associated with the template will also be used for the specific product instance), but this is not required for all embodiments. However, note that the positional offset (413) may not exactly align with printhead nozzle in-scan or cross-scan pitch. Software therefore effectively overlays detected product position against the print grid 422 and bases firing decisions for this overlay on a shifted version of the original template image according to offset 413; each print pixel in this example may correspond to (overlay) up to four print pixels of the original template print image depending on the offset 413.

For example, FIGS. 4B and 4C show two cases where a print pixel 419 for detected product position corresponds (given error 413) to a point intermediate four/two template print pixels, as denoted by numerals 415 and 417. Note that for various embodiments, any number of nearby pixels can be applied in the weighting function; in one embodiment, only a single "closest" pixel only is used, in a second embodiment, "two" neighboring pixels can be used (e.g., per numeral 417) while in a third embodiment, a different number of nearby pixels (e.g., "9") can be used, i.e., the disclosed techniques should not be viewed as limited to consideration of a weighted average of four template print pixels. The two print pixel example 417 serves as a proxy for any number of pixels, whether more than, less than or equal to two, and whether or not based on a weighted average of multiple pixels. A decision is made for print pixel 419 based on the referenced pixel set, and once performed for every grid point seen in FIG. 4C, this effectively "transforms" the data from FIG. 4A to correspond to actual product position. Once this process is complete, then rasterization (e.g., scan planning) is performed, as appropriate, and printing is then executed based on the detected product position. The above process accurately maps any ink densities represented by the original template print image onto the shifted product geometries as detected in the particular print run.

Figure 4D:
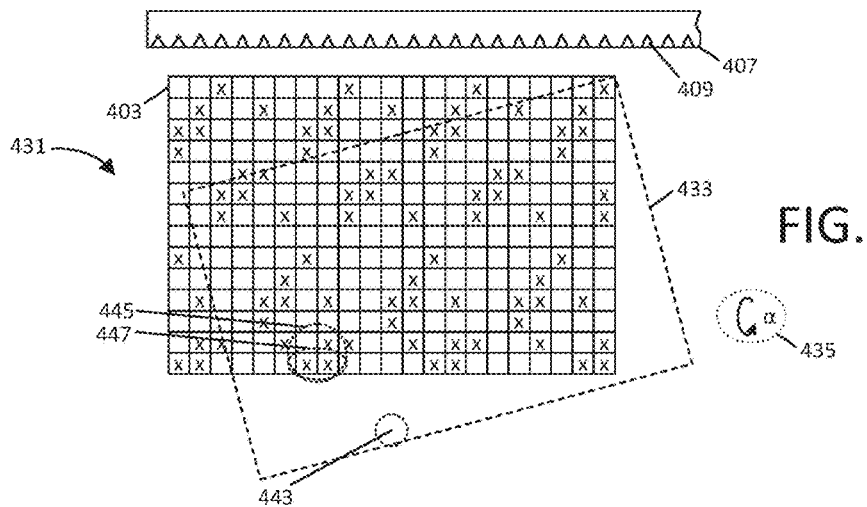
Figure 4E:
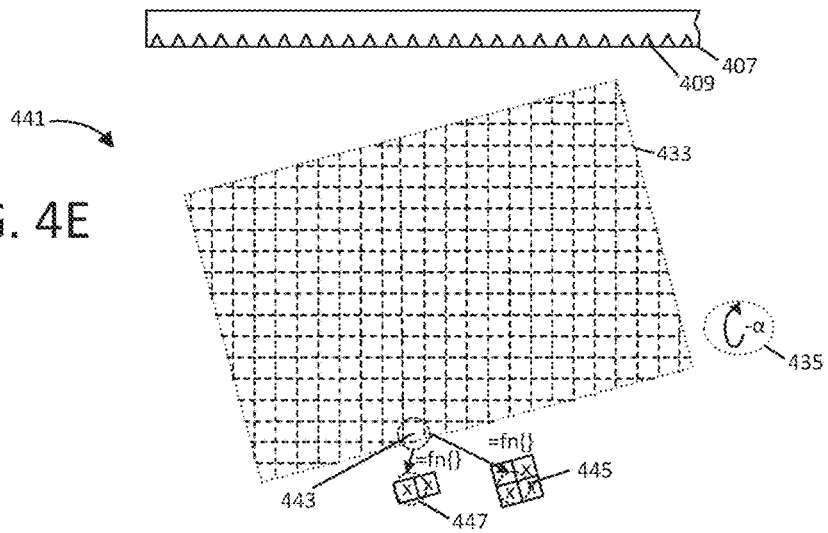

FIGS. 4D and 4E provide examples 431 and 441 that respectively illustrate bitmap processing in the event of unintended product (array, product, substrate or panel) rotation. As seen in FIG. 4D, it is assumed that a substrate or portion thereof is misoriented by angle α, per numeral 435. For proper printing, the print nozzle firing pattern should therefore also be distorted according to this same value, as represented by outline 433. FIG. 4E highlights a print grid region corresponding to detected product/panel position. Note that while the desired print area is rotated relative to the substrate, the printhead 407 and nozzles (such as nozzle 409) will each define a regular print grid at which droplets can be fired. Once again, for each grid point (or print pixel) of the print grid, the software shifts and overlays the original template image and then weights any overlaid print pixels of the original template in order to obtain a weighted pixel firing decision for that grid point. This operation is represented for example with reference to print pixel 443 in FIG. 4E, and to associated (illustrative) processing of four template grid points 445 or two template grid points 447. Once again, the two grid point example 447 is cited simply to indicate that alternative embodiments can use any number of references to the cached template print image.

Figure 4F:
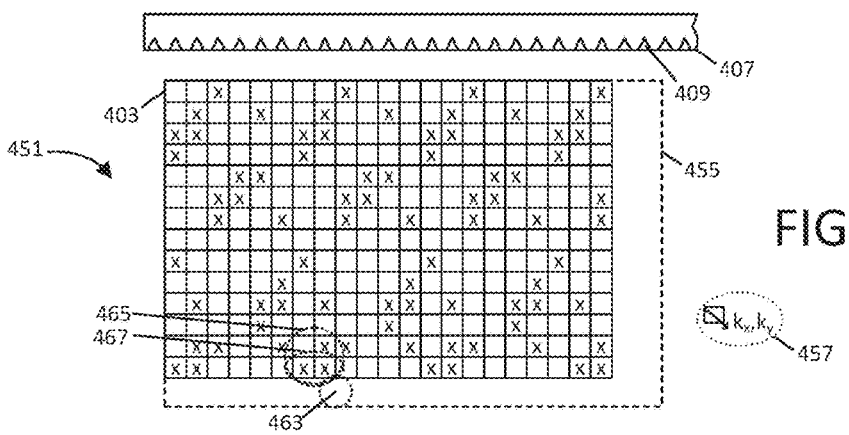
Figure 4G:
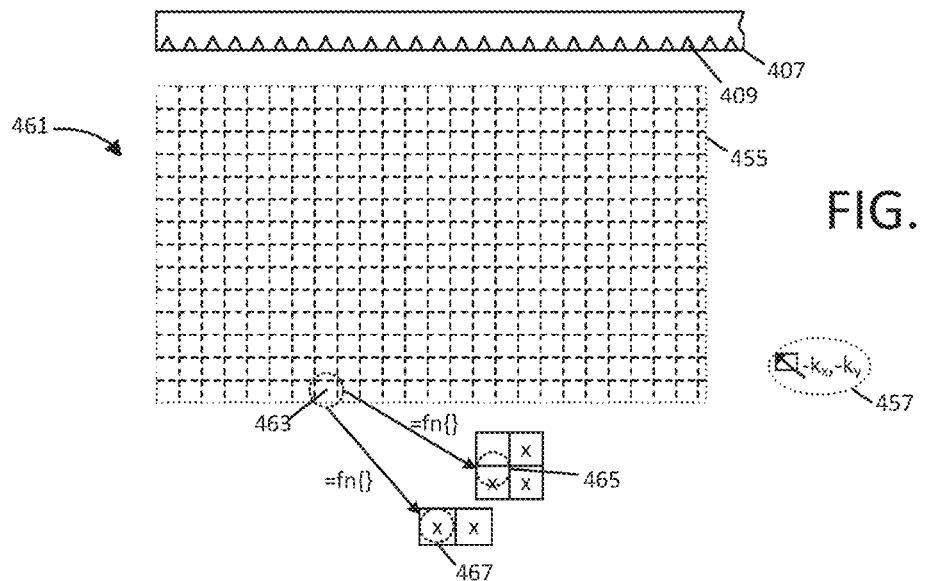

FIGS. 4F and 4G provide examples 451 and 461 that respectively illustrate processing in the event of scaling error. Once again, numeral 403 refers to the template for a particular geography, and numeral 455 represents a footprint that should receive printing to properly align a new layer with the desired product footprint according to a scaling vector 457. In such an example, a new print grid is effectively defined according to the scaling vector by a mathematical multiplication process. Note that the print grid, in addition to effectively being scaled in size, also potentially uses variable offsets according to substrate position. Assuming an increase in both dimensions to the footprint for a product or panel that is to be printed, the effect is as if the pixels of the overlaid template image are increased in size (e.g., compare the depicted size of template print image pixels 465 and/or 467 as represented in FIG. 4G to the print image pixels 445 and 447 depicted in FIG. 4E).

Figure 4H:
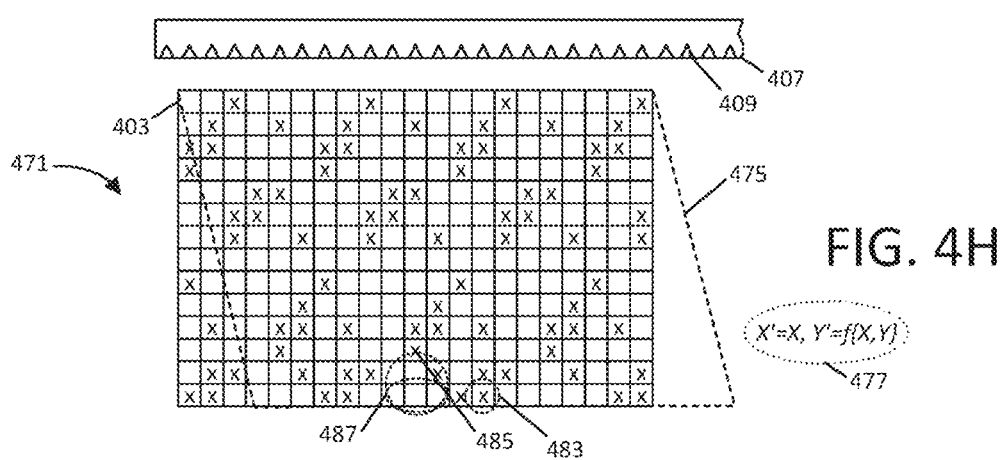
Figure 4I:
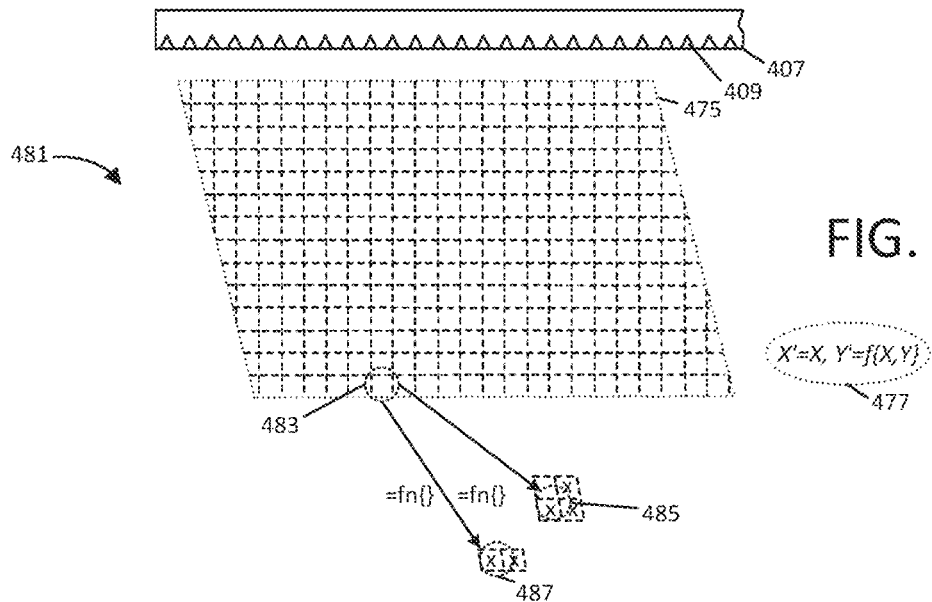

FIGS. 4H and 4I show an illustration directed to skew compensation. Numeral 475 represents a footprint that should receive printing to properly align a new layer with the desired product footprint according to a skew adjustment formula 477. Note that the amount of skew varies according to height of the subject that is being distorted. If the error being compensated for corresponds to uniform skew across the substrate, then the amount of distortion in the "Y" dimension (left to right across the FIG.) varies depending on the "X" dimensional value taken from the substrate edge. The X coordinate transformation in this example is unity (i.e., no change), but note that in general, this result will differ depending on the orientation of skew. The template is scaled according to a scaling vector by a mathematical multiplication process according to formula 477, and is effectively overlaid against a print grid corresponding to detected product scale; the firing value for each print grid point of the overlaid grid is computed according to formula 477 (i.e., the inverse of the scaling), based (e.g.) on 1, 2, 4 or another number of overlapping or nearby print pixels according to a weighting criteria; this is represented in FIG. 4I by the depicted matching of print grid point 483 against weighted, positionally overlaid print pixels 485 or 487 of the template; again, note that each grid point represents a possible firing position of a nozzle (e.g., referenced by numeral 409) of a printhead 407 as it is moved vertically relative to the drawing page.

Note that in the depicted examples, there are print pixels adjacent the edge of the footprint of the print grid that are not necessarily weighted by a consistent number of template print pixels (e.g., 4) relative to other parts of the print grid. To avoid underrepresentation of droplets adjacent a border region of the new footprint, an edge grid point can advantageously use an algorithm (e.g., wrapping of pixels from the opposite side of the footprint) to ensure proper droplet density. In a situation where the depicted footprint (e.g., 475) represents the boundaries of the desired layer, then an edge process (e.g., fencing) can be applied if desired to ensure well-defined edges, as previously referenced. Other techniques and variations are also possible.

It was earlier mentioned that in one embodiment, a bitmap can consist of grayscale values (e.g., 8 bit or other multibit values) where each value represent a volume of ink or desired thickness. The processing just described can also be applied to such grayscale values simply by weighting each grayscale value of the template by the appropriate distance measures and grayscale magnitude. For example, again using the example of a hypothetical grid point {P'(x',y')} of detected product geometry that, according to normalized overlapped area, maps 40% to each of the NE and SE grid points (print pixels) of a template, and 10% of NW and SW grid points of that template, and if the NE, SE, NW and SW points respectively had grayscale decisions of (235, 235, 150 and 0), then the hypothetical grid point {P'(x',y')} could be assigned a grayscale value of 203 according to {0.40*(235)+ 0.40*(235)+0.10*(150)+0.10*(0)=203}. This measure can also, if desired, be directly converted by software for individual print grid notes to a binary firing decision via comparison with any desired threshold (e.g., "1"=fire if 203>Th). Note that these relationships are exemplary only and that many algorithms can be used for assigning nozzle firing decisions in a customized print image; as noted earlier, in at least one contemplated system, measured per-nozzle, per-drive waveform droplet particulars can be factored into this process (e.g., the fact that a nozzle corresponding for P'(x',y') fires a heavy droplet, e.g., volume=12.4 pL, assuming a given printhead scan offset, could be relied upon in assigning a different nozzle to instead fire the droplet for P'(x',y') or conversely, scans can be replanned so as to use a different printhead offset and thus a different nozzle for P'(x',y')). Other variations are also possible.

With methods for transforming a print image introduced, this disclosure will now discuss some exemplary circuitry associated with printing and printheads used in an industrial printer to fabricate one or more layers of a product.

In FIGS. discussed above, a simplified printhead (e.g., referenced by numeral 407 in FIGS. 4A-I) was depicted as having a relatively small number of nozzles, e.g., 20 or so. In fact, for a typical manufacturing operation, especially for large scale products, a printhead might have a much greater number of nozzles, e.g., thousands, arranged in multiple rows; there can be multiple such printheads mounted to a common assembly, e.g., such that, in all, thousands to tens of thousands of print nozzles are used to jet material across a relatively wide swath of the substrate. This structure provides for high quality ink droplet delivery with highly accurate positional resolution. Each printhead is expected to deposit a nominal amount of ink per droplet (e.g., ten picoliters, or 10.00 pL), but in practice, this number can vary from nozzle-to-nozzle, as can nozzle position, droplet velocity, and droplet ejection trajectory. These variations can potentially cause defects in a deposited layer if left unchecked, defects which can carry over to the quality of a finished product.

In one embodiment, in order to more accurately fabricate the desired layer, droplet particulars for each nozzle are measured and used to develop a statistical model for each nozzle's performance for each of these parameters; repeated measurement helps effectively average out measurement error, and develop a relatively accurate understanding of a mean and sigma for each parameter. Various techniques are used to address the variations referred to above; generally speaking, these techniques leverage the variations, providing for precisely planned droplet depositions aimed at achieving specific ink fills, ink fill densities, and droplet distribution based on measured per-nozzle or per-droplet means and associated sigmas. Halftoning (i.e., ink density) and/or template adjustment can incorporate (or be corrected for) such variation such that, malfunctioning nozzles and/or variations in droplet position and/or volume can be corrected for. Note that "halftoning" as used herein refers the varying the droplet density (e.g., number of droplets per group of print grid nodes) to influence layer thickness, i.e., even though "tones" are not used per se (i.e., the "ink" or deposited liquid is typically colorless). In one technique described below, multiple (alternative) electric drive waveforms are made available for selection on a per-nozzle basis to provide for a selective ability to vary/deliver a targeted droplet volume and position (including at least one choice that approximates an ideal target droplet volume and position). The statistical measurements can be performed for each such waveform, and for each nozzle, so as to provide high accuracy in planning; these measurements can be updated or reperformed over time, so as to accommodate changes in ink properties (e.g., viscosity), account for temperature change, nozzle clogging or age, and other factors. In the sections below, the measurement capabilities to provide this understanding are introduced. Reflecting briefly on the earlier discussion relating to use of a print grid, each grid point will be associated with a nozzle of a printhead; the measurement capabilities just referred to can be applied in this process, such that for example, a malfunctioning nozzle is not assigned a firing decision in a printhead pass (and/or so that any required droplets are redistributed to other nozzles). In addition, differences in "X" axis position of a droplet can be corrected through the use of the alternate nozzle drive waveforms referred to, or through tuning or amplifying a preselected waveform, so as to change droplet timing to better position droplets or change their volume. Substantial additional detail on these practices is provided in the patent applications referred to earlier (which have been incorporated herein by reference).

FIGS. 5A-5D are used to introduce control over nozzle firing and drive waveform selection.

Typically, the effects of different drive waveforms and resultant droplet volumes are measured in advance. In one embodiment, for each nozzle, up to sixteen different drive waveforms are then stored in a per-nozzle, 1 k static random access memory (SRAM) for later, elective use in providing discrete volume variations, as selected by software. With the different drive waveforms on hand, each nozzle is then instructed droplet-by-droplet as to which waveform to apply via the programming of data that effectuates the specific drive waveform. This configuration information is stored separately by a printer (or control processor) from the firing decisions that will be applied to a substrate.

Figure 5A:
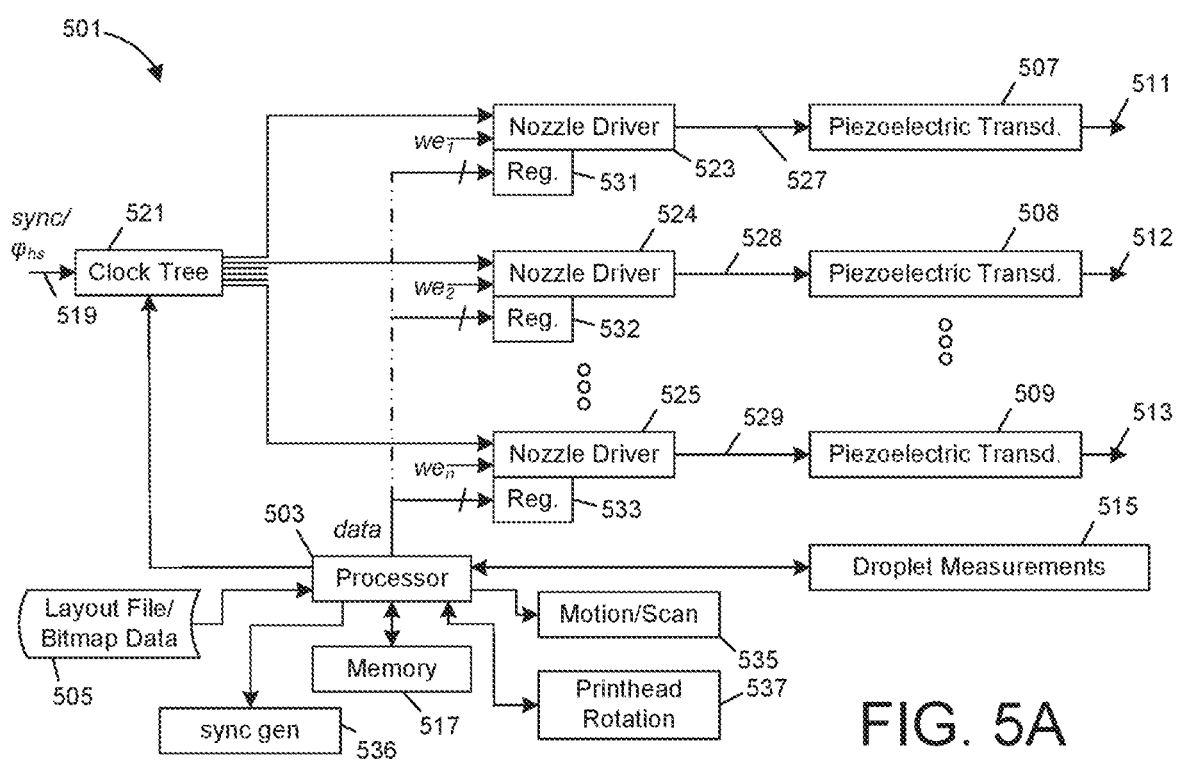
FIG. 5A shows circuitry used to assign or adjust nozzle drive waveforms (i.e., electronic drive signals) to/for different nozzles of a printhead.

FIG. 5A illustrates one such embodiment, generally designated by numeral 501. In particular, a processor 503 is used to receive data defining intended fill volumes per target region for a particular layer of material that is to be printed. As represented by numeral 505, this data can be a layout file or bitmap file that defines droplet volumes per grid point or positional address. A series of piezoelectric transducers 507, 508 and 509 generate associated ejected droplet volumes 511, 512 and 513, that are respectively dependent on many factors, including nozzle drive waveform and print-head-to-print-head manufacturing variations. During a calibration operation, each one of a set of variables is tested for its effects on droplet volume, including nozzle-to-nozzle variation and the use of different drive waveforms, given the particular ink that will be used; if desired, this calibration operation can be made dynamic, for example, to respond to changes in temperature, nozzle clogging, nozzle age or other parameters. This calibration is represented by a droplet measurement device 515, which provides measured data to the processor 503 for use in managing print planning and ensuing printing. In one embodiment, this measurement data is calculated during an operation that takes literally minutes, e.g., no more than thirty minutes for thousands of nozzles and preferably much less (e.g., for thousands of printhead nozzles and potentially dozens of possible nozzle firing waveforms), as an offline process. In another embodiment, such measurement can be performed iteratively, that is, for each nozzle, in a manner that updates different subsets of nozzles at different points in time (e.g., in between successive substrates in an assembly line process, as substrates are being loaded and unloaded). A non-imaging (e.g., interferometric) technique can optionally be used, potentially resulting in dozens of droplet measurements per nozzle, covering dozens to hundreds of nozzles per second. This data and any associated statistical models (and means) can be stored in memory 517 for use in processing layout data or a print image (e.g., bitmap data) 505 when it is received. In one implementation, processor 503 is part of a computer that is remote from the actual printer, whereas in a second implementation, processor 503 is either integrated with a fabrication mechanism for products (e.g., a system for fabricating displays) or with a printer.

To perform the firing of droplets for the depicted embodiment, a set of one or more timing or synchronization signals 519 are received for use as references, and these are passed through a clock tree 521 for distribution to each nozzle driver 523, 524 and 525 to generate the drive waveform for the particular nozzle (527, 528 and 529, respectively). Each nozzle driver has one or more registers 531, 532 and 533, respectively, which receive multi-bit programming data and timing information from the processor 503. Each nozzle driver and its associated registers receive one or more dedicated write enable signals (wee) for purposes of programming the registers 531, 532 and 533, respectively. In one embodiment, each of the registers comprises a fair amount of memory, including a 1 k static RAM (SRAM) to store multiple, predetermined waveforms, and programmable registers to select between those waveforms and otherwise control waveform generation. The data and timing information from the processor is depicted as multi-bit information, and although this information can be provided either via a serial or parallel bit connection to each nozzle (as will be seen in FIG. 5B, discussed below, in one embodiment, this connection is serial as opposed to the parallel signal representation seen in FIG. 5A).

For a given deposition, printhead or ink, a processor chooses for each nozzle a set of sixteen drive waveforms that can be electively applied to generate a droplet; note that this number is arbitrary, e.g., in one design, four waveforms could be used, while in another, four thousand could be used. These waveforms are advantageously selected to provide desired variation in output droplet volume and/or position for each nozzle, e.g., to cause each nozzle to have at least one waveform choice that produces a near-ideal droplet volume (e.g., a mean droplet volume of 10.00 pL), and to provide a range of deliberate volume variation for each nozzle. In various embodiments, the same set of sixteen drive waveforms are used for all of the nozzles, though, in the depicted embodiment, sixteen, possibly-unique waveforms are each separately defined in advance for each nozzle, each waveform conferring respective droplet volume characteristics.

During printing, to control deposition of each droplet, data selecting one of the predefined waveforms is then programmed into each nozzle's respective registers 531, 532 or 533 on a nozzle-by-nozzle basis. For example, given a target droplet volume of 10.00 pL, nozzle driver 523 can be configured through writing of data into registers 531 to set one of sixteen waveforms corresponding to one of sixteen different droplet volumes. The volume produced by each nozzle would have been measured by the droplet measurement device 515, with nozzle-by-nozzle (and waveform-by-waveform) droplet volumes and associated distributions registered by processor 503 and stored in memory in aid of producing desired target fills. This same process can be performed for droplet position or trajectory. The processor can, by programming the register 531, define whether or not it wants the specific nozzle driver 523 to output a processor-selected one of the sixteen waveforms. The processor can also program the register to utilize a per-nozzle delay or offset to the firing of the nozzle for a given scan line (e.g., to align each nozzle with a grid traversed by the printhead, to correct for error including velocity or trajectory error, and for other purposes); this offset is effectuated by counters which adjusts use of the particular nozzle (or firing waveform) by a programmable number of timing pulses for each scan. To provide an example, if the result of droplet measurement indicates that one particular droplet tends to have a lower than expected velocity, then corresponding nozzle waveform can be triggered earlier (e.g., advanced in time, by reducing a dead time before active signal levels used for piezoelectric actuation); conversely, if the result of droplet measurement indicates that the one particular droplet has a relatively high velocity, then the waveform can be triggered later, and so forth. Other examples are clearly possible—for example, a slow droplet velocity can be counteracted in some embodiments by increasing drive strength (i.e., signal levels and associated voltage used to drive a given nozzle's piezoelectric actuator). In one embodiment, a sync signal distributed to all nozzles occurs at a defined interval of time (e.g., one microsecond) for purposes of synchronization and in another embodiment, the sync signal is adjusted relative to printer motion and substrate geography, e.g., to fire every micron of incremental relative motion between printhead and substrate. The high speed clock (cons) is run thousands of times faster than the sync signal, e.g., at 100 megahertz, 33 megahertz, etc.; in one embodiment, multiple different clocks or other timing signals (e.g., strobe signals) can be used in combination. The processor also programs values defining a grid spacing; in one implementation, the grid spacing is common to the entire pool of available nozzles, though this need not be the case for each implementation. For example, in some cases, a regular print grid can be defined where every nozzle is to fire "every five microns." This print grid can be unique to the printing system, the substrate, or both. Thus, in one optional embodiment, a print grid can be defined for a particular printer with sync frequency or nozzle firing patterns used to effectively transform the print grid to match a substrate geography that is a priori unknown. In another contemplated embodiment, a memory is shared across all nozzles that permits the processor to pre-store a number of different grid spacings (e.g., 16), shared across all nozzles, such that the processor can (on demand) select a new grid spacing which is then read out to all nozzles (e.g., to define an irregular grid). For example, in an implementation where nozzles are to fire for every color component well of an OLED (e.g. to deposit a non-color-specific layer), the three or more different grid spacings can be continuously applied in round robin fashion by the processor. Clearly, many design alternatives are possible. Note that the processor 503 can also dynamically reprogram the register of each nozzle during operation, i.e., the sync pulse is applied as a trigger to launch any programmed waveform pulse set in its registers, and if new data is asynchronously received before the next sync pulse, then the new data will be applied with the next sync pulse. The processor 503 also controls initiation and speed of scanning (535) in addition to setting parameters for the sync pulse generation (536). In addition, the processor controls optional rotation of the printhead (537). In this way, each nozzle can concurrently (or simultaneously) fire using any one of sixteen different waveforms for each nozzle at any time (i.e., with any "next" sync pulse), and the selected firing waveform can be switched with any other of the sixteen different waveforms dynamically, in between fires, during a single scan.

Figure 5B:
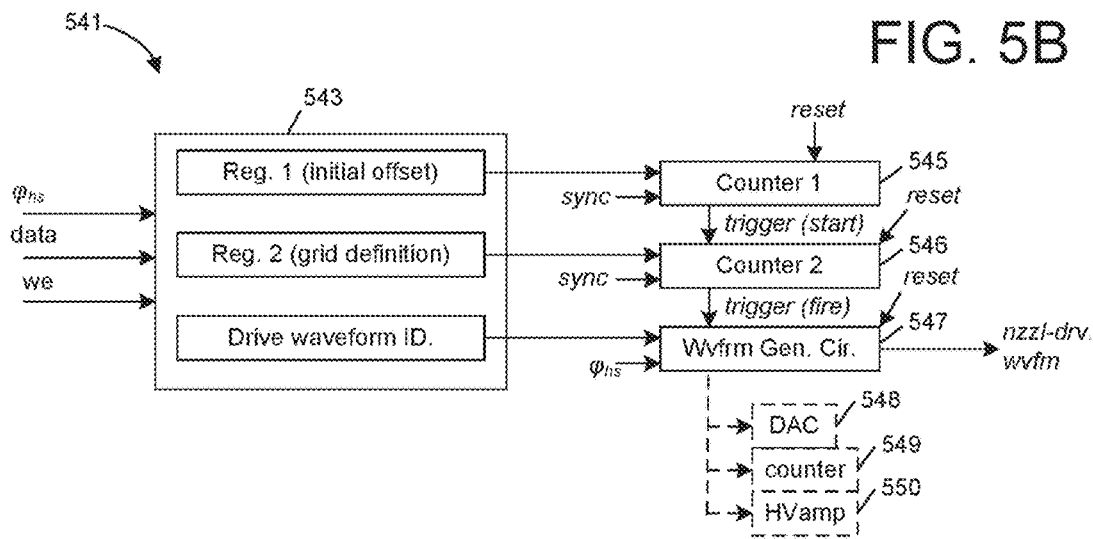
FIG. 5B shows per-nozzle drive circuitry that can be used to store data for a corresponding printhead nozzle, where the stored data enables programmable waveform definition (and, thus, variable volume, droplet trajectory, droplet landing location, velocity, or other per-nozzle droplet parameters).

FIG. 5B shows additional detail of the circuitry (541) used in such an embodiment to generate output nozzle drive waveforms for each nozzle; the output waveform is represented as "nzzl-drv. wvfm" in FIG. 5B. More specifically, the circuitry 541 receives inputs of the sync signal, a single bit line carrying serial data ("data"), a dedicated write enable signal (we) and the high speed clock ($\varphi_{hs}$). A register file 543 provides data for at least three registers, respectively conveying an initial offset, a grid definition value and a drive waveform ID. The initial offset is a programmable value that adjusts each nozzle to align with the start of a print grid, as mentioned. For example, given implementation variables such as multiple printheads, multiple rows of nozzles, different printhead rotations, nozzle firing velocity and patterns and other factors, the initial offset can be used to align each nozzle's droplet pattern with the start of the print grid, to account for delays and other factors. Offsets can be differently applied across multiple nozzles, for example, to rotate a print grid or halftone pattern relative to substrate geography, or to correct for substrate misalignment. Similarly, as mentioned, offsets can also be used to correct for aberrant velocity or other effects. The grid definition value is a number that represents the number of sync pulses "counted" before the programmed waveform is triggered; in the case of an implementation that prints flat panel displays (e.g., OLED panels), the target regions to be printed in presumably have one or more regular spacings relative to the different printhead nozzles, corresponding to a regular (constant spacing) or irregular (multiple spacing) grid. As mentioned earlier, in one implementation, the processor keeps its own sixteen-entry SRAM to define up to sixteen different grid spacings that can be read out on demand to the register circuitry for all nozzles. Thus, if the print grid spacing value was set to two (e.g., every two microns), then each nozzle could in theory be fired at this interval. The drive waveform ID represents is a selection value used to choose one of the pre-stored drive waveforms for each nozzle. In one embodiment, the drive waveform ID is a four bit selection value, and each nozzle has its own, dedicated 1 k-byte SRAM to store up to sixteen predetermined nozzle drive waveforms, stored as 16×16×4B entries. Briefly, each waveform can consist of sixteen discrete signal levels, of sixteen entries for each waveform contains four bytes representing a programmable signal level, with these four bytes representing a two-byte resolution voltage level and a two-byte programmable duration, used to count a number of pulses of the high-speed clock. Each programmable waveform can thus consist of (zero to one) discrete pulses to up to sixteen discrete pulses each of programmable voltage and duration (e.g., of duration equal to 1-255 pulses of a 33 megahertz clock).

Numerals 545, 546 and 547 designate one embodiment of circuitry that shows how a specified waveform can be generated for a given nozzle. A first counter 545 receives the sync pulse, to initiate a countdown of the initial offset, triggered by start of a new line scan; the first counter 545 counts down in micron increments and, when zero is reached, a trigger signal is output from the first counter 545 to a second counter 546; this trigger signal essentially starts the firing process for each nozzle for each scan line. The second counter 546 then implements a programmable print grid spacing in increments of microns. The first counter 545 is reset in conjunction with a new scan line, whereas the second counter 546 is reset using the next edge of the high-speed clock following its output trigger. The second counter 546, when triggered, and activates a waveform circuit generator 547 which generates the selected drive waveform shape for the particular nozzle. As denoted by dashed line boxes 548-550, seen beneath the generator circuit, this latter circuit is based on a high speed digital-to-analog converter 548, a counter 549, and a high-voltage amplifier 550, timed according to the high-speed clock ($\varphi_{hs}$). As the trigger from the second counter 546 is received, the waveform generator circuit retrieves the number pairs (signal level and duration) represented by the drive waveform ID value and generates a given analog output voltage according to the signal level value, with the counter 549 effective to hold DAC output for a duration according to the counter. The pertinent output voltage level is then applied to the high-voltage amplifier 550 and is output as the nozzle-drive waveform. The next number pair is then latched out from registers 543 to define the next signal level value/duration, and so forth.

The depicted circuitry provides an effective means of defining any desired waveform according to data provided by the processor 503. If necessary to comply with print grid geometry or to mitigate a nozzle with aberrant velocity or flight angle, the durations and/or voltage levels associated with any specific signal level (e.g., a first, "zero" signal level defining an offset relative to synch) can be adjusted. As noted, in one embodiment, the processor decides upon a set of waveforms in advance (e.g., 16 possible waveforms, per-nozzle) and it then writes definition for each of these selected waveforms into SRAM for each nozzle's driver circuitry, with a default selection of programmable waveform to be applied responsive to a firing decision then being effected by writing a four-bit drive waveform ID into each nozzles registers.

Figure 5C:
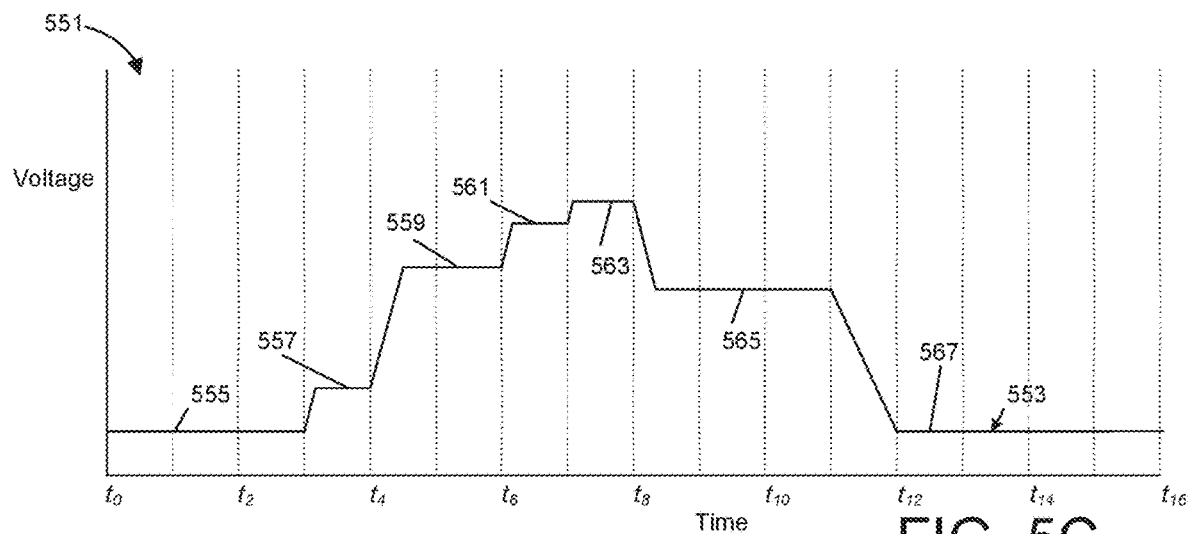
FIG. 5C shows an exemplary waveform, and is used to help explain how that waveform can be used to vary nozzle droplet parameters by programmable adjustment.

The use of multiple signal levels to shape a pulse is further discussed in reference to FIG. 5C.

That is, in one embodiment, waveforms can be predefined as a sequence of discrete signal levels, e.g., defined by digital data, with a drive waveform being generated by a digital-to-analog converter (DAC). Numeral 551 in FIG. 5C refers to a waveform 553 having discrete signal levels, 555, 557, 559, 561, 563, 565 and 567. As noted for this embodiment, each nozzle driver includes circuitry that receives and stores up to sixteen different signal waveforms, with each waveform being defined a series of up to sixteen signal levels, each expressed as a multi-bit voltage and a duration. That is to say, pulse width can effectively be varied by defining different durations for one or more signal levels, and drive voltage can be waveform-shaped in a manner chosen to provide subtle droplet size variation, e.g., with droplet volumes gauged to provide specific volume gradations increments such as in units of 0.10 pL. Thus, with such an embodiment, waveform shaping provides ability to tailor droplet volumes to be close to a target droplet volume value; when combined with other specific droplet volumes and positions, such as using the techniques exemplified above, these techniques facilitate precise fill volumes per target region. In another embodiment, predetermined waveforms can be applied with optional, further waveform shaping or timing applied as appropriate to adjust droplet volume, velocity and/or trajectory. In yet another example, the use of nozzle drive waveform alternatives provides a mechanism to plan volumes such that no further waveform shaping is necessary.

Figure 5D:
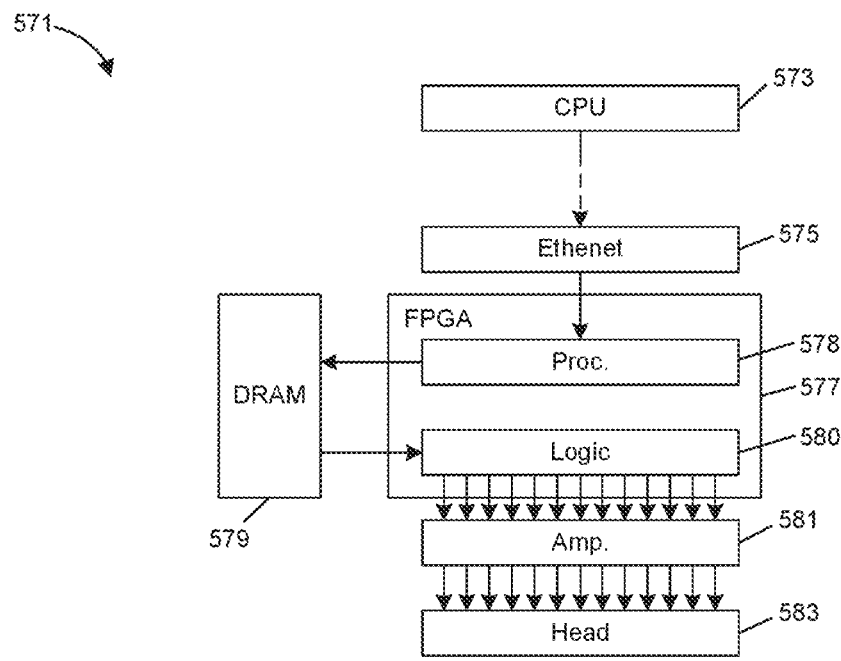
FIG. 5D shows another example of drive circuitry for nozzles of a printhead.

FIG. 5D shows yet another design 571. A CPU 573, for example, of a master computer, sends print data (adjusted for error) to a print module having multiple printheads (e.g., one of six different printheads, each having hundreds of print nozzles). At the print module, an Ethernet connection 575 receives the data from the CPU and provides that data to a field-programmable gate array ("FPGA") 577. A customized "soft processor" (578) within FPGA processes the data as appropriate and writes that data to memory (i.e., dynamic random access memory or "DRAM") 579. Unlike the embodiment described above, in the depicted embodiment, a waveform is written to memory for use by one or more nozzles; the particular format in which data is written or stored can be an implementation decision. For example, in one embodiment, the soft processor 578 writes specific waveform as a series of drive levels (see, e.g., the discussion above in connection with FIG. 5C) for each nozzle; other FPGA logic 580 then reads this data out at the appropriate time and provides this to amplifiers 581 and ultimately to the associated printhead 583 and associated nozzle drivers. In one implementation, the depicted FPGA 577 and DRAM 579 are components of each printhead (e.g., data is separately transmitted to each printhead), but this need not be the case for all embodiments. Note that one function of logic 580 and amplifiers 581 are to place appropriate waveforms in parallel form, i.e., such that they can be read out together for each nozzle at the appropriate time, in parallel (as necessary or appropriate to the design). In one implementation, the DRAM 579 can optionally be organized to have separate memory for each nozzle. Note that in this embodiment, instead of using a trigger, each nozzle receives one of sixteen waveforms (i.e., with one waveform being a flat waveform or zero drive signal, indicating that a particular nozzle is not to be fired). The particular drive waveforms can be dynamically supplied by the CPU 573 or written in advance (i.e., but dynamically changeable), with a run-time 4-bit value used to provide nozzle firing decisions and associated waveform selection (and trigger output of that waveform from the DRAM 579 or logic 580). Other alternatives are also possible.

With nozzle control circuitry thus introduced, as might be used in an exemplary manufacturing device, additional detail will now be presented as to one possible implementation of such a device. As alluded to earlier, one contemplated implementation of the techniques described herein is to the manufacture of flat panel devices in an array with those devices then being cut from a common substrate. In the discussion below, an exemplary system for performing such printing will be described, more specifically, applied to the manufacture of solar panels and/or display devices that can be used in electronics (e.g., as smart phone, smart watch, tablet, computer, television, monitor, or other forms of displays). The manufacturing techniques provided by this disclosure are not limited to this specific application and, for example, can be applied to any 3D printing application and to a wide range of other forms of products.

Figure 6A:
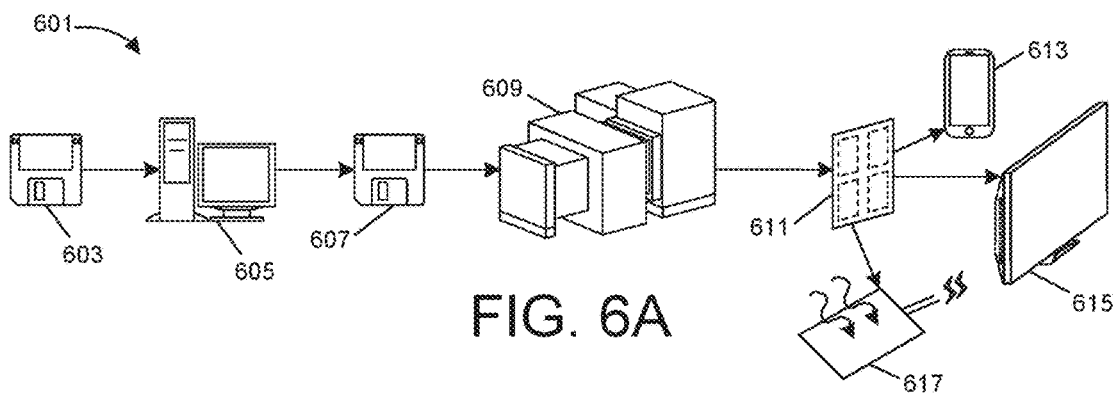
FIG. 6A is an illustrative view showing a series of optional tiers, products or services that can each independently embody techniques introduced herein; for example, the techniques presented herein can be implemented in the form of software (per numeral 603), or as printer control data (per numeral 607, to be used to control a printer to print on a substrate), or as a product made in reliance on these techniques (e.g., as exemplified by numeral 613, 615 or 617).

FIG. 6A represents a number of different implementation tiers, collectively designated by reference numeral 601; each one of these tiers represents a possible discrete implementation of the techniques introduced herein. First, techniques as introduced in this disclosure can take the form of instructions stored on non-transitory machine-readable media, as represented by graphic 603 (e.g., executable instructions or software for controlling a computer or a printer). Second, per computer icon 605, these techniques can also optionally be implemented as part of a computer or network, for example, within a company that designs or manufactures components for sale or use in other products. Third, as exemplified using a storage media graphic 607, the techniques introduced earlier can take the form of a stored printer control instructions, e.g., as data that, when acted upon, will cause a printer to fabricate one or more layers of a component dependent on the use of different ink volumes or positions to mitigate alignment error, per the discussion above. Note that printer instructions can be directly transmitted to a printer, for example, over a LAN; in this context, the storage media graphic can represent (without limitation) RAM inside or accessible to a computer or printer, or a portable media such as a flash drive. Fourth, as represented by a fabrication device icon 609, the techniques introduced above can be implemented as part of a fabrication apparatus or machine, or in the form of a printer within such an apparatus or machine. It is noted that the particular depiction of the fabrication device 609 represents one exemplary printer device that will be discussed in connection with FIG. 6B, below. The techniques introduced above can also be embodied as an assembly of manufactured components; in FIG. 6A for example, several such components are depicted in the form of an array 611 of semi-finished flat panel devices, that will be separated and sold for incorporation into end consumer products. The depicted devices may have, for example, one or more light generating layers or encapsulation layers or other layers fabricated in dependence on the methods introduced above. The techniques introduced above can also be embodied in the form of end-consumer products as referenced, e.g., in the form of display screens for portable digital devices 613 (e.g., such as electronic pads or smart phones), as television display screens 615 (e.g., OLED TVs), solar panels 617, or other types of devices.

Figure 6B:
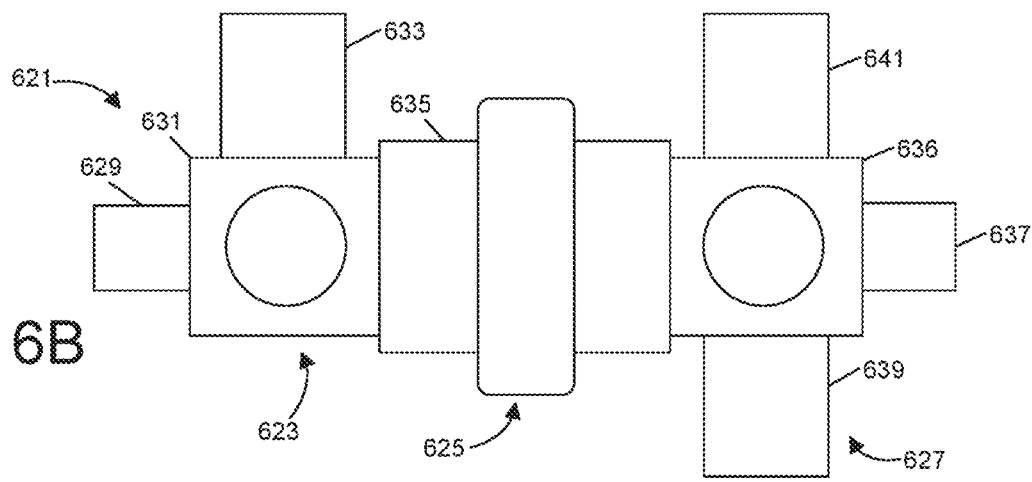
FIG. 6B provides a schematic view of a fabrication apparatus that includes a printer.

FIG. 6B shows one contemplated multi-chambered fabrication apparatus 621 that can be used to apply techniques disclosed herein. Generally speaking, the depicted apparatus 621 includes several general modules or subsystems including a transfer module 623, a printing module 625 and a processing module 627. Each module maintains a controlled environment, such that printing for example can be performed by the printing module 625 in a first controlled atmosphere and other processing, for example, another deposition process such an inorganic encapsulation layer deposition or a curing process (e.g., for printed materials), can be performed in a second controlled atmosphere. The apparatus 621 uses one or more mechanical handlers to move a substrate between modules without exposing the substrate to an uncontrolled atmosphere. Within any given module, it is possible to use other substrate handling systems and/or specific devices and control systems adapted to the processing to be performed for that module.

Various embodiments of the transfer module 623 can include an input loadlock 629 (i.e., a chamber that provides buffering between different environments while maintaining a controlled atmosphere), a transfer chamber 631 (also having a handler for transporting a substrate), and an atmospheric buffer chamber 633. Within the printing module 625, it is possible to use other substrate handling mechanisms such as a flotation table for stable support of a substrate during a printing process. Additionally, a xyz-motion system, such as a split axis or gantry motion system, can be used for precise positioning of at least one printhead relative to the substrate, as well as providing a y-axis conveyance system for the transport of the substrate through the printing module 625. It is also possible within the printing chamber to use multiple inks for printing, e.g., using respective printhead assemblies such that, for example, two different types of deposition processes can be performed within the printing module in a controlled atmosphere. The printing module 625 can comprise a gas enclosure 635 housing an inkjet printing system, with means for introducing an inert atmosphere (e.g., nitrogen) and otherwise controlling the atmosphere for environmental regulation (e.g., temperature and pressure), gas constituency and particulate presence.

Various embodiments of a processing module 627 can include, for example, a transfer chamber 636; this transfer chamber also has a including a handler for transporting a substrate. In addition, the processing module can also include an output loadlock 637, a nitrogen stack buffer 639, and a curing chamber 641. In some applications, the curing chamber can be used to cure, bake or dry a monomer film into a uniform polymer film; for example, two specifically contemplated processes include a heating process and a UV radiation cure process.

In one application, the apparatus 621 is adapted for bulk production of liquid crystal display screens or OLED display screens, for example, the fabrication of an array of (e.g.) eight screens at once on a single large substrate. These screens can be used for televisions and as display screens for other forms of electronic devices. In a second application, the apparatus can be used for bulk production of solar panels in much the same manner.

The printing module 625 can advantageously be used in such applications to deposit organic light generating layers or encapsulation layers that help protect the sensitive elements of OLED display devices. For example, the depicted apparatus 621 can be loaded with a substrate and can be controlled to move the substrate back and forth between the various chambers in a manner uninterrupted by exposure to an uncontrolled atmosphere during the encapsulation process. The substrate can be loaded via the input loadlock 629. A handler positioned in the transfer module 623 can move the substrate from the input loadlock 629 to the printing module 625 and, following completion of a printing process, can move the substrate to the processing module 627 for cure. By repeated deposition of subsequent layers, each of controlled thickness, aggregate encapsulation can be built up to suit any desired application. Note once again that the techniques described above are not limited to encapsulation processes, and also that many different types of tools can be used. For example, the configuration of the apparatus 621 can be varied to place the various modules 623, 625 and 627 in different juxtaposition; also, additional, fewer or different modules can also be used.

While FIG. 6B provides one example of a set of linked chambers or fabrication components, clearly many other possibilities exist. The techniques introduced above can be used with the device depicted in FIG. 6B, or indeed, to control a fabrication process performed by any other type of deposition equipment.

Figure 6C:
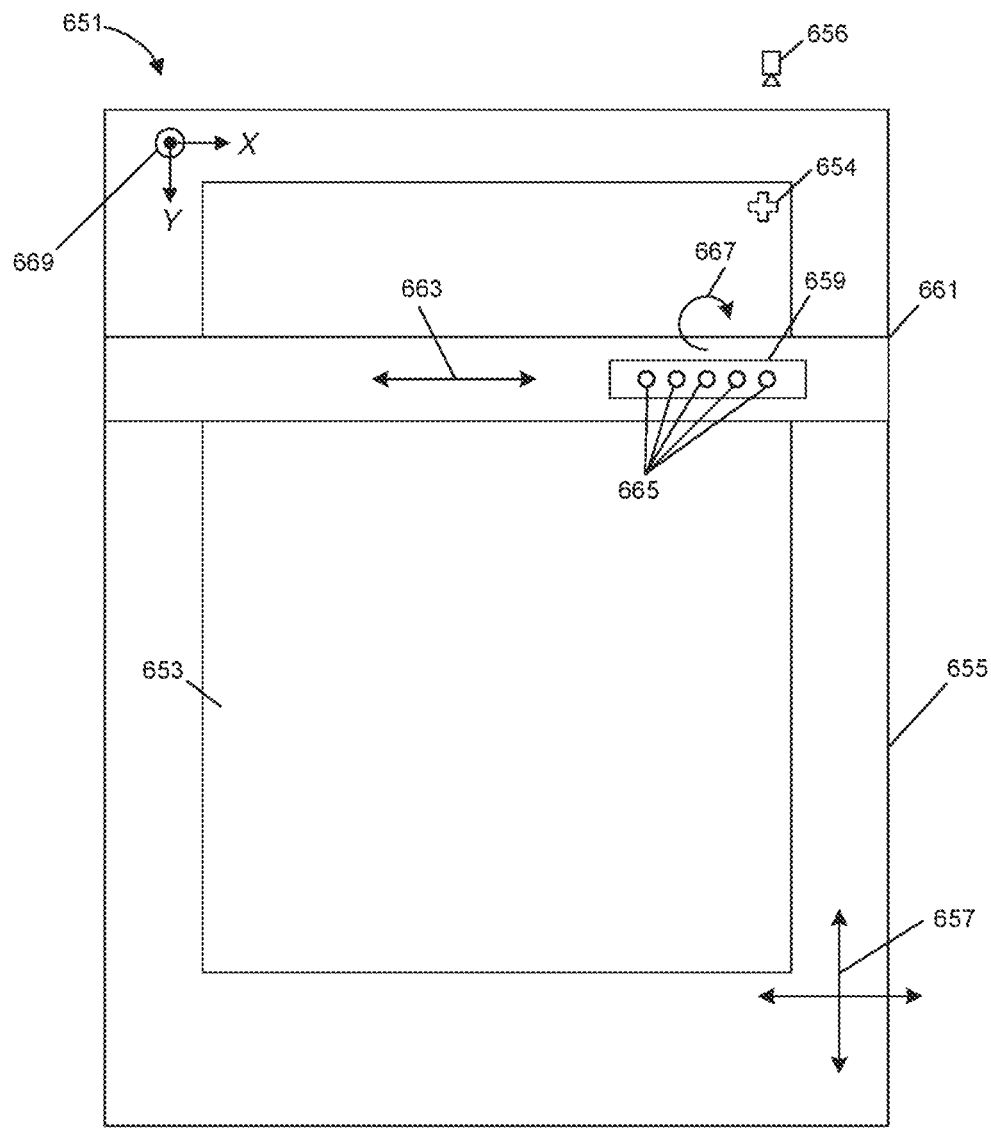
FIG. 6C shows a plan view of a print area within a fabrication apparatus; this print area can optionally be contained within a gas enclosure, i.e., such that printing occurs in a controlled atmosphere.

FIG. 6C provides a plan view of the substrate and printer as they might appear during the deposition process. The print chamber is generally designated by reference numeral 651, the substrate to be printed upon is generally designated by numeral 653, and a support table used to transport the substrate is generally designated by numeral 655. Generally speaking, any xy coordinate of the substrate is reached by a combination of movements, including x- and y-dimensional movement of the substrate by the support table (e.g., using a flotation support, as denoted by numeral 657) and using "slow axis" x-dimensional movement of one or more printheads 659 along a traveler 661, as generally represented by arrows 663. As mentioned, the flotation table and substrate handling infrastructure are used to move the substrate and advantageously provide deskew control along one or more "fast axes," as necessary. The printhead is seen to have plural nozzles 665, each of which is separately controlled by a firing pattern derived from a template (e.g., to effectuate printing of columns corresponding to printer grid points as the printhead is moved from left-to-right and vice-versa along the "slow axis"). With relative motion between the one or more printheads and the substrate provided in the direction of the fast axis (i.e., the y-axis), printing describes a swath that typically follows individual rows printer grid points. The printhead can also advantageously be adjusted to vary effective nozzle spacing (e.g., by rotating of the one or more printheads, per numeral 667). Note that multiple such printheads can be used together, oriented with x-dimension, y-dimension, and/or z-dimensional offset relative to one another as desired (see axis legend 669 in FIG. 6C). The printing operation continues until the entire target region (and any border region) has been printed with ink, as desired. Following deposition of the necessary amount of ink, the substrate is finished, either by evaporating solvent to dry ink (e.g., using a thermal process), or by use of a cure process, such as a UV cure process.

Figure 6D:
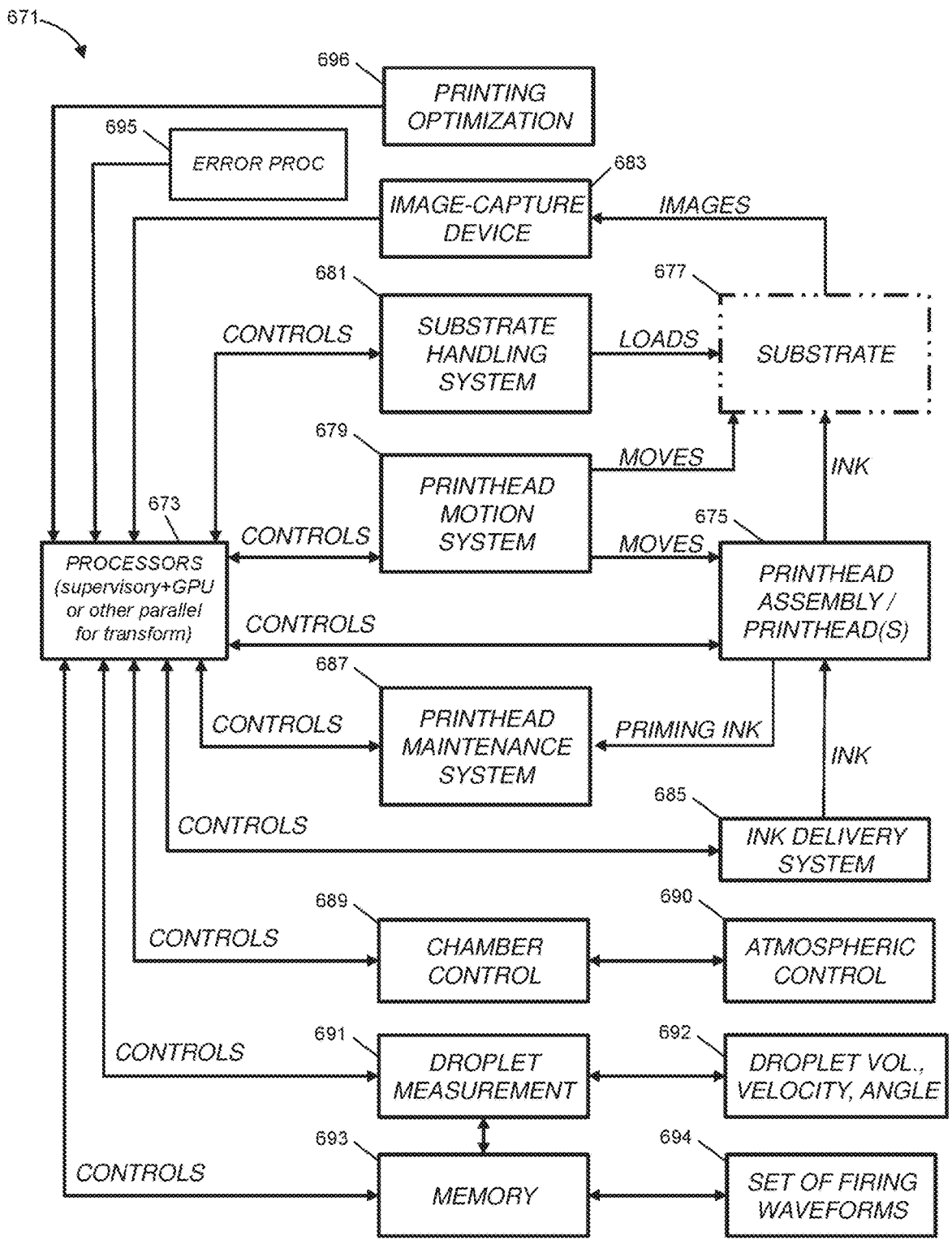
FIG. 6D provides a functional block diagram of a fabrication apparatus that includes a printer.

FIG. 6D provides a block diagram showing various subsystems of one apparatus (671) that can be used to fabricate devices having one or more layers as specified herein. Coordination over the various subsystems is provided by a set of processors 673, acting under instructions provided by software (not shown in FIG. 6D). As noted earlier, to perform on-the-fly transformations to correct for substrate or panel error, in one embodiment, these processors include a supervisory processor or general purpose CPU, and a set of additional processors used for parallel processing. In one specifically-contemplated implementation, these additional processors take the form of a multicore processor or graphics processing unit (GPU, e.g., with hundreds of cores, or more). Each core is assigned a portion of the print image to transform to distort the print image to match substrate error; if error is to be independently corrected on a panel or other product-by-product basis, then the each core can advantageously be assigned to a fraction or portion of a single product or panel (i.e., such that the specific core performs only a single transform operation on all assigned image data). Parallel processing and/or this form of delegation are not required for all embodiments. During a fabrication process, the processors feed data to a printhead 675 to cause the printhead to eject various volume of ink depending on firing instructions provided by a halftone print image. The printhead 675 typically has multiple ink jet nozzles, arranged in a row or array, and associated reservoirs that permit jetting of ink responsive to activation of piezoelectric or other transducers; such transducers cause a respective nozzle to eject a controlled amount of ink in an amount governed by an electronic firing waveform signal applied to the corresponding piezoelectric transducer. Other firing mechanisms can also be used. The printhead applies the ink to a substrate 677 at various x-y positions corresponding to the grid coordinates, as represented by the halftone print image. Variation in position is effected both by a printhead motion system 679 and substrate handling system 681 (e.g., that cause the printing to describe one or more swaths across the substrate). In one embodiment, the printhead motion system 679 moves the printhead back-and-forth along a traveler, while the substrate handling system provides stable substrate support and both "x" and "y" dimension transport (and rotation) of the substrate, e.g., for alignment and deskew; during printing, the substrate handling system provides relatively fast transport in one dimension (e.g., the "y" dimension relative to FIG. 6C), while the printhead motion system 679 provides relatively slow transport in another dimension (e.g., the "x" dimension relative to FIG. 6C), e.g., for printhead offset. In another embodiment, multiple printheads can be used, with primary transport being handled by the substrate handling system 681. An image capture device 683 can be used to locate any fiducials and assist with alignment and/or error detection functions described earlier.

The apparatus also comprises an ink delivery system 685 and a printhead maintenance system 687 to assist with the printing operation. The printhead can be periodically calibrated or subjected to a maintenance process; to this end, during a maintenance sequence, the printhead maintenance system 687 is used to perform appropriate priming, purge of ink or gas, testing and calibration, and other operations, as appropriate to the particular process. Such a process can also include individual measurement of parameters such as droplet volume, velocity and trajectory, for example, as discussed in Applicant's PCT patent application referenced earlier (PCT/US14/35193), and as referenced by numerals 691 and 692.

As was introduced previously, the printing process can be performed in a controlled environment, that is, in a manner that presents a reduced risk of contaminants that might degrade effectiveness of a deposited layer. To this effect, the apparatus includes a chamber control subsystem 689 that controls atmosphere within the chamber, as denoted by function block 690. Optional process variations, as mentioned, can include performing jetting of deposition material in presence of an ambient nitrogen gas atmosphere (or another inert environment, having a specifically selected gas and/or controlled to exclude unwanted particulate). Finally, as denoted by numeral 693, the apparatus also includes a memory subsystem that can be used to store halftone pattern information or halftone pattern generation software, template print image data, and other data as necessary. For example, the memory subsystem can be used as operating memory for the transformation of a previously generated print image according to the techniques introduced above, to internally generate printer control instructions that govern the firing of (and timing of) each droplet. If part or all of such rendering is performed elsewhere, and the task of the apparatus is to fabricate a device layer according to a received printer instructions, then the received instructions can be stored in the memory subsystem 693 for use during the printing process and/or manipulation as appropriate. As noted by numeral 694, in one optional embodiment, individual droplet particulars can be varied (e.g., to correct for nozzle aberration) through the variation of firing waveform for any given nozzle. In one embodiment, a set of alternate firing waveforms can be selected in advance and made available to each nozzle, on a shared or dedicated basis, optionally used in conjunction with substrate variation (error) processing 695, as described earlier. As noted, while some embodiments use predetermined scan paths (i.e., notwithstanding error), with compensation for error effectuated using different nozzles and/or drive waveforms for certain nozzles, in another embodiment, print optimization (696) is performed to reassess scan path particulars and potentially improve on deposition time.

Figure 7:
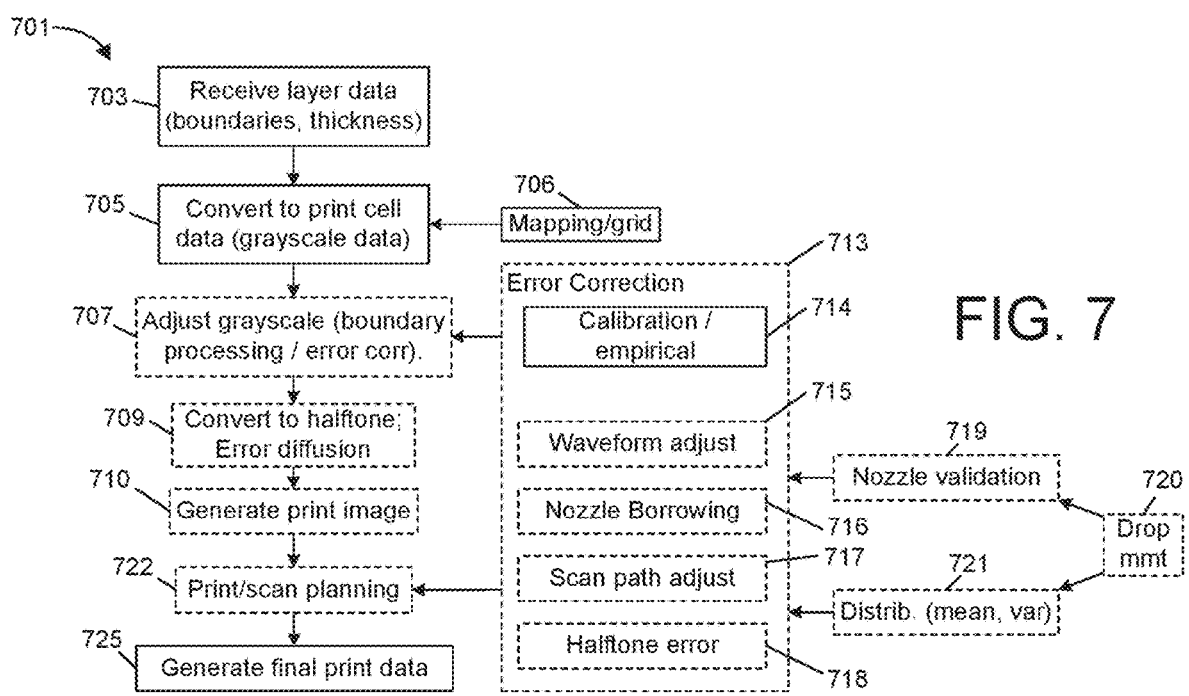
FIG. 7 provides a flow chart 701 used to describe measurement of effects of individual nozzle variations and/or nozzle-drive waveform variations, and related compensation techniques. In one embodiment, not only is printing adjusted for positional error but, in addition, nozzle-to-nozzle variations are taken into account in the adjustment, so as to permit printing to occur within carefully defined tolerances.

FIG. 7 provides another flow diagram 701 associated with some of the discussed processes. As with the earlier examples, data representing layout of a desired layer is first received, per numeral 703. This data specifies boundaries of the layer to be deposited and provides information sufficient to define thicknesses throughout the layer of interest (e.g., for a given panel). This data can be generated on the same machine or device on which the process 701 is performed, or it can be generated by a different machine. In one embodiment, the received data is defined according to an xy coordinate system and the provided information is sufficient to compute desired layer thickness at any represented xy coordinate point, for example, optionally specifying a single height or thickness to be applied throughout the layer, consistent with the x-micron by y-micron by z-micron example introduced earlier. Per numeral 705, this data can be converted to a grayscale value for each print cell (or each print pixel) in a deposition area that will receive the layer. If print cell area does not inherently correspond to the xy coordinate system matching the layout data, then the layout data is converted (e.g., by averaging thickness data for multiple coordinate points and/or using interpolation) to obtain a grayscale value for each print pixel. This conversion can be based on predetermined mapping information, for example, produced using relationships or equations. Per numeral 707, grayscale values can optionally be adjusted in order to produce a homogeneous layer (or for other desired effect). To provide one example, if it is desired to compensate for varying heights of microstructures that will sit underneath the desired layer, an optional technique adds offsets to select grayscale values to "boost" the layer of interest at specific locations to effectively planarize a top surface of the deposited layer. In one embodiment, grayscale value manipulation can also be used to correct for nozzle firing aberration (e.g., in the in-scan direction) to deposit more ink (for example, if a particular nozzle or set of nozzles produce insufficient ink volume) or less ink (e.g., the particular nozzle or set of nozzles produce excess ink volume). Such an optional process can be predicated on a calibration process and/or empirically-determined data, per function block 714. The grayscale values are then converted to a droplet density pattern (e.g., a specific halftone pattern), per numeral 709, and a bitmap is then generated, per numeral 710. Error diffusion, as indicated by the FIG., can be relied upon to help promote layer homogeneity.

FIG. 7 shows use of a collection of a number of nozzle/waveform error correction processes 713, optionally applied to help ensure uniformity and accuracy in the deposited layer and adjust for detected panel or substrate positional errors. Such uniformity can be important to device quality, whether to ensure accurate registration with any underlying product layers, development of adequate encapsulation to produce a water/oxygen barrier, or to provide high-quality light generating or light guiding elements of a display panel, or for other purpose or effect. As noted above, a calibration process or empirically determined (dead-reckoned) data can be used to correct for errors in grayscale value, or for nozzle or nozzle-waveform particulars, or for substrate or panel positional variation, per numeral 714. Alternatively, individual nozzle drive waveforms can be planned or adjusted to correct error, as represented by numeral 715. In another embodiment, as noted earlier, nozzles can be validated or qualified (719), with each nozzle either determined to meet minimum droplet generation thresholds or disqualified from use. If a specific nozzle has been disqualified but is tentatively selected for use, then in order to provide for appropriate droplet deposition, a different nozzle (or repeated pass of acceptable nozzles) can be used to deposit the droplet(s) that would otherwise have been printed by the disqualified nozzle, per numeral 716. For example, in one embodiment, a printhead has nozzles arranged both in rows and columns, such that if one nozzle is aberrant, a different, redundant nozzle can be used to deposit the droplet desired for a particular grid point. Optionally also, such issues can be taken into account and used to adjust a scan path, for example, offsetting the printhead in a manner such that the desired droplet(s) can be deposited using a different nozzle (with the printhead adjusted in position so as to permit this), or increasing or decreasing the number of scans. This is represented by the numeral 717 in FIG. 7. Many such alternatives are possible. As represented by numerals 720 and 721, in one embodiment, each nozzle is calibrated in advance using a droplet measurement device (720) that repeatedly measures droplet parameters (to develop a per-nozzle or per-drive waveform distribution of measurements), with software then building a statistical model (721) for each nozzle with an understanding of nozzle positional error and/or nozzle droplet means for volume, velocity and trajectory, and with an understanding of expected per-nozzle variance for each of these parameters. This data can be used to qualify/validate specific nozzles (and/or droplets), as mentioned, or to select nozzles that will be used to produce each individual droplet, and to otherwise adjust or customize a template print image for each new substrate or other product array. Each such measurement/error correction process can be factored into print planning (722), including print image adjustment/customization, and to any scan path planning and/or print grid computation, i.e., such that printer control data is generated and/or updated so as to optimize the print process, while ensuring desired layer properties. Finally, per numeral 725, final print data is then generated for sending to the printer at run time.

FIGS. 8A-8D are used to generally introduce techniques for per-nozzle droplet measurement and validation.

Figure 8A:
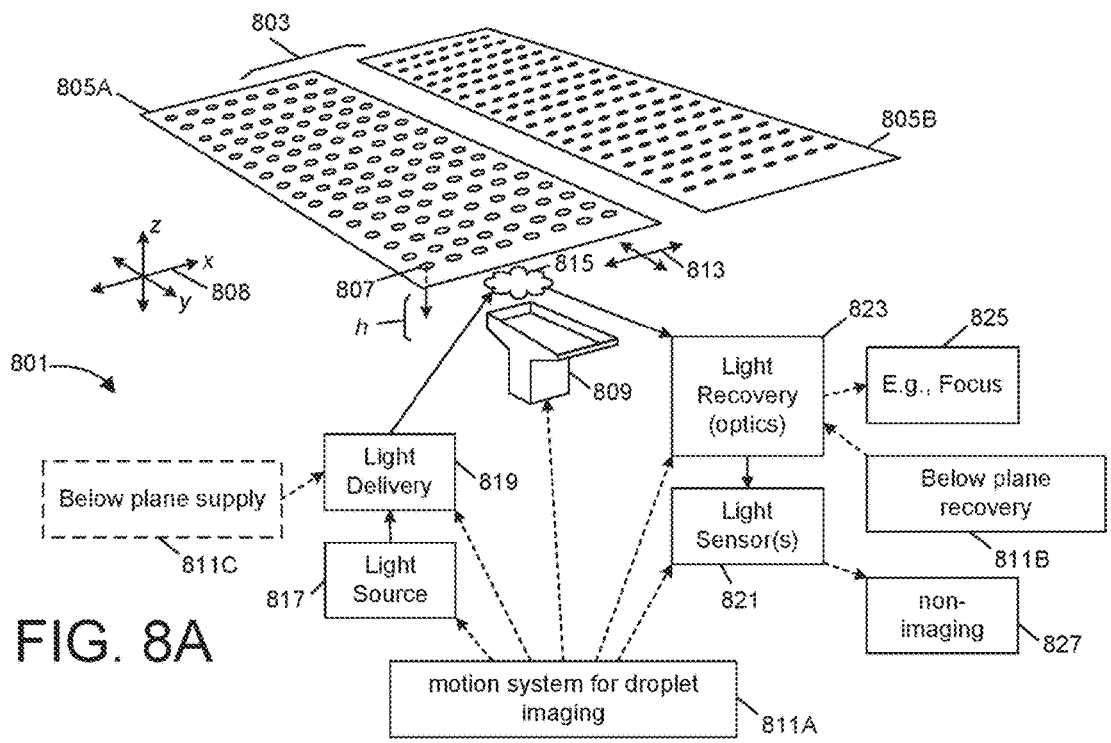
FIG. 8A is an illustrative diagram that shows a droplet measurement system capable of measuring droplet volumes for each nozzle of a large printhead assembly. For example, such a system can be used to measure the nozzle-to-nozzle variations just referenced.

More particularly, FIG. 8A provides an illustrative view depicting an optics system 801 and a relatively large printhead assembly 803 (i.e., represented by nozzle plates of respective printheads 805A/805B, each with a multitude of individual nozzles, e.g., 807); in a typical implementation, hundreds-to-thousands of nozzles are present. An ink supply (not shown) is fluidically connected with each nozzle (e.g., nozzle 807), and a piezoelectric transducer (also not shown) is used to jet droplets of ink under the control of a per-nozzle electric control signal. The nozzle design maintains slightly negative pressure of ink at each nozzle (e.g., nozzle 807) to avoid flooding of the nozzle plate, with the electric signal for a given nozzle being used to activate the corresponding piezoelectric transducer, pressurize ink for the given nozzle, and thereby expel one or more droplets from the given nozzle. In one embodiment, the control signal for each nozzle is normally at zero volts, with a positive pulse or signal level at a given voltage used for a specific nozzle to eject droplets (one per pulse) for that nozzle; in another embodiment, different, tailored pulses (or other, more complex waveforms) can be used nozzle-to-nozzle. In connection with the example provided by FIG. 8A, however, it should be assumed that it is desired to measure a droplet volume produced by a specific nozzle (e.g., nozzle 807) where a droplet is ejected downward from the printhead (i.e., in the direction "h," representing z-axis height relative to a three-dimensional coordinate system 808) to be collected by a spittoon 809. Note that in a typical application, the dimension of "h" is typically on the order of one millimeter or less and that there are thousands of nozzles (e.g., 10,000 nozzles) that are to have respective droplets individually measured in this manner within an operating printer. Thus, in order to optically measure each droplet with precision (i.e., droplets originating from a specific one of thousands of nozzles in a large printhead assembly environment, within the approximately millimeter measurement window, as just described), certain techniques are used in disclosed embodiments to precisely position elements of the optics assembly 801, the printhead assembly 803, or both relative to one another for optical measurement.

In one embodiment, these techniques utilize a combination of (a) x-y motion control (811A) of at least part of the optical system (e.g., within dimensional plane 813) to precisely position a measurement area 815 immediately adjacent to any nozzle that is to produce a droplet for optical calibration/measurement and (b) below plane optical recovery (811B) (e.g., thereby permitting easy placement of the measurement area next to any nozzle notwithstanding a large printhead surface area). Thus, in an exemplary environment having about 10,000 or more print nozzles, this motion system is capable of positioning at least part of the optical system in (e.g.) 10,000 or so discrete positions proximate to the discharge path of each respective nozzle of the printhead assembly; in one embodiment, a continuous motion system or a system having even finer positioning capabilities can be used. As will be discussed below, two contemplated optical measurement techniques include shadowgraphy and interferometry. With each, optics are typically adjusted in position so that precise focus is maintained on the measurement area so as to capture droplets in-flight (e.g., to effectively image the droplet's shadow in the case of shadowgraphy). Note that a typical droplet may be on the order of microns in diameter, so the optical placement is typically fairly precise, and presents challenges in terms of relative positioning of the printhead assembly and measurement optics/measurement area. In some embodiments, to assist with this positioning, optics (mirrors, prisms, and so forth) are used to orient a light capture path for sensing below the dimensional plane 813 originating from the measurement area 815, such that measurement optics can be placed close to the measurement area without interfering with relative positioning of the optics system and printhead. This permits effective positional control in a manner that is not restricted by the millimeter-order deposition height h within which a droplet is imaged or the large scale x and y width occupied by a printhead under scrutiny. With interferometry-based droplet measurement techniques, separate light beams incident from different angles on a small droplet creates interference patterns detectable from a perspective generally orthogonal to the light paths; thus, optics in such a system capture light from an angle of approximately ninety-degrees off of paths of the source beams, but also in a manner that utilizes below plane optical recovery so as to measure droplet parameters. Other optical measurement techniques can also be used. In yet another variant of these systems, the motion system 811A is optionally and advantageously made to be an xyz-motion system, which permits selective engagement and disengagement of the droplet measurement system without moving the printhead assembly during droplet measurement. Briefly introduced, it is contemplated in an industrial fabrication device having one or more large printhead assemblies that, to maximize manufacturing uptime, each printhead assembly will be "parked" in a service station from time to time to perform one or more maintenance functions; given the sheer size of the printhead and number of nozzles, it can be desired to perform multiple maintenance functions at once on different parts of the printhead. To this effect, in such an embodiment, it can be advantageous to move measurement/calibration devices around the printhead, rather than vice-versa. [This then permits engagement of other non-optical maintenance processes as well, e.g., relating to another nozzle if desired.] To facilitate these actions, the printhead assembly can be optionally "parked," with the system identifying a specific nozzle or range of nozzles that are to be the subject of optical calibration. Once the printhead assembly or a given printhead is stationary, the motion system 811A is engaged to move at least part of the optics system relative to the "parked" printhead assembly, to precisely position the measurement area 815 at a position suitable for detecting a droplet jetted from a specific nozzle; the use of a z-axis of movement permits selective engagement of light recovery optics from well below the plane of the printhead, facilitating other maintenance operations in lieu of or in addition to optical calibration. Perhaps otherwise stated, the use of an xyz-motion system permits selective engagement of a droplet measurement system independent of other tests or test devices used in a service station environment. Note that this structure is not required for all embodiments; other alternatives are also possible, such in which only the printhead assembly moves and the measurement assembly is stationary or in which no parking of the printhead assembly is necessary.

Generally speaking, the optics used for droplet measurement will include a light source 817, an optional set of light delivery optics 819 (which direct light from the light source 817 to the measurement area 815 as necessary), one or more light sensors 821, and a set of recovery optics 823 that direct light used to measure the droplet(s) from the measurement area 815 to the one or more light sensors 821. The motion system 811A optionally moves any one or more of these elements together with spittoon 809 in a manner that permits the direction of post-droplet measurement light from the measurement area 815 around spittoon 809 to a below-plane location, while also providing a receptacle (e.g., spittoon 809) to collect jetted ink. In one embodiment, the light delivery optics 819 and/or the light recovery optics 823 use mirrors that direct light to/from measurement area 815 along a vertical dimension parallel to droplet travel, with the motion system moving each of elements 817, 819, 821, 823 and spittoon 809 as an integral unit during droplet measurement; this setup presents an advantage that focus need not be recalibrated relative to measurement area 815. As noted by numeral 811C, the light delivery optics are also used to optionally supply source light from a location below the dimensional plane 813 of the measurement area, e.g., with both light source 817 and light sensor(s) 821 directing light on either side of spittoon 809 for purposes of measurement, as generally illustrated. As noted by numerals 825 and 827, the optics system can optionally include lenses for purposes of focus, as well as photodetectors (e.g., for non-imaging techniques that do not rely on processing of a many-pixeled "picture"). Note once again that the optional use of z-motion control over the optics assembly and spittoon permits optional engagement and disengagement of the optics system, and precise positioning of measurement area 815 proximate to any nozzle, at any point in time while the printhead assembly is "parked." Such parking of the printhead assembly 803 and xyz-motion of the optics system 801 is not required for all embodiments. For example, in one embodiment, laser interferometry is used to measure droplet characteristics, with either the printhead assembly (and/or the optics system) is moved within or parallel to the deposition plane (e.g., within or parallel to plane 813) to image droplets from various nozzles; other combinations and permutations are also possible.

Figure 8B:
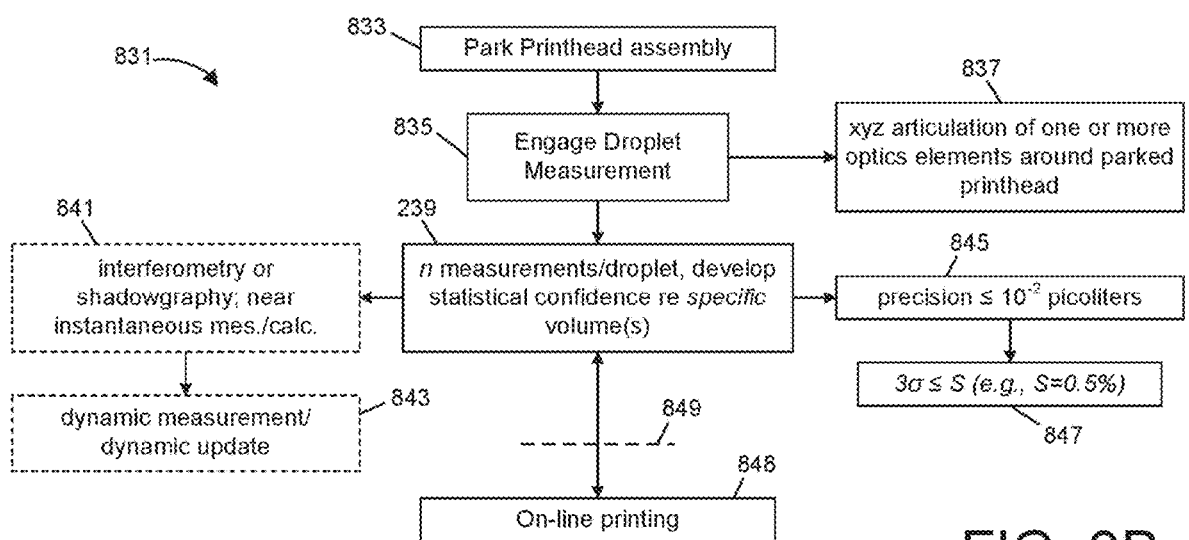
FIG. 8B is a method diagram that shows various processes and options associated with measurement of droplet particulars for each nozzle, to achieve a high-confidence understanding of expected droplet characteristics.

FIG. 8B provides flow of a process associated with droplet measurement for some embodiments. This process flow is generally designated using numeral 831 in FIG. 8B. More specifically, as indicated by reference numeral 833, in this particular process, the printhead assembly is first parked, for example, in a service station (not shown) of a printer or deposition apparatus. A droplet measurement device is then engaged (835) with the printhead assembly, for example, by selective engagement of part or all of an optics system through movement from below a deposition plane into a position where the optics system is capable of measuring individual droplets. Per numeral 837, this motion of one or more optics-system components relative to a parked printhead can optionally be performed in x, y and z dimensions.

As alluded to previously, even a single nozzle and associated nozzle firing drive waveform (i.e., pulse(s) or signal level(s) used to jet a droplet) can produce droplet volume, trajectory, and velocity that varies slightly from droplet to droplet. In accordance with teachings herein, in one embodiment, the droplet measurement system, as indicated by numeral 839, obtains n measurements per droplet of a desired parameter, to derive statistical confidence regarding the expected properties of that parameter. In one implementation, the measured parameter can be volume, whereas for other implementations, the measured parameter can be flight velocity, flight trajectory, nozzle position error (e.g., nozzle bow) or another parameter, or a combination of multiple such parameters. In one implementation, "n" can vary for each nozzle, whereas in another implementation, "n" can be a fixed number of measurements (e.g., "24") to be performed for each nozzle; in still another implementation, "n" refers to a minimum number of measurements, such that additional measurements can be performed to dynamically adjust measured statistical properties of the parameter or to refine confidence. Clearly, many variations are possible. For the example provided by FIG. 8B, it should be assumed that droplet volume is being measured, so as to obtain an accurate mean representing expected droplet volume from a given nozzle and a tight confidence interval. This mean can be assigned by a processor in view of pertinent measurement data, weighted or otherwise. This enables optional planning of droplet combinations (using multiple nozzles and/or drive waveforms) while reliably maintaining distributions of composite ink fills in a target region about an expected target (i.e., relative to a composite of droplet means). As noted by optional process boxes 841 and 843, interferometry or shadowgraphy are contemplated optical measurement processes that ideally enable instantaneous or near instantaneous measurement and calculation of volume (or other desired parameter); with such fast-measurement, it becomes possible to frequently and dynamically update volume measurements, for example, to account for changes over time in ink properties (including viscosity and constituent materials), temperature, power supply fluctuation and other factors. Building on this point, shadowgraphy typically features capture of an image of a droplet, for example, using a high resolution CMOS or CCD camera as a light sensor mechanism; while droplets can be accurately imaged in a single image capture frame at multiple positions (e.g., using a strobed light source), image acquisition typically involves a finite amount of time, such that imaging of a sufficient droplet population from a large printhead assembly (e.g., with thousands of nozzles) can take hours. Interferometry, which relies on multiple binary light detectors and detection of interference pattern spacing based on output of such detectors, is a non-imaging technique (i.e., that does not require image analysis) and so produces droplet volume measurements many orders of time faster (e.g., 50×) than shadowgraphy or other techniques; for example, with a 10,000 nozzle printhead assembly, it is expected that large measurement populations for each of the thousands of nozzles can be obtained in minutes, rendering it feasible to frequently and dynamically perform droplet measurement. As noted earlier, in one optional embodiment, droplet measurement (or measurement of other parameters, such as trajectory and/or velocity) can be performed as a periodic, intermittent process, with the droplet measurement system being engaged according to a schedule, or in between substrates (e.g., as substrates are being loaded or unloaded), or stacked against other assembly and/or other printhead maintenance processes. Note that for embodiments that permit alternate nozzle drive waveforms to be used in a manner specific to each nozzle, a rapid measurement system (e.g., interferometric system) readily permits statistical population development for each nozzle and for each alternative drive waveform for that nozzle, thereby facilitating planned droplet combinations of droplets produced by various nozzle-waveform pairings, as alluded to earlier. Per numerals 845 and 847, by measuring expected droplet volume nozzle-by-nozzle (and/or by nozzle-waveform pairing-by-pairing) to a precision of better than 0.01 pL, it becomes possible to plan for very precise droplet combinations per target deposition region, where composite fills can also be planned to 0.01 pL resolution, and where target volumes can be kept within a specified error (e.g., tolerance) range of 0.5% of target volume or better; as indicated by numeral 847, the measurement populations for each nozzle or each nozzle-waveform pairing are in one embodiment planned so as to produce reliability distribution models for each such nozzle or nozzle-waveform pairing, i.e., with $3\sigma$ confidence (or other statistical measure, such as $4\sigma$, $5\sigma$, $6\sigma$, etc.) relative to allowable droplet tolerance. Once sufficient measurements are taken for various droplets, fills involving combinations of those droplets can be evaluated and used to plan printing (848) in the most efficient manner possible. As indicated by separation line 849, droplet measurement can be performed with intermittent switching back and forth between active printing processes and measurement and calibration processes; note that to minimize manufacturing system downtime, such measurement is typically performed while the printer is tasked with other processes, e.g., during substrate loading and unloading.

Figure 8C:
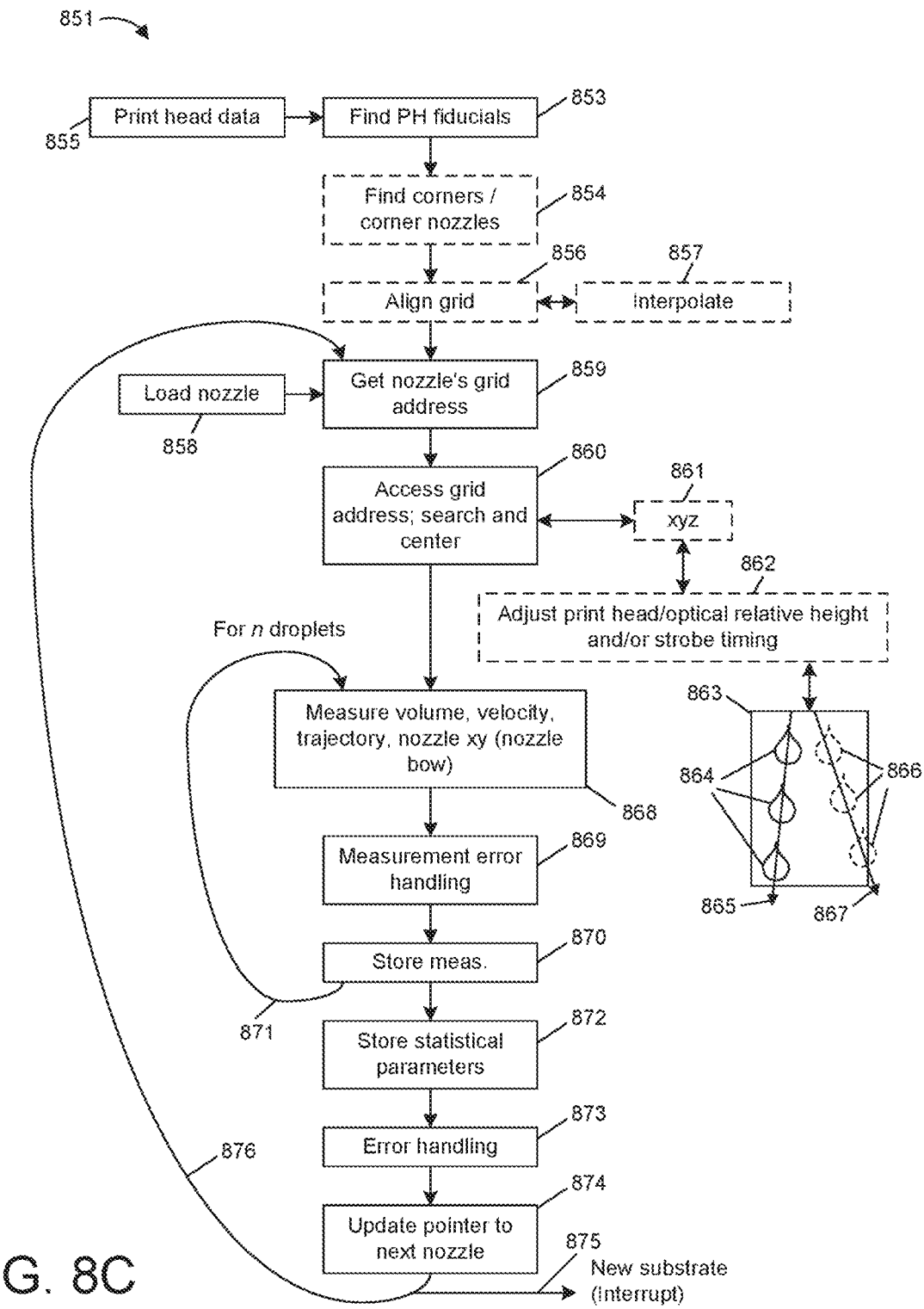
FIG. 8C shows a flow diagram associated with an embodiment of droplet measurement.

FIG. 8C illustrates another embodiment of a method of droplet measurement, generally represented by numeral 851. When a printhead is mounted or it is otherwise desired to calibrate the droplet measurement system to correct for positional offset, a calibration routine can be run in order to precisely match droplet measurements with a given printhead nozzle. In a typical embodiment, this alignment process is performed with the aid of an "upward facing camera" or other imaging device that takes an image of a printhead from beneath, that is, looking upward from the perspective of a substrate at the nozzle plate to identify one or more printhead fiducials or alignment marks (853). In one embodiment, the camera (imaging system) can be the same device as used for droplet measurement, but it can also be a separate imaging device. For an exemplary printhead having, e.g., 1024 nozzles arranged in four rows of 256 nozzles, fiducials on the nozzle plate (not to be confused with substrate fiducials) are used to determine offset and rotational skew between the nozzle plate and a grid system corresponding to the imaging device. Note that in one embodiment, the fiducials can optionally be specific nozzles (854), for example, the nozzles closest to the corners of the printhead (e.g., first and fourth rows, nozzles 1 and 256); other mechanisms can also be used. In a typical implementation, printhead configuration data (855) is loaded into the system by software and used to identify these corner nozzles and used to map address of all nozzles to the imaging system's grid 856, with interpolation relied upon to initially estimate position of each nozzle (857). To provide an example, in one embodiment, system software is designed to accommodate different printheads with different nozzle configurations, and to this effect, the system software loads the printhead configuration data to identify number of rows, presence of fiducials (if any), number of nozzles per-row, average vertical and horizontal offset between rows and columns of nozzles, and so forth. This data enables the system software to estimate the position of each nozzle on the printhead, as mentioned. In one contemplated system, this calibration process is performed once a printhead is changed, but not in between print processes; in a different embodiment, this calibration process is performed each time the droplet measurement system is initialized, e.g., with each new measurement run in between two print operations.

During production, nozzle (and nozzle-waveform) measurement can be performed on a rolling basis, precessing through a range of nozzles with each break in between substrate print operations. Whether engaged to measure all nozzles anew, or on such a rolling basis, the same basic process of FIG. 8C can be employed for measurement. To this effect, per numerals 858 and 859, when the droplet measurement device is engaged for a new measurement (either on the heels of prior measurement or a substrate print operation), the system software can identify identifies the next nozzle for which measurements are to be taken (e.g., by loading a pointer to "nozzle 2,312" for the "$312^{th}$" nozzle of a second printhead). In the case of initial measurement (e.g., responsive to installation of a new printhead, or a recent boot-up, or a periodic process such as a daily measurement process), the pointer would point to a first nozzle for a printhead, e.g., "nozzle 2, 001." This nozzle either is associated with a specific imaging grid access or one is looked-up from memory. The system uses the provided address to advance the droplet measurement system (e.g., the spittoon and measurement area referenced earlier) to a position corresponding to the expected nozzle position. Note that in a typical system, the mechanical throws associated with this movement are quite precise, i.e., to approximately micron resolution. The system optionally at this time searches for nozzle position about the expected micron-resolution position, and finds the nozzle and centers on its position (860) based on image analysis of the printhead within a small micron-distance from the estimated grid position. For example, a zig-zag, spiral or other search pattern can be used to search about the expected position for a nozzle. [Note that in one embodiment, this process can also be manually performed by adjustment of the printer by a human operator.] A typical pitch distance between nozzles might be on the order of 250 microns, whereas nozzle diameter might be on the order of 10-20 microns. Once the nozzle of interest is identified, the software fires a droplet from the nozzle in question and relies on the droplet measurement system to confirm that the nozzle in-question did indeed fire (which then confirms the nozzle's identity). FIG. 8C shows this process as being performed every time a new nozzle is identified for measurement (e.g., every time the droplet measurement system moves), but it is also possible in some embodiments to perform this measurement once (e.g., in situations where the droplet measurement system grid is very tight) during an off-line configuration, to store the grid position for each nozzle, and then to update this position only when the printhead is changed or in response to error processing. In systems where the mechanics of the droplet measurement system and/or printhead position are not very precise, it can be advantageous to use an estimate and search function for each nozzle anytime there is a change in the nozzle under scrutiny. Note that as implied by numeral 861, in one embodiment, the estimate and search function aligns the droplet measurement device (and its associated optics) in each of three dimensions (xyz) with the printhead nozzle under scrutiny.

The precise z position of each nozzle (distance relative to droplet measurement area) is then adjusted (862) in order to ensure consistent droplet measurement and/or image capture. For example, it was mentioned earlier that a droplet measurement system typically determines droplet velocity and flight trajectory by measuring each droplet multiple times, and calculating these parameters based on distance (e.g., relative to a centroid of each droplet image). Various parameters can affect proper droplet measurement, including error in strobe timing (e.g., for a shadowgraphy-based droplet measurement system), uncorrected alignment errors between the droplet imaging system and the nozzle plate, nozzle process corners and other factors. In one embodiment, a variety of statistical processes are used to compensate for such errors, for example, in a manner that normalizes strobe firing relative to droplet measurement locations across all droplets; for example, if a hypothetical printhead has 1,000 nozzles, then the system can normalize z-axis offset from the printhead plate by picking an average offset which produces a minimum of positional error while centering a desired number of droplets (on average across the 1,000 nozzles or subsets thereof) in the measurement area, in terms of average droplet image position. Analogous techniques can be applied to an interferometry-based system or to other droplet measurement systems.

FIG. 8C shows a droplet measurement area 863 and a hypothetical passage of two droplets 864 and 866 through that measurement area, along respective hypothetical trajectories 865 and 867. Several things should be noted about the example provided by this FIG. First, velocity and trajectory measurement is seen to be dependent on measuring the same droplet multiple times (three each in the case of droplets 864 and 866). This requirement can be used to properly position the measurement area relative to the strobe (or imaging source) firing, by one or more of changing the timing of the strobe (or light source), changing the drive waveform used to launch the associated droplets, changing z-axis position of the droplet measurement system, and/or changing z-axis position of the printhead. For example, if three droplet images are expected for a single droplet as the strobe is repeatedly fired (during a single exposure, in the case of a shadowgraphy-based system), but only two are observed, the measurement area is misaligned in height, and is adjusted to effectively redefine where droplet positions are captured relative to the measurement area until three exposures are obtained. Naturally, this hypothetical provides an example only and other implementations might measure more than 3 strobed droplet exposures or less than 3 exposures. Note also deviation in trajectory 865 relative to trajectory 867 might be due to statistical variation in the way the droplets are produced, and so can be optionally used to build a statistical model representing mean droplet trajectory (in terms of alpha and beta angle) and standard deviation in each of these dimensions. As should be appreciated, while droplet measurement areas 863 shows a two-dimensional droplet depiction (e.g., a yz plane as per the drawing page), trajectory angle relative to the x axis can be derived from changes in apparent droplet size in a given image frame amongst the multiple strobed exposures, indicating that droplet is getting nearer or farther away from the plane of the drawing sheet represented by FIG. 8C; analogous interference pattern changes are applied in the case of interferometry-based techniques.

The scheme represented within measurement 863 can also be used to measure nozzle row bow. That is, as an example, if it is assumed that droplets 864 and 866 originate from a common exact nozzle position, but the reverse trajectory does not align with the expected y-axis center of the droplet measurement area (i.e., from the left-to-right relative to the drawing page) that the nozzle in question could be offset in its y-axis position relative to other nozzles in the same row or column. As implied by the discussion earlier, such aberration can lead to idealized droplet firing deviations that can be taken into account in planning precise combinations of droplets, i.e., preferably, any such row "bow" or individual nozzle offset is stored and used as part of print scan planning, as discussed earlier, with the printing system using the differences of each individual nozzle in a planned manner rather than averaging out those differences. In an optional variation, the same technique can be used to determine non-regular nozzle spacing along the x-axis, although for the depicted embodiment, any such error is subsumed in correction for droplet velocity deviations (e.g., any such spacing error can be corrected for by adjustments to nozzle velocity). To determine y-axis bow of a nozzle producing droplets 864 and 866, the respective trajectories 865 and 867 are effectively reverse plotted (or otherwise mathematically applied) with other measurement trajectories for the same nozzle and used to identify a mean y-axis position of the specific nozzle under scrutiny. This position may be offset from an expected location for such a nozzle, which could be evidence of nozzle row bow.

As stated before and as implied by this discussion, one embodiment builds a statistical distribution for each nozzle for each parameter being measured, for example, for volume, velocity, trajectory, nozzle bow, and potentially other parameters (868). As part of these statistical processes, individual measurements can be thrown out or used to identify errors. To cite a few examples, if a droplet measurement is obtained having a value that is so far removed from other measurements of the same nozzle that the measurement could represent a firing error; in one implementation, the system discards this measurement if deviant to a point that exceeds a statistical error parameter. If no droplet is seen at all, this could be evidence that the droplet measurement system is at the wrong nozzle (wrong position), or has a firing waveform error or that a nozzle under scrutiny is inoperative. Measurement error handling process 869 is employed to make appropriate adjustments including taking any new or additional measurements as necessary. Per numeral 870, each measurement is advantageously stored and used to build the pertinent statistical distributions, with the system then looping to perform measurement for additional droplets from the same nozzle until sufficient robustness to measurement error is obtained. This loop (871) is seen in FIG. 8C to indicate performance until n droplets are obtained for each nozzle or each nozzle-waveform pairing. When a sufficiently robust distribution has been obtained, the system calculates (stores) and assigns the desired statistical parameter(s) (e.g., mean, standard distribution for each measure parameter) to the given nozzle (872) and executes any appropriate error handling process 873 (such as validating the nozzle just measured or deeming it or an associated waveform inoperative) and then moves on to the next firing waveform or next nozzle (874), as appropriate. That is, with a measurement distribution for a given nozzle or nozzle-waveform pairing having been completed, the system software can identify the next nozzle to be measured (874, e.g., by updated an address pointer) and then returns per numeral 876 to move the droplet measurement system and to perform the next measurement, as appropriate. Alternatively, per numeral 875, if time is up, and the system is being called upon to print another substrate as part of a manufacturing line, the system updates any scanning operations based on newly procured data (if any), stores the "next" nozzle's address, and returns to substrate printing (875). In one embodiment, after such a printing operation is complete, during a prospective break (or maintenance downtime), the system retrieves the stored nozzle address and particulars of droplet measurement and continues where it left off.

Note that, although not separately called out by FIG. 8C, the depicted measurement process would typically be performed for each alternate waveform available for use with each nozzle. For example, if each nozzle had four different piezoelectric drive waveforms that could be selected, the inner process loop 871 of FIG. 8C would generally be repeated 4*n times; if a particular implementation called for the building of a statistical distribution based on 24 droplets for each waveform, then there might be 96 such measurements for one nozzle (24 for each of four waveforms), with each measurement being used to develop statistical mean and spread measures for each of droplet velocity, trajectory and volume, and for estimated nozzle position (e.g., for purposes of assessing nozzle bow).

Figure 8D:
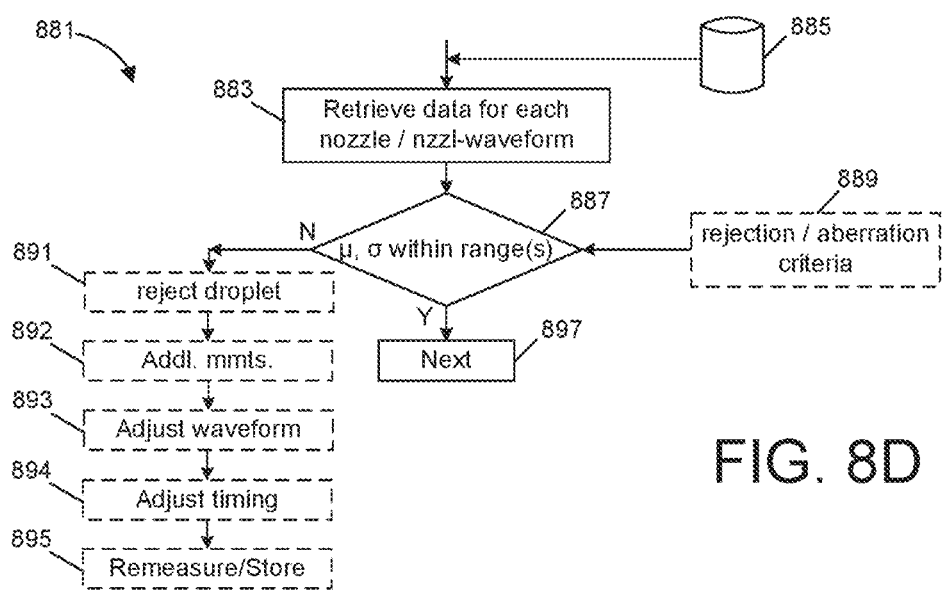
FIG. 8D shows a flow diagram associated with nozzle validation; that is, in one embodiment, measurement can be used to qualify or disqualify nozzles (in addition to the other purposes described herein).

FIG. 8D provides a flow diagram relating to nozzle qualification. In one embodiment, droplet measurement is performed to yield statistical models (e.g., distribution and mean) for each nozzle and for each waveform applied to any given nozzle, for any of and/or each of droplet volume, velocity and trajectory. Thus, for example, if there are two choices of waveforms for each of a dozen nozzles, there are up to 24 waveform-nozzle combinations or pairings; in one embodiment, measurements for each parameter (e.g. volume) are taken for each nozzle or waveform-nozzle pairing sufficient to develop a robust statistical model. Note that despite planning, it is conceptually possible that a given nozzle or nozzle-waveform pairing may yield an exceptionally wide distribution, or a mean which is sufficiently aberrant that it should be specially treated. Such special treatment applied in one embodiment is represented conceptually by FIG. 8D.

More particularly, a general method is denoted using reference numeral 881. Data generated by the droplet measurement device is stored in memory 885 for later use. During the application of method 881, this data is recalled from memory and data for each nozzle or nozzle-waveform pairing is extracted and individually processed (883). In one embodiment, a normal random distribution is built for each variable to be qualified, as described by a mean, standard deviation and number of droplets measured (n), or using equivalent measures. Note again that other distribution formats (e.g., Student's-T, Poisson, etc.), can be used. Measured parameters are compared to one or more ranges (887) to determine whether the pertinent droplet can be used in practice. In one embodiment, at least one range is applied to disqualify droplets from use (e.g., if the droplet has a sufficiently large or small volume relative to desired target, then that nozzle or nozzle-waveform pairing can be excluded from short-term use). To provide an example, if 10.00 pL droplets are desired, then a nozzle or nozzle-waveform linked to a droplet mean more than, e.g., 1.5% away from this target (e.g., <9.85 pL or >10.15 pL) can be excluded from use. Range, standard deviation, variance, or another spread measure can also or instead be used. For example, if it is desired to have droplet statistical models with a narrow distribution (e.g., $3\sigma<1.005\%$ of mean), then droplets with measurements not meeting this criteria can be excluded. It is also possible to use a sophisticated/complex set of criteria which considers multiple factors. For example, an aberrant mean combined with a very narrow spread might be okay, e.g., if spread (e.g., $3\sigma$) away from measured (e.g., aberrant) mean p is within 1.005%, then an associated droplet can be used. For example, if it is desired to use droplets with $3\sigma$ volume within 10.00 pL±0.1 pL, then a nozzle-waveform pairing producing a 9.96 pL mean with ±0.8 pL $3\sigma$ value might be excluded, but a nozzle-waveform pairing producing a 9.93 pL mean with ±0.3 pL $3\sigma$ value might be acceptable. Clearly many possibilities are possible according to any desired rejection/aberration criteria (889). Note that this same type of processing can be applied for per-droplet flight angle and velocity, i.e., it is expected that flight angle and velocity per nozzle-waveform pairing will exhibit statistical distribution and, depending on measurements and statistical models derived from the droplet measurement device, some droplets can be excluded. For example, a droplet having a mean velocity or flight trajectory that is outside of 5% of normal, or a variance in velocity outside of a specific target could hypothetically be excluded from use. Different ranges and/or evaluation criteria can be applied to each droplet parameter measured and provided by storage 885.

Note that depending on the rejection/aberration criteria 889, droplets (and nozzle-waveform combinations) can be processed and/or treated in different manners. For example, a particular droplet not meeting a desired norm can be rejected (891), as mentioned. Alternatively, it is possible to selectively perform additional measurements for the next measurement iteration of the particular nozzle-waveform pairing; as an example, if a statistical distribution is too wide, it is possible to specially perform additional measurements for the particular nozzle-waveform pairing so as to improve tightness of a statistical distribution through additional measurement (e.g., variance and standard deviation are dependent on the number of measured data points). Per numeral 893, it is also possible to adjust a nozzle drive waveform, for example, to use a higher or lower voltage level (e.g., to provide greater or lesser velocity or more consistent flight angle), or to reshape a waveform so as to produce an adjusted nozzle-waveform pairing that meets specified norms. Per numeral 894, timing of the waveform can also be adjusted (e.g., to compensate for aberrant mean velocity associated with a particular nozzle-waveform pairing). As an example (alluded to earlier), a slow droplet can be fired at an earlier time relative to other nozzles, and a fast droplet can be fired later in time to compensate for faster flight time. Many such alternatives are possible. Finally, per numeral 895, any adjusted parameters (e.g., firing time, waveform voltage level or shape) can be stored and optionally, if desired, the adjusted parameters can be applied to remeasure one or more associated droplets. After each nozzle-waveform pairing (modified or otherwise) is qualified (passed or rejected), the method then proceeds to the next nozzle-waveform pairing, per numeral 897. Once again, specific droplet particulars are advantageously taken into account in deriving print grid firing instructions to ensure homogeneity in any transformed deposition parameters (at least on a local basis). In one embodiment, nozzle particulars are weighted into the transform computation for each grid point. In another embodiment, print grid point firing decisions are made on a weighted basis dependent on transformed template print image overlap (as discussed above), with a second process used to cull, redistribute or otherwise adjust firing decisions made for grid points which correspond to an aberrant droplet or nozzle; in other words, nozzle firing decisions can be made in a first transform process, and then a second error correction process can be applied to take into account nozzle or droplet particulars. Other alternatives are also possible.

Through the use of precision mechanical systems and droplet measurement system alignment techniques, the disclosed methodology permits very high accuracy measurement of individual nozzle characteristics, including mean droplet metrics for each of the mentioned parameters (e.g., volume, velocity, trajectory, nozzle position, droplet landing position, nozzle bow and other parameters). As should be appreciated, the mentioned techniques facilitate a high degree of uniformity in manufacturing processes, especially OLED device manufacture processes, and therefore enhance reliability in the finished products. By providing for control efficiencies, particularly as to speed of droplet measurement, the stacking of such measurement against other system processes and the incorporation of alignment error correction processes, the teachings presented above help provide for a faster, less expensive manufacturing process designed to provide both flexibility and precision in the fabrication process.

Figure 9A:
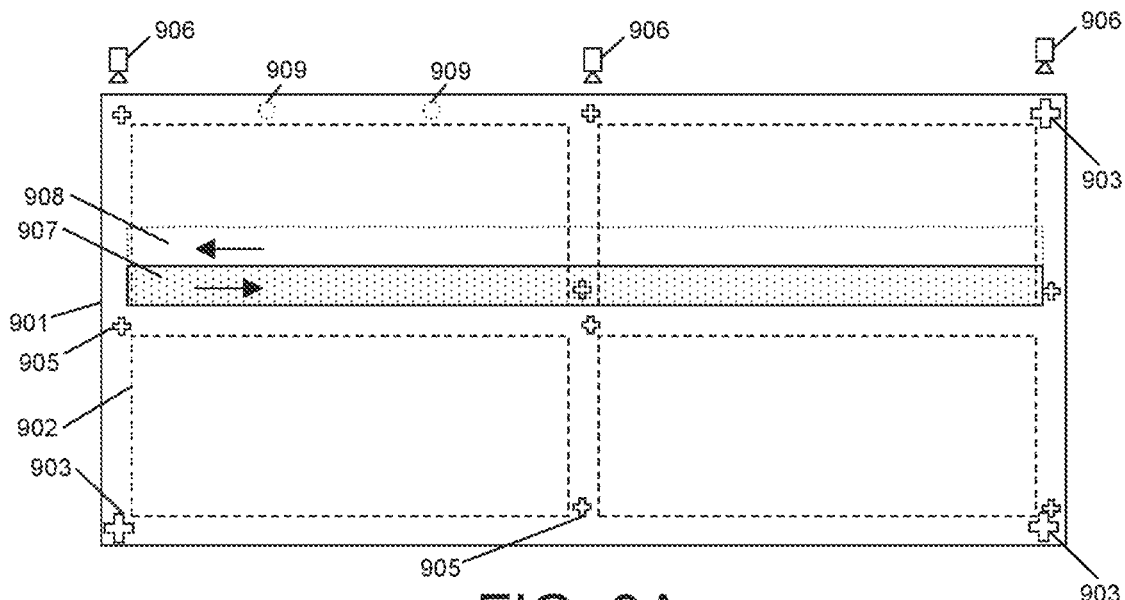
FIG. 9A provides a block diagram associated with a raster process; more specifically, FIG. 9A helps explain how the results of droplet measurement can be integrated with detected substrate errors (e.g., position, rotation, scaling or skew error) in order to provide precision printing. A shaded area (907) represents a single scan path, while a clear area (908) represents another.
Figure 9B:
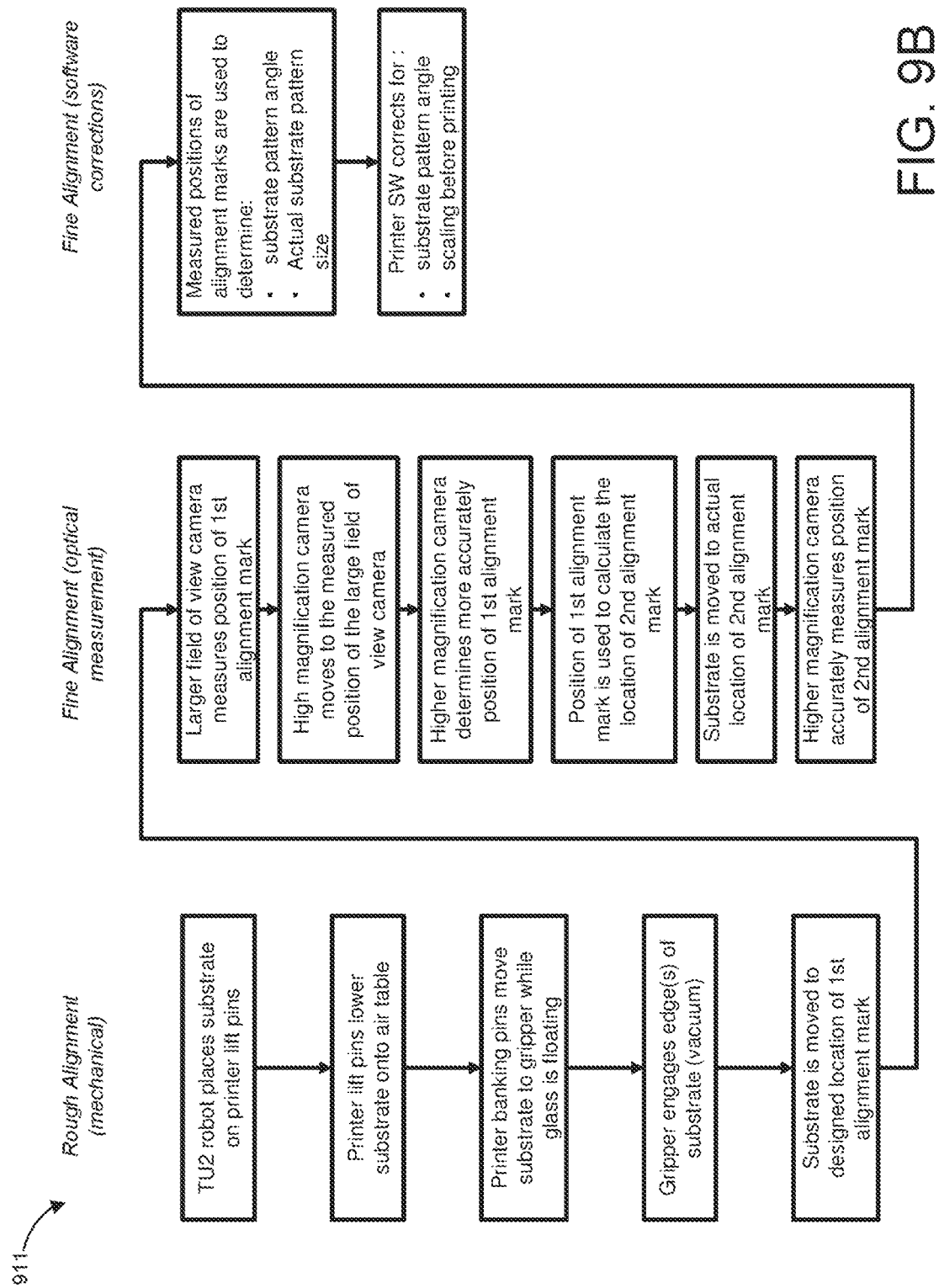
FIG. 9B shows a flow diagram associated with printing on a substrate as part of a manufacturing process.
Figure 9C:
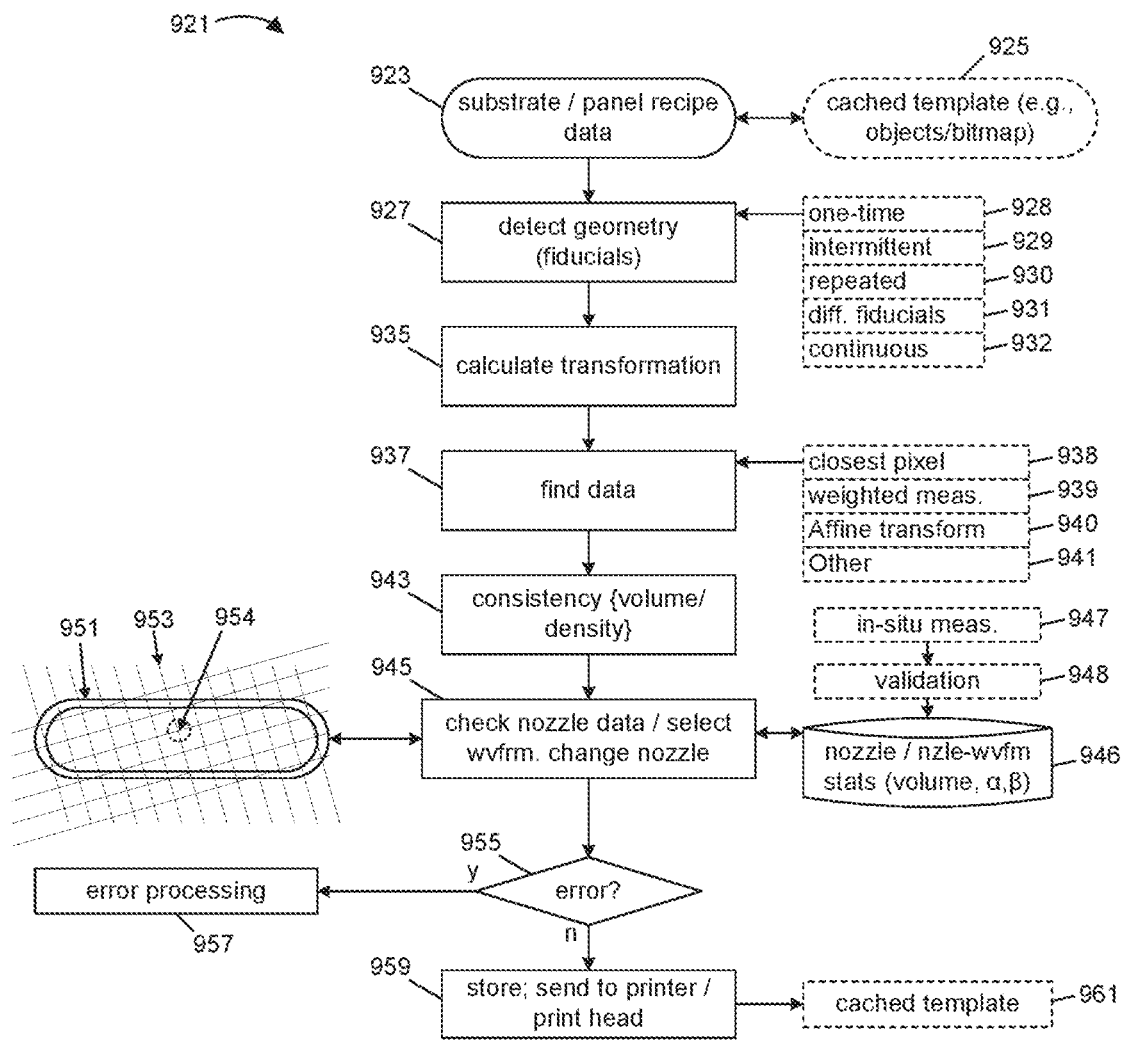
FIG. 9C shows another flow diagram associated with printing on a substrate as part of a manufacturing process.

FIGS. 9A-9C are used to illustrate an exemplary run-time printing process for a product array, once again, taking the example of one or more flat panels on a substrate.

FIG. 9A depicts a substrate 901, with a number of dashed-line boxes representing individual panel products. One such product, seen in the bottom left of the FIG., is designated using reference numeral 902. Each substrate (in a series of substrates) in one embodiment has a number of alignment marks, such as represented by numeral 903. In one embodiment, two such marks 903 are used for the substrate as a whole, enabling adjustment for substrate positional offset, rotation error, and scale error, and in another embodiment, three or more such marks 903 are used to facilitate adjustment for skew error. In yet another embodiment, each panel (such as any of the four depicted panels) is accompanied by per-panel alignment marks, such as marks 905. These alignment marks can be used to perform independent error processing per panel or per product; once again, a sufficient number or density of such marks (e.g., three or more per panel or other product) enables compensation for non-linear errors. These marks can be in addition to or in lieu of substrate fiducials 903. In yet another embodiment, alignment marks are reproduced at regular intervals without regard to panel position (e.g., such as represented by ovals 909). Whichever scheme is used, one or more cameras 906 are used to image the alignment marks in order to detect the errors just referenced. In one contemplated embodiment, a single motionless camera is used, and the transport mechanism of the printer (e.g., a handler and/or air flotation mechanism) moves the substrate to position each alignment mark in sequence in the field of view of the single camera; in a different embodiment, the camera is mounted on a motion system for transport relative to the substrate. In yet another embodiment, as discussed below, low and high magnification images are taken, the low magnification image to coarsely position a fiducial for high resolution magnification, and the high magnification image to identify precise fiducial position according to a printer coordinate system. Reflecting on the earlier discussion, in one embodiment, the transport mechanism of the printer controls motion to within about a micron of intended position; the system therefore is able to precisely track position in software and can compute errors relative to a printer-based or substrate-based coordinate system.

In a typical implementation, printing will be performed to deposit a given material layer on the entire substrate at once (i.e., with a single print process providing a layer for multiple products). To illustrate this, FIG. 9A shows two illustrative scans 907 and 908 of a printhead along the long axis of the substrate; in a split axis printer, the substrate is typically moved back and forth (e.g., in the direction of the depicted arrows) with the printer advancing the printhead positionally (i.e., in the vertical direction relative to the drawing page) in between scans. Note that while the scan paths are depicted as linear, this is not required in any embodiment. Also, while the scan paths (e.g., 907 and 908) are illustrated as adjacent and mutually-exclusive in terms of covered area, this also is not required in any embodiment (e.g., the printhead(s) can be applied on a fractional basis relative to a print swath, as necessary). Finally, also note that any given scan path typically passes over the entire printable length of the substrate to print a layer for multiple products in a single pass. Each pass uses nozzle firing decisions according to the print image (as distorted or corrected), and each firing decision applies a selected, programmed waveform to produce a desired droplet volume, trajectory and velocity. Advantageously, processors on board the printer (as introduced previously) perform both nozzle/droplet measurement and qualification and update of parameters, detection of per-substrate or per-panel particulars, correction of a template, and programming of nozzle firing data (see, e.g., "data" and "drive waveform ID" from FIG. 5B) that will be used in association with binary nozzle firing decisions (see e.g., "trigger (fire)" signal from FIG. 5B). Once printing is finished, the substrate and wet ink (i.e., deposited liquid) can then be transported for curing or processing of the deposited liquid into a permanent layer. For example, returning briefly to the discussion of FIG. 6B, a substrate can have "ink" applied in a printing module 625, and then be transported to a curing chamber 641, all without breaking the controlled atmosphere (i.e., which is advantageously used to inhibit moisture, oxygen or particulate contamination).

FIG. 9B illustrates one alignment and detection process 911 for a manufacturing operation, again using an example of flat panel device fabrication. Note that many alternative processes are possible and that FIG. 9B provides an example only. The process uses a tripartite method of operation, where the new substrate is first roughly aligned mechanically, where alignment marks are then optically measured, and finally, where software processes correct for fine (virtual) alignment. When a new substrate is loaded, a robot first places the substrate onto printer lift pins, which are used to advance the substrate to a vacuum gripper. The gripper moves the substrate while it is supported by an air floatation table and the substrate is advanced to a position where it is roughly aligned and in position for optical measurement (i.e., to locate fiducials). Note that the system is programmed for rough substrate particulars, such that a camera control system (or other imaging device) is actuated and/or activated as necessary to image an area in which fiducial presence is expected). First, a low magnification image is captured and the substrate repositioned, after which a higher magnification image is used to precisely detect fiducial position. During either stage of optical measurement, a search process (e.g., spiral) is used to find each fiducial as appropriate. The system then proceeds to measure a second (and/or greater order fiducial as appropriate), e.g., to help identify the precise position, orientation, skew and/or scale of the substrate as appropriate; as noted earlier, this process can also be applied on a per-panel basis or, indeed, for each and every fiducial so as to obtain position/distortion information at a resolution appropriate to the pertinent error correction process. Detected fiducial parameters (such as position, size, shape, rotation, skew, or associated fiducial reference points) can be compared to expected parameters for such fiducials, to detect error. As noted, any detected error can involve one or more of translational, rotational, scaling or skew error, or a superposition of multiple such errors. Based on detected error, printer control data is built that corrects for any error so that printing will be in the "right place." As noted at the right side of the figure, based on alignment mark determination, system software corrects for error by operation upon the template. As noted earlier, the template is retrieved, and the instance of this template is then manipulated (rendered) as appropriate to generate nozzle firing decisions as appropriate via the aforementioned error correction process (or another equivalent process). Printing is performed thereafter.

FIG. 9C provides an illustrative diagram used to discuss substrate error correction in software. In one embodiment, generally represented by numeral 921, data is first retrieved (923) representing the layer to be printed, e.g., according to a substrate or panel recipe, or both. As noted by numeral 925, this information is typically maintained as a template, with a copy or "instance" of the data being retrieved, adapted to error, sent to the printer, and then discarded (i.e., to avoid data contamination from earlier substrate processing during process of the next substrate). These processes are variously represented in FIG. 9C.

With a copy of the template in hand, per numeral 927, the system detects substrate geometry; as noted by numerals 928-932, the detection process can be performed one time (e.g., before printing starts, or as a new substrate is loaded), intermittently (e.g., the printing process can be interrupted or fiducial capture can occur for each of plural subdivisions of the substrate, e.g., for each panel), it can be repeated or it can be performed on a continuous basis. As specifically noted by numeral 931, in one embodiment, multiple, different fiducials are used to permit detection and correction for different types of linear and non-linear errors. Once errors have been detected, the system then calculates a transformation, per numeral 935. For example, in one embodiment, error is linear across the substrate, and so a simple linear equation is derived and used to render the cached template in order to generate printer control data. In other embodiments, error can be modeled by a quadratic or other polynomial, in a manner that is discontinuous (e.g., according to region), or in some other manner. In a parallel processing embodiment, a master or supervisory processor makes this determination and then assigns processing to discrete cores or processors. Per numeral 937, the system then proceeds to find pertinent data from the retrieved instance of the template to modify and/or use to assign nozzle firing decisions to mitigate error. Per numerals 938-941, and as discussed previously, in an embodiment where the template takes the form of a bitmap of nozzle firing data, the system can base error adaptation to a "closest" pixel in the template to an error vector position, a weighted measure of multiple pixels from the template, or in some other manner. Per numeral 940, an affine transform can be applied, with a process essentially performing matrix math on a "tile" of print grid points in order to obtain new firing decisions; for example, such a transform can weight template data by offset, rotation and other factors to obtain data for "transformed space" corresponding to true substrate position (and orientation, skew, etc.). Other processes can also be performed, per numeral 941. With nozzle assignments made, the system can then also optionally invoke post-position compensation processing in order to rectify fill or ink density errors for discrete areas of the substrate. Several options and types of processing are represented in FIG. 9C (these will also be discussed generally below in connection with FIGS. 10A-E). For example, numeral 951 illustrates a hypothetical fluidic well that will hold a light generating element of an OLED display panel, overlaid by the print grid 953, and with a particular node or droplet position indicated by numeral 954. If positional error results in too many or too few droplets within the confines of well 951, an antialiasing process can be applied to check the number of droplets that will fall within the well; for example, it could be that rotation of the print grid changes the number of droplets that will fall within the well given a droplet density represented by the template—the antialiasing process detects this issue and modifies (945) nozzle assignments from the position compensation process so that the correct number and/or volume of droplets will be deposited within the well. As indicated at the right side of the FIG., via numerals 946-948, droplet particulars and/or nozzle validation can be factored into this process as well. For example, if the droplet for node 954 has stored droplet parameters indicating positional error (e.g., the expected firing trajectory has error $\alpha$, $\beta$ which would cause the droplet to land outside the depicted fluidic well), this issue can also be corrected (945) by software, which examines particulars for other "nodes" which fall within the well to determine which ones should have firing decisions changed so as to meet required fill parameters. Similarly, if a validation process is used and a firing decision is assigned by the position compensation process to an inoperative (or disqualified) nozzle, this issue can be detected and corrected (945) by software. As noted earlier, in still another embodiment, droplet parameters can be measured in situ, and periodically updated, to provide a robust, current data set that accounts for changing conditions. Generally speaking, step 945 corrects for fill and aliasing errors, to ensure that liquid delivery will meet required particulars for deposition. If there is an error that cannot be addressed or accounted for, detected per process 955, then an exception handling routine (957) is called, typically to adjust or recompute scan paths so as to address the error in question, or to newly render data. If errors have then been fully mitigated, output data is then stored and/or sent to the printer and printhead as appropriate, per numeral 959. Note that in one embodiment, system software further detects repeated error that is correlated among substrates, and it can then optionally update the cached template (i.e., per 961) to "learn" the repeatable error and adapt the template to that error. For example, it could be that positional error is caused in a given system by an unintended protrusion in a system edge guide for the substrate, which causes a substrate to "lurch" slightly at a particular position in its motion or relative to a specific position; these and other repeatable errors can be learned by the system and used to reduce per-job error processing. This technique will be further discussed below in connection with FIG. 10E.

FIGS. 10A-10E are used to show different types of error compensation techniques that can be applied, i.e., variously in the assignment of nozzle firing decisions, in the adjustment of droplet particulars for a particular node of the print grid, and/or as a post-position compensation process.

Figure 10A:
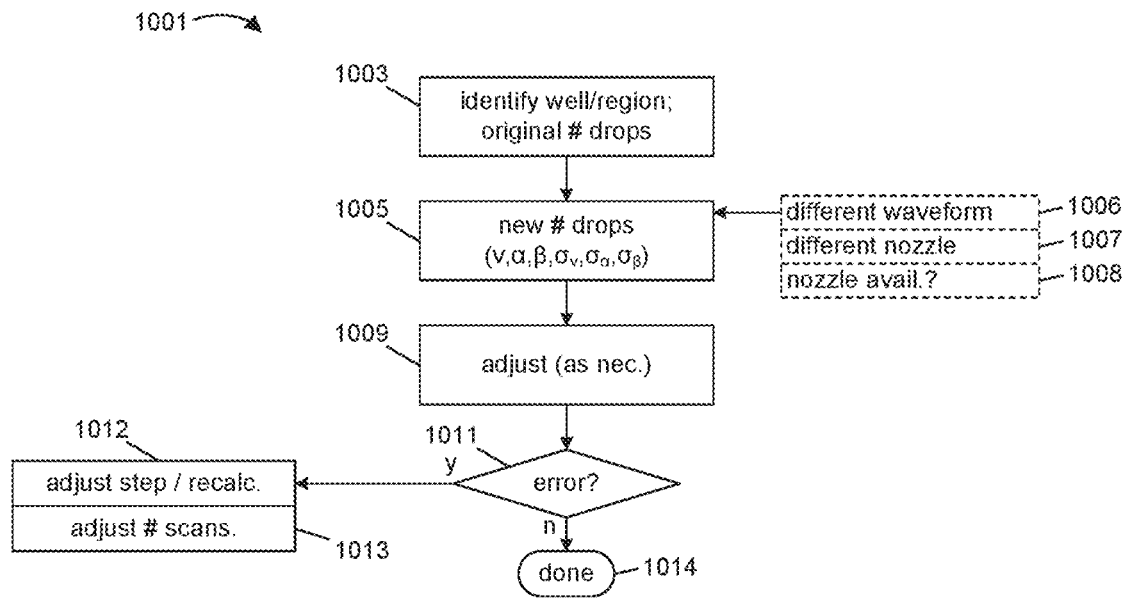
FIG. 10A shows a flowchart associated with printing on a substrate as part of a manufacturing process.

More particularly, FIG. 10A shows a flowchart 1001 relating to droplet assignment and/or droplet adjustment in a region; for example, such a technique can be applied to halftoning on a localized basis (i.e., to deposit fluid that will spread to provide blanket coverage at a calibrated thickness), or to an aggregate fill within a fluidic well (e.g., as discussed above in connection with FIG. 9C). The method first identifies the region or well in question, per numeral 1003, and the desired number of droplets or desired fill volume. Per numeral 1005, the system then retrieves statistical mean and variance of droplet parameters for each nozzle and/or nozzle drive waveform; this data provides an understanding of expected droplet parameters with a degree of confidence. Note that as represented by the parameters v, $\alpha$ and $\beta$, in one embodiment, the system retrieves from memory parameters representing expected droplet volume and expected two-dimensional droplet landing position, as well as variance of these parameters. System software then proceeds to simulate the fill to determine whether expected ink density (or aggregate volume) meets predetermined thresholds; in one embodiment, the system simply determines eligible combinations of droplets needed to meet the predetermined thresholds and it then selects one of these eligible combinations (i.e., in a manner which optimizes the ability to do this simultaneously for multiple regions in a scan-swath traversed by the printhead(s)). In another embodiment, the system simply selects a number of droplets and then post-adjusts the combination of droplets if that combination would be expected to produce a result outside of the predetermined threshold. Per numerals 1006, 1007 and 1008, the system can in one embodiment select a different drive waveform for a given nozzle (e.g., one of sixteen preprogrammed waveforms as described earlier), or it can select a different nozzle, or check to see whether a specific nozzle is available. Per numeral 1009, the system adjusts nozzle assignments (including drive waveform selection information) as necessary, and the print process is then again scrutinized for error (1011, e.g., suitability of predetermined scan paths and number of scans). If there is an error, the system can adjust the printhead offset for a given scan path (1012) and/or adjust the number of scans (1013). If there is no error, the method ends (1014) with assigned data being output to the printer as previously discussed.

Figure 10B:
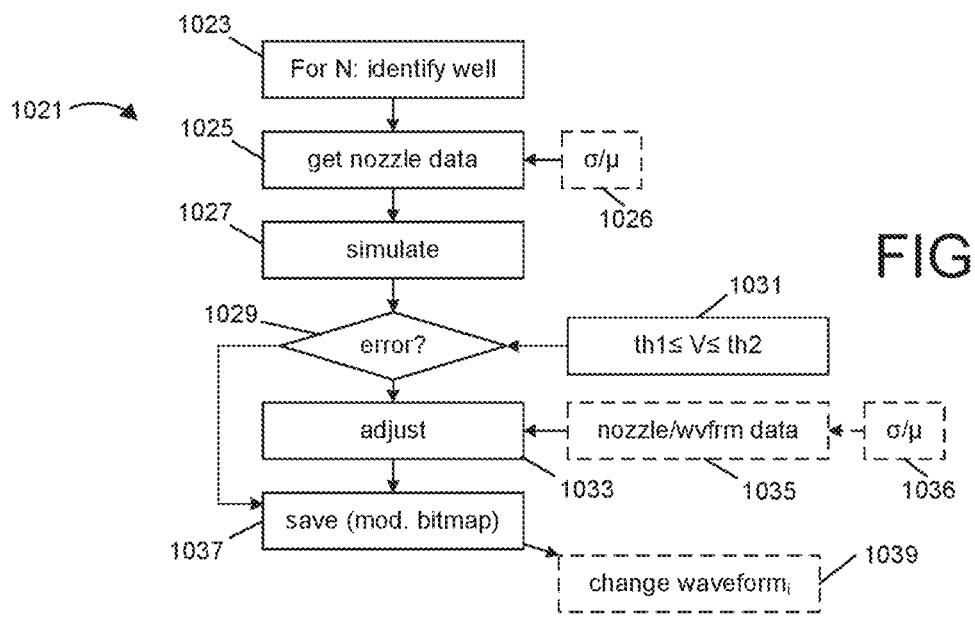
FIG. 10B provides another flowchart associated with printing on a substrate as part of a manufacturing process.

FIG. 10B provides another flowchart 1021 relating to template adjustment, this time as a post-error correction step. Per numeral 1023, for each of N regions or fluidic wells, system software proceeds to identify well position, for example, based on the detected error data. At step 1025, the software reviews the firing decisions for print grid nodes falling within the region of interest, and retrieves a mean (p) and standard deviation or other spread measure (e.g., a) for each such parameter (1026). Following a simulation (1027) of aggregate volume for the region, or volume distribution, the system then determines whether this volume or distribution conforms to predetermined thresholds, for example, a minimum threshold (Th1) and a maximum threshold (Th2), per numerals 1029 and 1031. If the volume or distribution does not conform to the predetermined thresholds, then the system software proceed to adjust droplet and/or waveform assignments, as indicated by numerals 1033, 1035 and 1036, until the volume or distribution conform to the predetermined thresholds. In one embodiment, because multiple waveforms are available for each nozzle and have been selected in advance to produce deliberate variation in droplet volume, error can be compensated for without changing scan path simply by assigning a new firing waveform to the particular print grid node; if this waveform differs from another firing decision for the same printhead nozzle, then is up to the system to schedule selection of a different "default" waveform for the particular nozzle in between nozzle firings (see, i.e., the "trigger (fire)" signal depicted in FIG. 5B). The system then saves the pertinent nozzle data as appropriate, per numeral 1037. As noted by optional process block 1039, if there is no suitable waveform which has been programmed for a particular nozzle, in one embodiment, the system can at this time add a waveform or reprogram a selected waveform in an attempt to improve the firing particulars obtainable from a given nozzle.

Figure 10C:
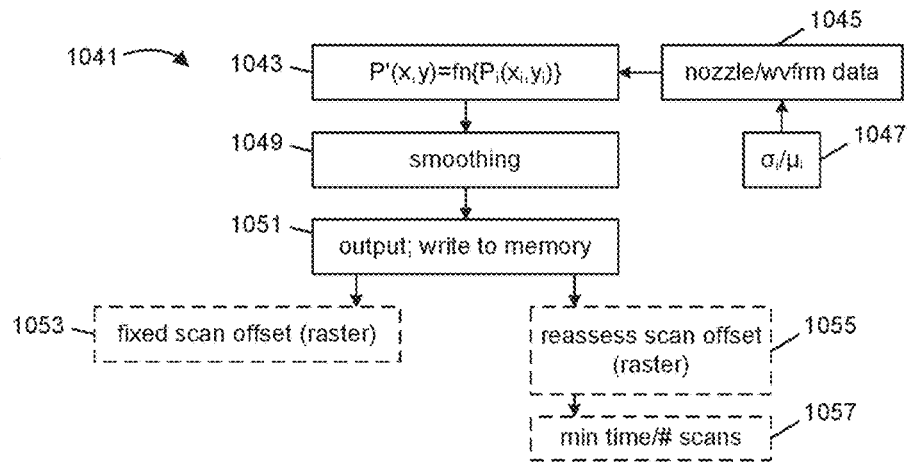
FIG. 10O provides a flowchart 1041 relating to antialiasing for geographies that are to receive printing, e.g., to test whether "adjusted" printer control data still meets one or more desired criteria (e.g., $th_1 \leq volume \leq th_2$), and to further adjust printer control data if it does not meet the one or more desired criteria.
FIG. 10D provides a flowchart 1061 relating to incorporating updated nozzle-droplet data into the rendering of printer control data to mitigate substrate-printer variation.
FIG. 10E provides yet another flowchart 1081 relating to incorporating updated nozzle-droplet data into the rendering of printer control data to mitigate substrate-printer variation.

FIG. 10C shows a flowchart 1041 of a process where nozzle/waveform data is factored into rendering of an instance of the template to account for substrate or panel error. More specifically, as indicated by numerals 1043-1047, the system can retrieve nozzle drive particulars corresponding to a bitmap (e.g., the template in bitmap form). For example, again using an example where a new print grid node firing assignment is based on a weighted average of four print pixels corresponding to a template, if the four assigned nozzles were expected to produce 10.00, 10.50, 10.00 and 10.20 pL droplets, respectively, then this information can be taken into account and used to select either a nozzle or a nozzle waveform to deposit droplets onto a misaligned substrate. Returning to the example of fluidic well 951 from FIG. 9C, any print grid nodes (e.g., 954) falling within the depicted well and assigned to fire can be potentially used to obtain an aggregate volume for the fluidic well, and the system can effectively weight the four print pixels in this hypothetical and select a new grid point (e.g., nozzle, or firing time) and associated drive waveform (if multiple waveforms are available) to produce a droplet having expected volume parameters corresponding to the weighted combination of the four print pixels. Per numeral 1049, the software can apply any smoothing as desired (e.g., adjustment of neighboring print pixels or ensuing droplet selection as necessary) and, once again, write output data (including a selected drive waveform) to memory; this output data will then be ultimately sent to the printer to control printing. Per numeral 1053, the system can assume a fixed scan pattern (i.e., and simply assign nozzles and drive waveforms in a manner to address error) or, in another embodiment, it can revisit and re-optimize scanning (rasterization), for example, by changing scan paths, printhead offsets, the number of scans, or other particulars, all with an eye toward minimizing printing time; these optional features are represented by numerals 1055 and 1057.

Figure 10D:
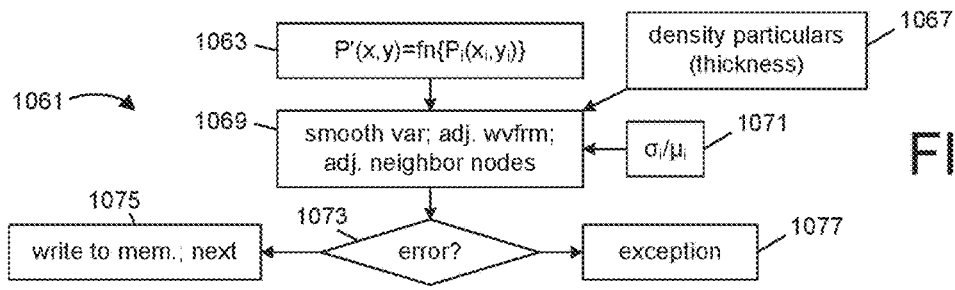

FIG. 10D shows yet another flowchart 1061, relating to halftone (i.e., drop density) adjustment. In connection with this embodiment, it should be assumed that it is desired to control the ink drop density, for example, to provide blanket coverage over a region of the substrate with deposited ink, but such that the ink droplets are deposited with a density that imparts a desired layer thickness (i.e., given limited spreading characteristics of each droplet). Such a process is especially useful to creating barrier layers, encapsulation layers or other layers where it is desired that layer thickness be consistent over a relatively large area. Per numeral 1063, once again, it is assumed that some portion of data from the template is to be rendered to compensate for substrate and/or panel positional error. Per numerals 1067, 1069 and 1071, the software in this embodiment retrieves expected droplet volume, position and variance and desired layer parameters (e.g., such as thickness and halftone density or ink density needed to produce the desired thickness). The system then selects nozzles and drive waveforms from an available pool (e.g., nozzles that will pass over the particular area assuming a particular scan path), in a manner calculated to promote the same ink density represented by the original template data. For example, if it is desired to produce a five micron thick encapsulation layer, the system (a) identifies nozzles that will pass over each area, desired ink density needed to produce the desired thickness, per-nozzle and per-waveform droplet particulars, (b) applies a mathematical function to select nozzles and drive waveforms that will produce the desired density (i.e., which is then rolled into nozzle selection for adjacent regions as well), and it then outputs printer control data. Note that in planning a halftone or density pattern, the system software typically takes care to plan depositions to deposit an even density of fluid, e.g., balancing "heavy" droplets (e.g., 11.00 pL) with "light" droplets (e.g., 9.00 pL) in terms of droplet distribution if a consistent volume (e.g., 10.00 pL) is unavailable given nozzle particulars. Once again, per numeral 1073, the output particulars are once again scrutinized for error (e.g., inability of a scan path to produce required results) and, if no error is found, data is output to the printer (1075) or conversely, if error is found, an exception process is called (1077, e.g., to reassess rasterization). Other alternatives will occur to those skilled in the art.

Figure 10E:
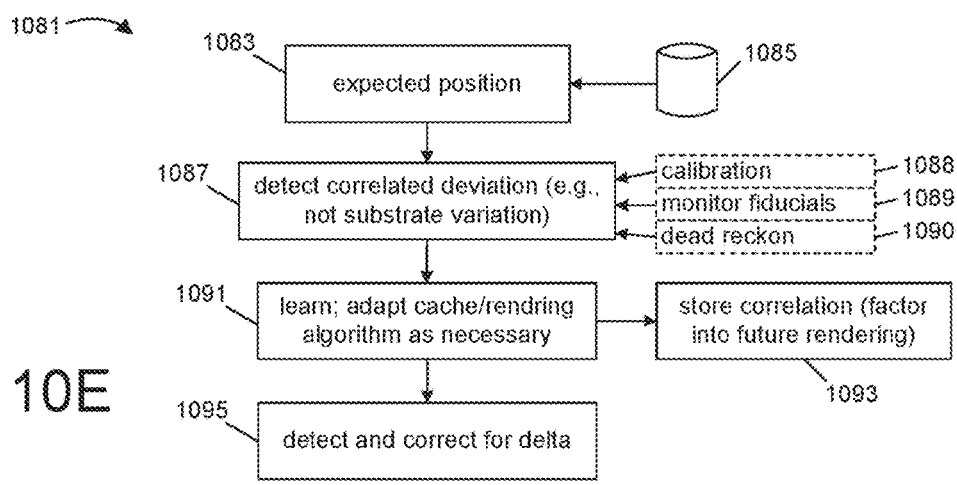

Finally, FIG. 10E provides a flowchart 1081 relating to updating the stored template for repeatable error, e.g., as introduced above in connection with FIG. 9C. For each new substrate, the depicted method compares deviation from expected position (1083) with past errors, which have been stored in memory per numeral 1085. The system software attempts to detect correlation in the error (e.g., as opposed to unique substrate error), per numeral 1087. Per numerals 1088-1090, the degree of correlation sought can be based on some sort of calibration (i.e., to set an expected substrate norm), the continual monitoring of fiducials for successive substrates, or based on dead reckoning). The system effectively "learns" patterns in the errors, for example, based on regression software, a neural net or other adaptive process, and it then modifies the template as appropriate and updates a history of deviation data, per numerals 1091 and 1093. Finally, per numeral 1095, the software corrects the current substrate for any uncorrected error (e.g., unique error) and outputs data to the printer as has previously been described.

As noted earlier, it is generally desired to perform printing quickly, so as to minimize processing time and increase throughput; in one embodiment, a substrate that is on the order of two meters wide and long can have a layer deposited uniformly over its surface in less than 90 seconds per layer; in another embodiment, this time is 45 seconds or less. It is therefore advantageous in such an application that rendering and per-substrate (or per product) error mitigation be performed as rapidly as possible.

Figure 11A:
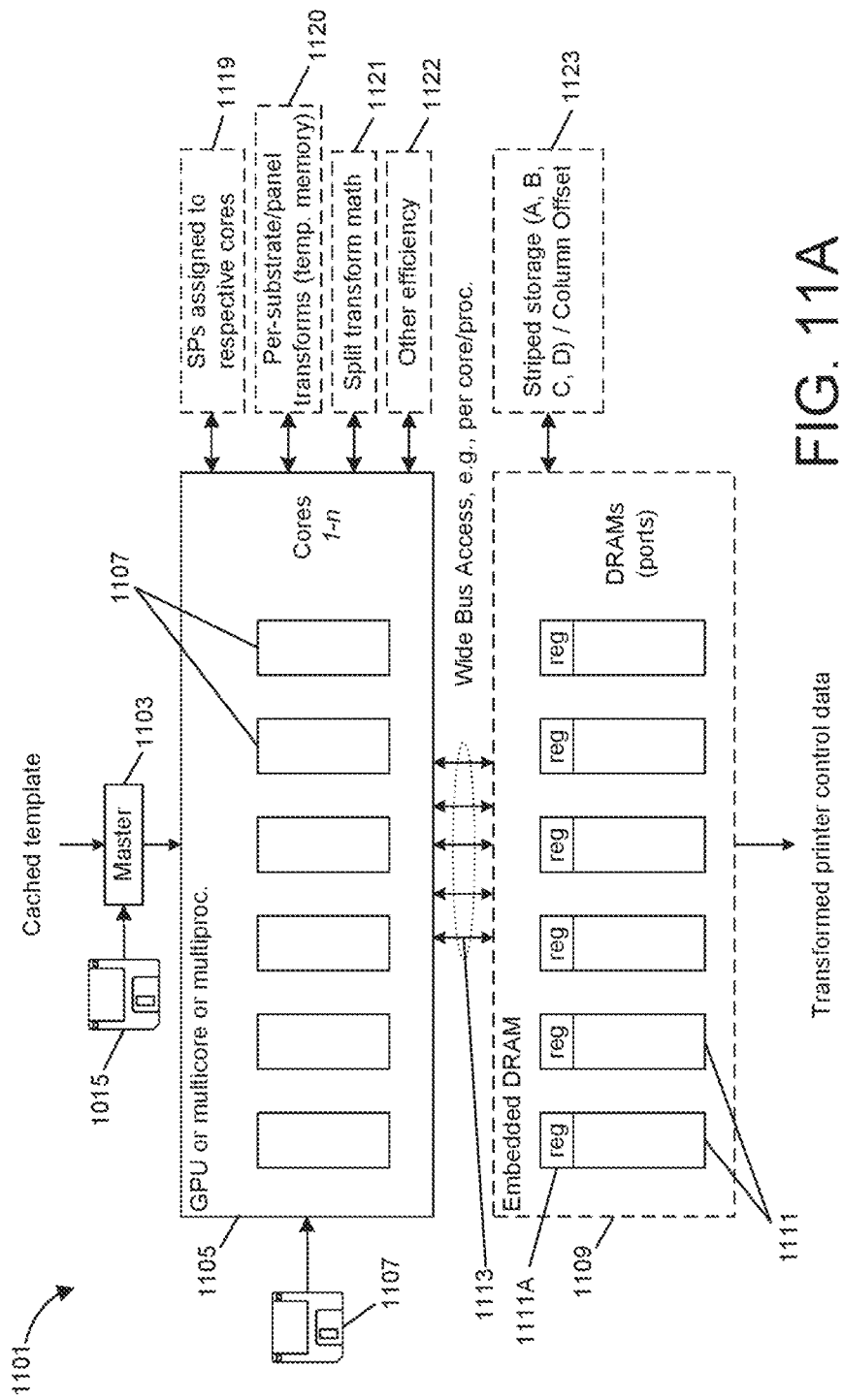
FIG. 11A is a block diagram showing a parallel processing environment.
Figure 11B:
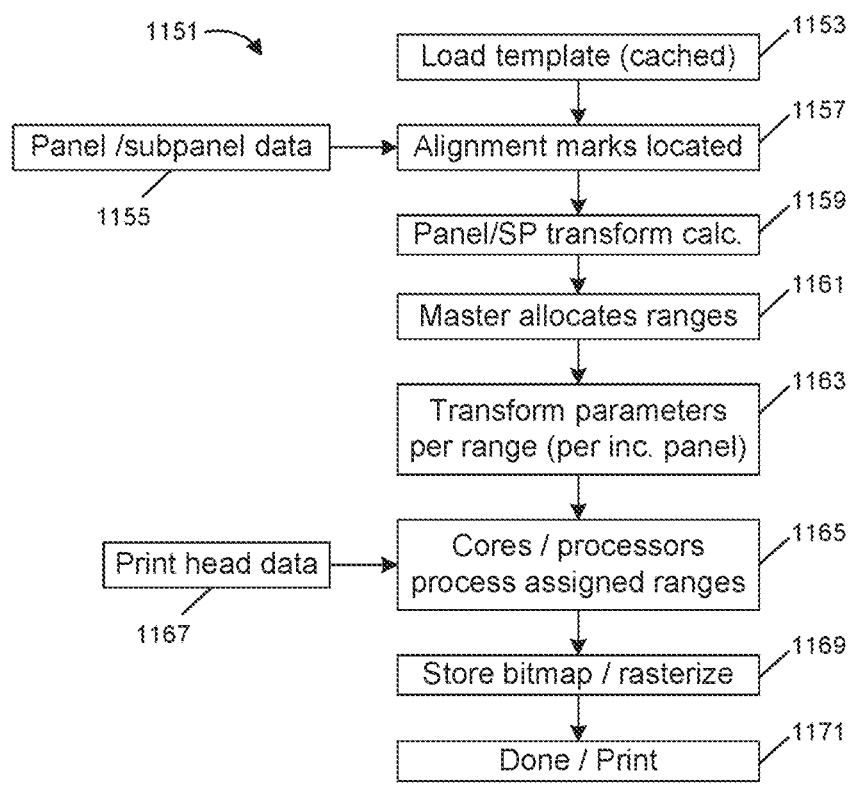
FIG. 11B is a block diagram showing how rendering and/or rasterization of a print image is performed in a parallel processing environment.

FIGS. 11A-11B are used to introduce a parallel processing architecture to facilitate this processing speed. As should be apparent, with precision manufacturing (e.g., printing a layer of many TV screens at one, each having millions of pixels), software adjustment of a detailed print grid to generate printer control data could take several seconds. The architecture and processes presented in FIGS. 11A-11B are used to reduce this time, ideally to two seconds or less.

More particularly, as represented in FIG. 11A, a copy of a cached print image, stored recipe data or other pertinent source data representing ideal printing is first retrieved. A master or supervisory processor 1103 would have already been made aware of any substrate configuration data, and so would have an understanding of the number of products (panels) and their respective expected locations. The supervisory processor 1103 receives alignment data and computes error (e.g., for each panel or product on an independent basis). Panel processing, or error compensation at a subpanel level is optional, i.e., the disclosed techniques can be applied even where an instance of the print image is conformed on a basis that is linear throughout the specific substrate. The system also includes a set of parallel processors 1105, in one embodiment, a multicore processor or a graphics processing unit (GPU). A GPU typically includes a large number of cores 1107 (e.g., hundreds to thousands), each of which is (or many of which are) utilized in this embodiment to perform processing in parallel. The supervisory processor 1103, dependent on panel definition, desired error correction and other factors, makes a decision as to how many parallel threads or processes should be used to perform transformation of the instance of the template print image. In connection with this process, the supervisory processor subdivides the overall print area for the substrate as appropriate, assigns any pertinent transformation parameters to the pertinent core or processor, and stores (caches) the instance of the template print image in an embedded DRAM 1109. Note that the embedded DRAM advantageously includes multiple banks, ports or arrays 1111, each having a register 1111A used by one or more of the cores 1107 for error correction and rendering of printer control data (including transformation and overlay of any source data). The embedded memory is advantageously structured for parallel access such that accesses by one core or processor do not limit bandwidth of another core or processor. To this effect, the architecture can feature an ultra-wide access path 1113 (e.g., featuring hundreds of data access lines, as appropriate) such that each core can access memory 1109 in parallel. Note that, in one implementation, the manner of storing the source data is dependent on processor or core assignment, such that each core or processor has access to the data it needs for transformation and to a write area for transformed printer control data. In one contemplated implementation, the supervisory processor 1103 does not necessarily use every available core or processor, but assigns cores or processors to handle discrete products (e.g., panels) or mutually exclusive parts of a panel or product. For example, if a hypothetical panel has 15 panels and the system includes 31 parallel processing units, the supervisory processor might assign 2 parallel processing units, each unit to process one half of a panel. The supervisory processor would direct portions of the template to embedded DRAM for storage as appropriate, would write any transformation parameters (e.g., skew algorithm) into the pertinent registers 1111A for each memory bank or array (i.e., for each core or parallel processor) and would then await a signal form each core or processor that its processing is complete. The output is then a transformed per-substrate set of printer control data, distorted to adapt printing to any per-substrate or per-product variations, to precisely place the to-be-deposited layer of material in question. Note that as represented by numerals 1115 and 1117, each of the supervisory processor and the respective cores or processors are governed by instructions stored on non-transitory machine-readable media that control the respective supervisory processor, core or processor to perform specific processing functions, as has been described earlier. Also, note that the embedded DRAM can be designed to provide a form of direct memory access (DMA), such that rendered data can be written to memory by one processor core (as available) and unloaded by independent means (i.e., while the one processor core proceeds to adjust other data to correct for positional error).

FIG. 11A shows a number of additional implementation options at the right side of the FIG. First, as noted earlier, each panel can be assigned to one or more respective cores or processors, as represented by numeral 1119. As in a typical manufacturing process, sequences of substrates will use the same recipe or template, the configuration represented by option 1119 is typically a fixed cost (e.g., the supervisory processor 1103 typically does not need to recompute assignments or change data storage parameters for respective substrates. Second, per numeral 1120, given this fixed assignment, the supervisory processor can optionally assign respective transformations per core; while the examples above generally separately discuss offset, rotation, scale and skew corrections, in a typical implementation, transformation can be complex, involving any combination of these corrections, as appropriate. The supervisory processor computes the pertinent transformation and then assigns the computed transformation to the proper processor or core, which then executes his transformation on all affected template data which it has been assigned. As represented by numeral 1120, in one embodiment, each transformation is provided to a respective processor(s) or core(s). Per numeral 1123, in one embodiment, storage of pre-processed template data or transformed data can be striped. That is to say, it was earlier noted that a transformation may involve weighting of firing decisions four overlapping pixels on a (translated) print image or print image data representing a panel. Per the option represented by numeral 1123, print image pixel data can be store in a manner conducive for this processing, such as by storing northwest, northeast, southwest and southeast pixel data in the same memory row, in respective memory arrays (but at the same address) or in another manner. There exist many possible memory storage techniques that can be used to speed data retrieval and processing (for example, as is conventionally done for graphics and game process to speed image rendering). The same types of memory processes can be employed for this embodiment. As also represented by numeral 1123, in one embodiment, a variable (per memory array) column offset can be used, e.g., such that, if print pixel data is stored within a given row, the system can automatically and speedily fetch the next set of data needed for processing. As an example, the cached print image data can be stored in DRAM (1111) in a striped manner (e.g., a row in each of two memory arrays) with column offsets used to retrieve the pertinent print pixel information for both memory arrows on an incrementing basis. Many alternatives and variations to this processing are also possible.

Note that the configuration just described is not the only one possible. For example, instead of assigning geographies of the substrate to each core, the supervisory processor or other master 1103 can split the transform math, assigning different processes to respective cores (1121). In one embodiment, one core could be assigned to perform one task associated with an affine transform, while a different core could be assigned to perform another. As indicated by numeral 1122, nearly any allocation of responsibilities can be affected amongst the multiple cores, whether parallel or sequential; as it is generally desired to detect per-substrate or per-panel error and proceed with printing as quickly as possible, so as to maximize manufacturing throughput, any efficiency in speeding can potentially be applied to multiple available processor or cores if it fulfils this goal.

FIG. 11B shows a flowchart 1151 associated with a run-time process. In this example, it will be assumed that multiple cores are each assigned, once error has been measured, to apply one or more affine transforms to respective geographies of the overall print area (i.e., of the substrate). As indicated by numeral 1153, template data is first loaded or cached. The supervisory processor makes use of such source data as appropriate (1155) to identify pertinent alignment marks or fiducials (1157), and it then directs the printer camera system to the appropriate rough coordinates. The printer camera system returns precise measurement information, which the supervisory processor meters against the obtained source information 1155. The supervisory processor then performs panel and/or substrate transformation calculation as appropriate (1159), in view of detected geography, and it then apportions processing ranges and transform parameters to each core, processor or parallel processing thread as appropriate (1161 and 1163). For a repeated substrate recipe, the supervisory processor could automatically parse subsets of the received template image into memory dedicated to specific cores, processors or threads. Each core, processor or thread then begins transforming (1165) its assigned data, to convert or distort the template in a manner to conform print particulars to detected substrate or panel geography. As part of this process, reasonably up-to-date print nozzle and/or droplet data is made available (1167) to ensure that finished, transformed printer control data will provide for accurate deposition, given any printhead, droplet or nozzle particulars. Note that, in other embodiments, this adjustment (i.e., dependent on print nozzle particulars) can be made by a dedicated core, processor or thread (i.e., separate from cores, processors or threads performing print grid operations) or can be performed by the supervisory processor. Once any transformation has been performed, consistent with nozzle/droplet-specific characteristics, the transformed printer control data can be unloaded form memory, rasterized (1169) and sent to the printer with appropriate instructions for printing (1171).

Reflecting on the various techniques and considerations introduced above, a manufacturing process can be performed to mass produce products quickly and at low per-unit cost. Applied to display device manufacture, e.g., flat panel displays, these techniques enable fast, per-panel printing processes, with multiple panels optionally produced from a common substrate. By providing for fast, repeatable printing techniques (e.g., using common inks and printheads from panel-to-panel), it is believed that printing can be substantially improved, for example, reducing per-layer printing time to a small fraction of the time that would be required without the techniques above, all while guaranteeing per-target region fill volumes are within specification. Again returning to the example of large HD television displays, it is believed that each color component layer can be accurately and reliably printed for large substrates (e.g., generation 8.5 substrates, which are approximately 220 cm×250 cm) in one hundred and eighty seconds or less, or even ninety seconds or less, representing substantial process improvement. Improving the efficiency and quality of printing paves the way for significant reductions in cost of producing large HD television displays, and thus lower end-consumer cost. As noted earlier, while display manufacture (and OLED manufacture in particular) is one application of the techniques introduced herein, these techniques can be applied to a wide variety of processes, computer, printers, software, manufacturing equipment and end-devices, and are not limited to display panels. In particular, it is anticipated that the disclosed techniques can be applied to any process where a printer is used to deposit a layer of multiple products as part of a common print operation, including without limitation, to any microelectronics, microoptical or "3D printing" application.

Note that the described techniques provide for a large number of options. In one embodiment, panel (or per-product) misalignment or distortion can be adjusted for on a product-by-product basis within a single array or on a single substrate. A printer scan path can be planned with ensuing adjustment/adaptation based on one or more alignment errors, such that a scan path traversing two panels has different firing instructions for each substrate, notwithstanding common print data (e.g., rotation or adjustment of data for one panel can vary from print job to print job). Optionally, this information can be adjusted from a source template (e.g., a bitmap representing binary firing decisions), in real time. In other embodiments, print area and/or scan paths can be added or completely re-planned from substrate to substrate, notwithstanding common printer source data. The described techniques can be used to fabricate OLED panels, for example, 2, 4, 6, or a different number of panels as part of a single print job. Following fabrication, these panels can be separated and applied to respective products, e.g., to fabricate respective HDTV displays or other types of devices. By performing fine alignment in software (e.g., sub-millimeter alignment), the disclosed techniques provide for more accurate product fabrication with less emphasis on precision mechanical positioning and accurate placement and alignment of deposited errors, in a manner conforming to underlying per-product or per-substrate misalignment or deformities.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Thus, for example, not all features are shown in each and every drawing and, for example, a feature or technique shown in accordance with the embodiment of one drawing should be assumed to be optionally employable as an element of, or in combination of, features of any other drawing or embodiment, even if not specifically called out in the specification. Accordingly, the specification and drawings are to be regarded in an illustrative rather than a restrictive sense.

We claim:

1. A method comprising:
   receiving a print recipe from a memory, the print recipe comprising a plurality of scan paths that define relative movement, in a scanning direction, between a printhead of a printer and an expected position of a substrate, and including, for the scan paths, respective printhead positions along a direction orthogonal to the scanning direction;
   using the printer to form a liquid film on the substrate by printing droplets of a liquid onto the substrate; and
   processing the liquid film to form a layer,
   wherein the method further comprises:
      using a camera to determine a position of at least one mark on the substrate relative to an expected position of a feature of the substrate; and
      using a processor to define a rotational or location error based on the determined position and to assign nozzles of the printhead to print on the substrate in association with one of the scan paths depending on the error,
   wherein printing the droplets of the liquid onto the substrate includes using the assigned nozzles.

2. The method of claim 1, wherein:
   the error also includes a dimension error or a skew error;
   using the processor to assign nozzles of the printhead comprises identifying nozzles of the printhead which, based on the rotational, location, dimension, or skew error, will pass over the area of the substrate during execution of each scan path; and
   printing the droplets of the liquid onto the substrate comprises using the identified nozzles for each scan path to print during execution of the respective scan path.

3. The method of claim 2, wherein using the processor to assign further comprises:
   retrieving, from non-transitory storage, an expected droplet volume or landing position of typical droplets emitted by each identified nozzle;
   determining whether or not one or more of the expected droplet volumes or landing positions would cause a volume of the liquid deposited in the area to fall outside of a predetermined volume tolerance range; and
   excluding from use any of the identified nozzles having expected droplet volumes or landing positions that would cause the volume of the liquid deposited in the area to fall outside of the predetermined volume range.

4. The method of claim 3, wherein the area is a footprint of the substrate.

5. The method of claim 3, wherein the area is within a structural well.

6. The method of claim 5, wherein the processor identifies a combination of nozzles to deposit a combination of droplets within the structural well that fall within the predetermined volume range.

7. A method comprising:
   using a camera to determine position or rotation of an area of a substrate based on one or more alignment marks;
   using a processor to determine an error of the determined position or rotation based on an expected position or rotation of the area and to assign, based on the error and on a plurality of scan paths defining relative movement of a printhead of a printer and the substrate, nozzles of the printhead to print on the substrate; and
   printing droplets of a liquid onto the substrate, using the assigned nozzles.

8. The method of claim 7, wherein the processor identifies nozzles of the printhead which, based on the error and the positions of the printhead during the scan paths, will pass over the area of the substrate during execution of each scan path.

9. The method of claim 8, wherein
   for each identified nozzle,
      the processor receives, from a non-transitory storage, an expected droplet aspect, and
      determines whether or not the expected droplet aspect would cause the volume of the liquid deposited in the area to fall outside of a predetermined volume range; and
   the processor excludes from use any of the identified nozzles having expected droplet aspects that would cause the volume of the liquid deposited in the area to fall outside of the predetermined volume range.

10. The method of claim 9, wherein using the camera to determine position or rotation of the area of the substrate comprises capturing an image of the area of the substrate that is to receive the liquid film using a plurality of cameras.

11. The method of claim 10, wherein the plurality of cameras comprises a standard camera and a high-resolution camera.

12. The method of claim 9, wherein the droplet aspect is a mean droplet volume.

13. The method of claim 8, wherein the area is a footprint of the substrate.

14. The method of claim 8, wherein the area is within a structural well.

15. The method of claim 14, wherein the processor identifies a combination of nozzles to deposit a combination of droplets within the structural well that fall within the predetermined volume range.

16. A method, comprising:
   receiving a print recipe from a memory, the print recipe comprising a plurality of scan paths defining relative movement, in a scanning direction, between a printhead of a printer and an expected position of a substrate, and including, for the scan paths, respective printhead positions along a direction orthogonal to the scanning direction;

optically determining a position of a mark of the substrate relative to an expected position of a feature of the substrate;

using a processor to determine a rotational deviation or a location deviation based on the determined position, and to assign nozzles of the printhead to print on the substrate in association with one of the scan paths depending on the error; and using the printer to form a liquid film on a substrate by printing droplets of a liquid onto target regions of the substrate using the assigned nozzles.

17. The method of claim 16, wherein the processor assigns nozzles to print droplets in an area of the substrate which, based on the error, will pass over the area of the substrate during execution of each scan path;

the processor retrieves, from non-transitory storage, an expected droplet volume or landing position of each nozzle;

the processor determines whether or not one or more of the expected droplet volumes or landing positions would cause a volume of the liquid deposited in the area to fall outside of a predetermined volume tolerance range; and the processor excludes from use, during execution of each scan path, any of the identified nozzles having corresponding expected droplet volumes or landing positions that would cause the volume of the liquid deposited in the area to fall outside of the predetermined volume range.

18. The method of claim 17, wherein the area is within a structural well.

19. The method of claim 17, wherein the processor also determines a dimension error or a skew error based on the determined position, and assigns at least one nozzle depending on the dimension or skew error.

20. The method of claim 16, wherein optically determining the position of the mark comprises using a first camera to determine a coarse position of the mark and a second camera to refine the coarse position to determine the position.

* * * * *